(12) United States Patent
Hiramatsu

(10) Patent No.: US 8,222,752 B2
(45) Date of Patent: Jul. 17, 2012

(54) ORGANOPOLYSILOXANE COMPOSITION AND SEMICONDUCTOR APPARATUS

(75) Inventor: Seiki Hiramatsu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 47 days.

(21) Appl. No.: 12/970,211

(22) Filed: Dec. 16, 2010

(65) Prior Publication Data

US 2012/0032189 A1 Feb. 9, 2012

(30) Foreign Application Priority Data

Aug. 5, 2010 (JP) ................................. 2010-176476

(51) Int. Cl.
*H01L 23/29* (2006.01)
(52) U.S. Cl. ..... 257/791; 257/76; 257/77; 257/E23.119; 257/E29.089; 257/E29.104
(58) Field of Classification Search ............. 257/76, 257/77, 791, E23.119, E29.089, E29.104
See application file for complete search history.

(56) References Cited

U.S. PATENT DOCUMENTS

| 3,175,995 A * | 3/1965 | Elliott et al. .................... 528/14 |
| 2006/0270792 A1* | 11/2006 | Kashiwagi .................... 524/862 |
| 2008/0146709 A1* | 6/2008 | Aketa et al. .................... 524/174 |

FOREIGN PATENT DOCUMENTS

JP 2006-73950 3/2006

* cited by examiner

*Primary Examiner* — Zandra Smith
*Assistant Examiner* — Marvin Payen
(74) *Attorney, Agent, or Firm* — Oblon, Spivak, McClelland, Maier & Neustadt, L.L.P.

(57) ABSTRACT

Provided is an organopolysiloxane composition that provides a cured product which has excellent heat resistance and does not peel or crack even under high temperatures. The organopolysiloxane composition comprises (A) an organopolysiloxane having difunctional siloxane units (D units) and trifunctional siloxane units (T units), and a weight-average molecular weight of 37,000 to 140,000 in which the molar ratio (T/D) of the T units to the D units is 0.3 to 0.8; and (B) an organopolysiloxane having the difunctional siloxane units (D units) and the trifunctional siloxane units (T units), and a weight-average molecular weight of 1,000 to 60,000 in which the molar ratio (T/D) of the T units to the D units is 0.15 or less, the organopolysiloxane composition being characterized by having a molar ratio (B/A) of the organopolysiloxane (B) to the organopolysiloxane (A) of 1.5 to 6.5.

6 Claims, 2 Drawing Sheets

ORGANOPOLYSILOXANE COMPOSITION AND SEMICONDUCTOR APPARATUS

BACKGROUND OF THE INVENTION

1. Field of the Invention

The present invention relates to an organopolysiloxane composition and a semiconductor apparatus, in particular, an organopolysiloxane composition that provides a cured product capable of sealing a semiconductor device without peeling or cracking even under high temperatures, and a semiconductor apparatus using the composition.

2. Description of the Related Art

Accompanying the evolution of industrial machinery, electric trains, automobiles, and the like, the temperatures at which a semiconductor device in any such machine is used have been increasing. In particular, semiconductor devices that operate even under temperatures as high as 175° C. or more have been vigorously developed in recent years. In addition to the aforementioned, the reduction of semiconductor device size and the increase in the withstand voltages and current densities of semiconductor devices have also been advanced. For example, compound semiconductors such as SiC and GaN each have a larger band gap than that of an Si semiconductor. Accordingly, an increase in withstand voltage of the device, a reduction in the size of the device, an increase in current density of the device, and an increase in temperature at which the device operates is expected of the use of any such compound as a semiconductor.

In order that semiconductor devices having such characteristics as described above may be used on a semiconductor apparatus, the insulating property of a circuit must be secured by sealing the semiconductor device with an insulating material that does not thermally decomposing even over long time period even under temperatures as high as 175° C. or more. In view of the aforementioned, a method involving sealing the semiconductor device with a cured product of an organopolysiloxane composition which has excellent heat resistance has been proposed (see, for example, Japanese Patent Application Laid-open No. 2006-73950).

However, in the method involving sealing the semiconductor device with the cured product of the organopolysiloxane composition described in Japanese Patent Application Laid-open No. 2006-73950, when the temperature of the semiconductor device increases so that the periphery of the semiconductor device may be locally heated, thermal stress occurring in the cured product increases locally in some cases. As a result, peeling or cracking of the cured product occurs and as a consequence of this the insulating property of the semiconductor apparatus is remarkably reduced.

Until now, it has been generally considered that an increase in crosslinking (that is, branched structures) of the cured product is sufficient to improve the adhesiveness of the cured product to the semiconductor device. However, as such cured product is hard and brittle, the occurrence of thermal stress leads to the peeling or cracking of the cured product. As a result, the insulating properties of the semiconductor apparatus are lost.

SUMMARY OF THE INVENTION

The present invention has been made to solve such problems as described above, and an object of the present invention is to provide an organopolysiloxane composition that provides a cured product which has excellent heat resistance and does not peel or crack even under high temperatures. Another object of the present invention is to provide a semiconductor apparatus which is highly reliable and maintains good insulating properties even under high temperatures.

The inventors of the present invention have made extensive studies to solve such problems as described above. As a result, the inventors have found that a combination of a predetermined organopolysiloxane (A) having a large number of branched structures and a predetermined organopolysiloxane (B) having a small number of branched structures at a predetermined ratio can improve the heat resistance of a cured product, and control a balance between the adhesiveness of the cured product and the stickiness of the cured product to effectively prevent the peeling and cracking of the cured product under high temperatures.

That is, the present invention is a organopolysiloxane composition comprising (A) an organopolysiloxane having difunctional siloxane units (D units) and trifunctional siloxane units (T units), with a weight-average molecular weight of 37,000 to 140,000 in which the molar ratio (T/D) of the T units to the D units is 0.3 to 0.8; and (B) an organopolysiloxane having the difunctional siloxane units (D units) and the trifunctional siloxane units (T units), with a weight-average molecular weight of 1,000 to 60,000 in which the molar ratio (T/D) of the T units to the D units is 0.15 or less, in which the organopolysiloxane composition has a molar ratio (B/A) of the organopolysiloxane (B) to the organopolysiloxane (A) of 1.5 to 6.5.

In addition, the present invention is a semiconductor apparatus comprising a semiconductor device sealed with a cured product of an organopolysiloxane composition, in which the cured product of the organopolysiloxane composition contains an organopolysiloxane copolymer which is formed of (A) an organopolysiloxane having difunctional siloxane units (D units) and trifunctional siloxane units (T units), with a weight-average molecular weight of 37,000 to 140,000 in which the molar ratio (T/D) of the T units to the D units is 0.3 to 0.8, and (B) an organopolysiloxane having the difunctional siloxane units (D units) and the trifunctional siloxane units (T units), with a weight-average molecular weight of 1,000 to 60,000 in which the molar ratio (T/D) of the T units to the D units is 0.15 or less; and has a molar ratio (B/A) of the organopolysiloxane (B) to the organopolysiloxane (A) of 1.5 to 6.5.

According to the present invention, there can be provided an organopolysiloxane composition that provides a cured product which is excellent in heat resistance, and does not peel or crack even under high temperatures. In addition, according to the present invention, there can be provided a semiconductor apparatus which is highly reliable and maintains good insulating properties even under high temperatures.

DETAILED DESCRIPTION OF THE PREFERRED EMBODIMENTS

Embodiment 1

The prevention of the peeling and cracking of a cured product of an organopolysiloxane composition under high temperatures generally requires an improvement in the adhesiveness of the cured product. However, when the crosslink density of the cured product is excessively increased in order to improve the adhesiveness of the cured product, the flexibility of the cured product reduces, and hence the peeling or cracking of the cured product occurs under high temperatures. In view of the above, in the present invention, the peeling and cracking of the cured product under high temperatures is prevented as described below. The molecular structures and molecular weights of organopolysiloxanes in the organopolysiloxane composition, and the blending ratio between the organopolysiloxanes are controlled so that the crosslink density of the cured product may be controlled in order to maintain the adhesiveness of the cured product within a proper range, and at the same time, the stickiness of the cured product may be improved in order to reduce distortion occurring in the cured product under high temperatures. That is, the organopolysiloxane composition of the present invention provides a cured product which is prevented from peeling and cracking under high temperatures by improving the adhesiveness and the stickiness of the cured product in a balanced manner.

The organopolysiloxane composition of the present invention contains a predetermined organopolysiloxane (A) and a predetermined organopolysiloxane (B).

Figure 1:
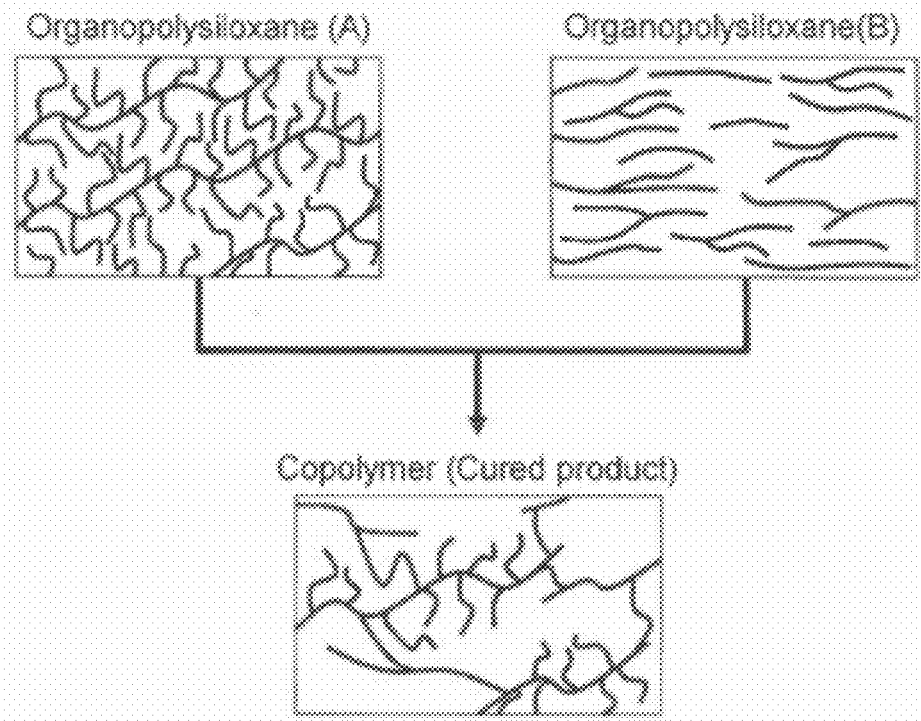
FIG. 1 is an enlarged schematic view of an organopolysiloxane (A), an organopolysiloxane (B), and a cured product of an organopolysiloxane composition containing the organopolysiloxane (A) and the organopolysiloxane (B)

The organopolysiloxane (A) is a resin having a large number of branched structures as illustrated in FIG. 1 and excellent in heat resistance. The organopolysiloxane (A) has difunctional siloxane units (D units: $R^{16}R^{17}SiO_{2/2}$) and trifunctional siloxane units (T units: $R^{18}SiO_{3/2}$). Here, $R^{16}$ to $R^{18}$ are groups identical to or different from one another, and are not particularly limited as long as the groups can each be bonded to silicon. Examples of the group that can be bonded to silicon include alkyl groups such as a methyl group, an ethyl group, a propyl group, a butyl group, a hexyl group, and a cyclohexyl group; alkenyl groups such as a vinyl group and an allyl group; a phenyl group; acetoxy groups such as a methoxy group, an ethoxy group, and a propoxy group; hydrogen; and a hydroxyl group.

The molar ratio (T/D) of the T units to the D units in the organopolysiloxane (A) is 0.3 to 0.8. When the molar ratio (T/D) is less than 0.3, desired adhesiveness cannot be obtained in the cured product of the organopolysiloxane composition. On the other hand, when the molar ratio (T/D) exceeds 0.8, desired stickiness cannot be obtained in the cured product of the organopolysiloxane composition. As a result, the insulating property of a semiconductor apparatus produced by using an organopolysiloxane composition containing an organopolysiloxane having a molar ratio deviating from the above-mentioned range reduces because the peeling or cracking of the cured product occurs under high temperatures. It should be noted that the amounts of the D units and the T units in the organopolysiloxane (A) can be calculated from the peak area of a $^{29}$Si-NMR spectrum.

The organopolysiloxane (A) has a weight-average molecular weight of 37,000 to 140,000. Here, the term "weight-average molecular weight" as used in the specification refers to a value calculated by a GPC method in terms of polystyrene (hereinafter, the term "weight-average molecular weight" as used in the specification refers to a value calculated by the same method as that described above). When the weight-average molecular weight is less than 37,000, the desired stickiness cannot be obtained in the cured product of the organopolysiloxane composition. Similarly, when the weight-average molecular weight exceeds 140,000, the desired stickiness cannot be obtained in the cured product of the organopolysiloxane composition either. As a result, the insulating property of a semiconductor apparatus produced by using an organopolysiloxane composition containing an organopolysiloxane having a weight-average molecular weight deviating from the above-mentioned range reduces because the peeling or cracking of the cured product occurs under high temperatures.

The organopolysiloxane (B) is a resin having a small number of branched structures as illustrated in FIG. 1 (that is, having high linearity) and excellent fluidity.

The organopolysiloxane (B) also has the difunctional siloxane units (D units: $R^{16}R^{17}SiO_{2/2}$) and the trifunctional siloxane units (T units: $R^{18}SiO_{3/2}$) the same as in the case of the organopolysiloxane (A). Here, $R^{16}$ to $R^{18}$ each have the same meaning as that described above.

The molar ratio (T/D) of the T units to the D units in the organopolysiloxane (B) is 0.15 or less. When the molar ratio exceeds 0.15, the desired stickiness cannot be obtained in the cured product of the organopolysiloxane composition. As a result, the insulating properties of a semiconductor apparatus produced by using an organopolysiloxane composition containing an organopolysiloxane having a molar ratio deviating from the above-mentioned range reduces because the peeling or cracking of the cured product occurs under high temperatures. It should be noted that the amounts of the D units and the T units in the organopolysiloxane (B) can be calculated from the peak area of a $^{29}$Si-NMR spectrum.

The organopolysiloxane (B) has a weight-average molecular weight of 1,000 to 60,000. When the weight-average molecular weight is less than 1,000, the desired stickiness cannot be obtained in the cured product of the organopolysiloxane composition. Similarly, when the weight-average molecular weight exceeds 60,000, the desired stickiness cannot be obtained in the cured product of the organopolysiloxane composition either. As a result, the insulating properties of a semiconductor apparatus produced by using an organopolysiloxane composition containing an organopolysiloxane having a weight-average molecular weight deviating from the above-mentioned range reduces because the peeling or cracking of the cured product occurs under high temperatures.

The method of preparing each of the organopolysiloxane (A) and the organopolysiloxane (B) is not particularly limited, and known methods can be employed. For example, the organopolysiloxane (A) and the organopolysiloxane (B) can each be prepared by the condensation polymerization of a monomer compound and an oligomer in each of which a halogen such as Cl, an alkoxy group such as $OCH_3$ or $OC_2H_5$, a hydroxyl group, or the like is bonded to an Si atom. In particular, a ratio of the T units to the D units in each of the organopolysiloxanes can be adjusted by the amount of a raw material to be used. In addition, the molecular weight of each of the organopolysiloxanes can be adjusted by a reaction condition such as a stirring time.

In addition, a commercially available organopolysiloxane can be used as each of the organopolysiloxane (A) and the organopolysiloxane (B). For example, a KE1833 manufactured by Shin-Etsu Chemical Co., Ltd. can be used as the organopolysiloxane (A), and a KE1204 manufactured by Shin-Etsu Chemical Co., Ltd. or an SE18854 manufactured by Dow Corning Toray Co., Ltd. can be used as the organopolysiloxane (B).

The molar ratio (B/A) of the organopolysiloxane (B) to the organopolysiloxane (A) in the organopolysiloxane composition is 1.5 to 6.5. When the molar ratio is less than 1.5, the desired stickiness cannot be obtained in the cured product of the organopolysiloxane composition. On the other hand, when the molar ratio exceeds 6.5, desired adhesiveness cannot be obtained in the cured product of the organopolysiloxane composition. As a result, the insulating property of a semiconductor apparatus produced by using an organopolysiloxane composition containing the organopolysiloxane (A) and the organopolysiloxane (B) having a molar ratio deviating from the above-mentioned range reduces because the peeling or cracking of the cured product occurs under high temperatures.

The organopolysiloxane composition can be prepared by mixing the organopolysiloxane (A) and the organopolysiloxane (B). A method for the mixing is not particularly limited, and the mixing can be performed in accordance with a known method. The organopolysiloxane composition thus obtained can provide a cured product that does not peel or crack under high temperatures because the composition is designed so that the adhesiveness of the cured product and the stickiness of the cured product may be improved in a balanced manner. In addition, the organopolysiloxane composition has viscosity suitable for sealing a semiconductor device because the organopolysiloxane (B) which has excellent fluidity is blended in a balanced manner. That is, the organopolysiloxane composition only traps air bubbles to a small degree and has excellent filling properties when used to seal a semiconductor device.

The organopolysiloxane composition can be blended with various additives in order to impart various characteristics as long as the effects of the present invention are not impaired. The additives are not particularly limited, and examples of the additives include a flexibilizer, a heat stabilizer, a UV absorber, a flame retardant, an antistatic agent, a defoaming agent, a thixotropy-imparting agent, a release agent, an antioxidant, a chain transfer agent, a filler, a plasticizer, a stress-reducing agent, a coupling agent, and a dye. The content of any one of these additives to the organopolysiloxane composition is not particularly limited as long as the effects of the present invention are not impaired.

The organopolysiloxane composition can be cured by a known method by which the organopolysiloxane (A) and the organopolysiloxane (B) can be copolymerized. Examples of the known method include polycondensation based on dealcoholization, oxime elimination, acetone elimination, acetic acid elimination, and the like; and addition polymerization based on a reaction between Si—H and Si—CH=$CH_2$. Alternatively, an unsaturated carbon bond may be subjected to a reaction with a radical initiator such as benzoyl peroxide or azobisisobutyronitrile.

The cured product of the organopolysiloxane composition thus obtained contains an organopolysiloxane copolymer typically represented by the following general formula (I).

In the above formula (I), $R^1$ to $R^{14}$ may be identical to or different from one another, and each independently represent hydrogen, an alkyl group, or a phenyl group; $R^{15}$ represents an alkylene group; a represents 100 to 1500; b+c represents 40 to 900; x+y represents 1 to 140; m represents 1.5 to 6.5; z represents 5 to 800; and the respective siloxane units surrounded by a, b, c, x, y, and z are arranged in a block fashion or a random fashion. It is preferred that $R^1$ to $R^{14}$, which may be identical to or different from one another, each independently represent hydrogen, an alkyl group having 1 to 6 carbon atoms, or a phenyl group; $R^{15}$ represent an alkylene group having 1 to 6 carbon atoms; a represent 115 to 1,480; b+c represent 45 to 864; z represent 10 to 700; and x+y represents 1.1 to 132. It is more preferred that $R^1$, $R^2$, $R^{12}$, and $R^{13}$ each represent a methyl group, an ethyl group, or a phenyl group; $R^3$, $R^5$ to $R^9$, $R^{11}$, and $R^{14}$ each represent hydrogen, a methyl group, or an ethyl group; $R^4$ and $R^{10}$ each represent hydrogen, a methyl group, an ethyl group, or a phenyl group; and $R^{15}$ represent an ethylene group.

In addition, in the above formula (I), an organopolysiloxane portion having the siloxane units surrounded by a, b, and c is a portion derived from the organopolysiloxane (A), and an organopolysiloxane portion having the siloxane units surrounded by x, y, and z is a portion derived from the organopolysiloxane (B). Therefore, a value for b+c/a corresponding to the molar ratio (T/D) of the T units to the D units in the organopolysiloxane (A) is 0.3 to 0.8. Similarly, a value for x+y/z corresponding to the molar ratio (T/D) of the T units to the D units in the organopolysiloxane (B) is 0.15 or less. In addition, a value for m corresponding to the molar ratio (B/A) of the organopolysiloxane (B) to the organopolysiloxane (A) is 1.5 to 6.5. The reason for setting any one of those values within a predetermined range is as described above.

The organopolysiloxane copolymer having such a structure as described above has excellent heat resistance because the copolymer has the well balanced structure of the organopolysiloxane (A) which has excellent heat resistance as illustrated in FIG. 1. In addition, the copolymer can prevent peeling and cracking under high temperatures because the adhesiveness and stickiness of the cured product are improved in a balanced manner also as described above.

The cured product of the organopolysiloxane composition has an adhesive strength of preferably 0.19 MPa or more, and more preferably 0.19 MPa to 3.6 MPa. When the adhesive strength is less than 0.20 MPa, the adhesiveness of the cured product is not sufficient, and hence the peeling or cracking of the cured product may occur under high temperatures.

In addition, the cured product of the organopolysiloxane composition has an area S of a tan δ (loss tangent) at −50° C. to 200° C. represented by the following equation of preferably 21 or more, and more preferably 21 to 92. When the area S of the tan δ (loss tangent) is less than 21, the stickiness of the cured product is not sufficient, and hence the peeling or cracking of the cured product may occur under high temperatures.

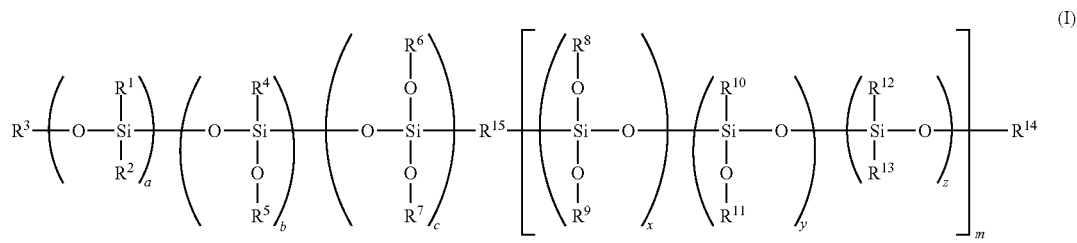

(I)

$$S = \int_{-50}^{200} \tan \delta(t)\, dt$$

Figure 2:
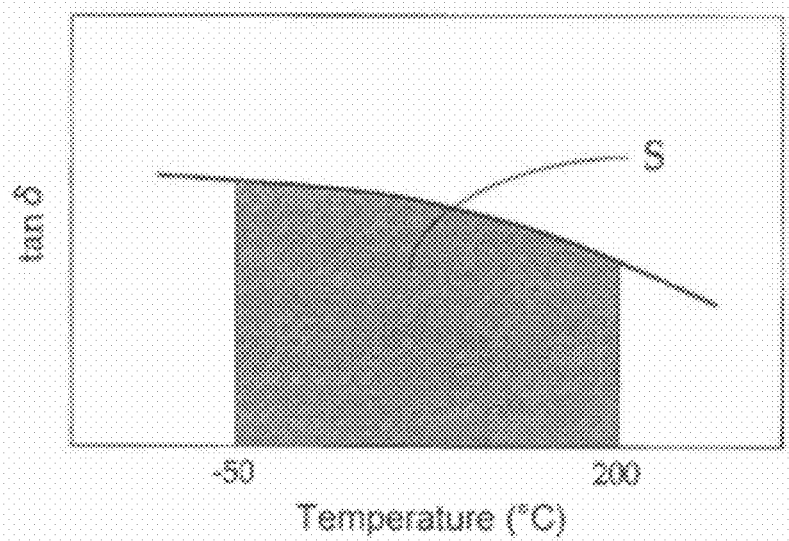
FIG. 2 is a graph illustrating the area of a tan θ at −50° C. to 200° C.

In the above equation, the tan δ represents a ratio E″/E′ of an E″ (loss modulus) to an E′ (storage modulus). Here, the loss modulus generally represents the effect by which distortion energy added to the cured product is converted into thermal energy. Accordingly, the larger the tan δ of the cured product is, the lower the stress in the cured product at the time of the occurrence of distortion can be. As a result, the peeling and cracking of the cured product are suppressed, and the insulating properties of a semiconductor apparatus can be maintained. In particular, in the semiconductor apparatus, only the periphery of a semiconductor device is heated, and hence distortion in this portion increases. However, peeling and cracking due to the distortion of the cured product can be effectively suppressed by adjusting the stickiness of the cured product so that the tan δ may fall within a proper range. It should be noted that, in the present invention, area S of the tan δ at −50° C. to 200° C. as illustrated in FIG. 2 was calculated in order that the tan δ might be dealt with quantitatively. The temperature range is a general temperature range used in the reliability test of the semiconductor apparatus (such as a heat cycle test or a power cycle test).

Embodiment 2

A semiconductor apparatus of the present invention is obtained by sealing a semiconductor device with the cured product of the organopolysiloxane composition described above.

Hereinafter, an example of the semiconductor apparatus of the present invention is described with reference to a figure.

Figure 3:
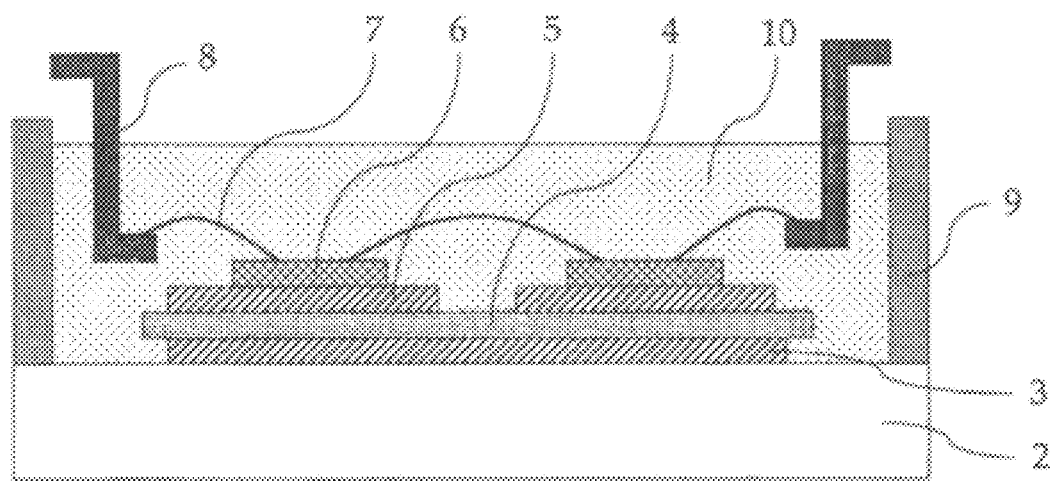
FIG. 3 is a schematic sectional view of a semiconductor apparatus of the present invention.

FIG. 3 is a schematic sectional view of the semiconductor apparatus. In FIG. 3, a semiconductor apparatus 1 comprises a base plate 2; an electrode 3 placed on the base plate 2; a ceramic plate 4 placed on the electrode 3; an electrode 5 placed on the ceramic plate 4; a semiconductor device 6 placed on the electrode 5; an external electrode 8 connected to the semiconductor device 6 with a wiring member 7; a case 9 provided on the base plate 2; and an organopolysiloxane composition-cured product 10 that seals the inside of the semiconductor apparatus 1 such as the semiconductor device 6. It should be noted that the number of the semiconductor devices 6 is not particularly limited and has only to be appropriately fixed depending on the application, though the number of the semiconductor devices 6 in FIG. 3 is set to two for the simplification of the figure. In addition, the material used in the semiconductor apparatus 1 except the organopolysiloxane composition-cured product 10 is not particularly limited, and any material known in the technical field can be used. For example, an integrated circuit, a large-scale integrated circuit, a transistor, a thyristor, a diode, or a solid state imaging device can be used as the semiconductor device 6. Also, copper, aluminum, gold, or the like can be used as the wiring member 7.

In addition, the semiconductor device 6 may be formed of, as well as silicon, a wide-band gap semiconductor having a larger band gap than that of silicon. Examples of the wide-bang gap semiconductor include silicon carbide, a gallium nitride-based material, and diamond.

The reduced size of the semiconductor device 6 formed of the wide-band gap semiconductor can be achieved because the semiconductor device 6 has a high withstand voltage and a high allowable current density. In addition, the use of a reduced size semiconductor device 6 allows a reduction in the size of the semiconductor apparatus 1 which the semiconductor device 6 is incorporated into as well.

In addition, as the semiconductor device 6 formed with the wide-band gap semiconductor has high heat resistance, this leads to a reduction in the size of the heat-dissipating member (not illustrated) or the like as well. As a result, the semiconductor apparatus 1 can be further reduced in size.

Further, the efficiency of the semiconductor device 6 formed of the wide-band gap semiconductor can be improved because the device shows low power loss.

The semiconductor apparatus 1 of the present invention having such constitution can maintain good insulating properties even under high temperatures because the inside of the semiconductor apparatus 1 such as the semiconductor device 6 is sealed with a cured product which has excellent heat resistance, and therefore does not peel or crack even under high temperatures. Accordingly, the apparatus has improved reliability.

EXAMPLES

Hereinafter, the present invention is described in detail by way of examples. However, the present invention is not limited by these examples.

Example 1

Synthesis of Organopolysiloxane

Organopolysiloxanes having various molar ratios (T/D) of the T units to the D units and various weight-average molecular weights (Mw's) were each synthesized in accordance with a known method.

Hereinafter, synthesis methods for some organopolysiloxanes are given.

First, 300 ml of N,N-dimethylformamide (DMF), 0.1 mol of water, and 0.01 mol of hydrochloric acid were loaded into a 500-ml three-necked flask equipped with a reflux tube, a dropping funnel, and a thermometer, and then the resultant solution was cooled to −5° C. Next, 0.075 mol of phenyltrimethoxysilane (LS-2750, Shin-Etsu Chemical Co., Ltd.), 0.005 mol of vinyltrimethoxysilane (LS-815, Shin-Etsu Chemical Co., Ltd.), and 0.2 mol of dimethoxydimethylsilane (LS-520, Shin-Etsu Chemical Co., Ltd.) were dropped to the cooled solution under a nitrogen atmosphere over 15 minutes while the solution was stirred. After the completion of the dropping, the mixture was stirred at room temperature for 3 hours. Next, the mixture was stirred at 100° C. for 6 hours, and was then stirred at 160° C. for an additional six hours. DMF was removed from the reaction product thus obtained under reduced pressure. Thus, a colorless, transparent, viscous solid was obtained. The analysis of the solid by $^{29}$Si-NMR confirmed that the solid was an organopolysiloxane having a ratio T/D of 0.4. In addition, the Mw of the solid measured by gel permeation chromatography (GPC) was found to be 100,019.

Synthesis was performed in the same manner as the above except that 0.155 mol of phenylmethoxysilane and 0.005 mol of vinyltrimethoxysilane were used. As a result, a colorless, transparent, viscous solid was obtained. The analysis of the solid by $^{29}$Si-NMR confirmed that the solid was an organopolysiloxane having a ratio T/D of 0.8. In addition, the Mw of the solid measured by GPC was found to be 100,041.

In addition, synthesis was performed in the same manner as the above except that the time period for the stirring at 160° C. was changed to 3 hours. As a result, a colorless, transparent, viscous solid was obtained. The analysis of the solid by $^{29}$Si-NMR confirmed that the solid was an organopolysiloxane having a ratio T/D of 0.4. In addition, the Mw of the solid measured by GPC was found to be 38,020.

Further, synthesis was performed in the same manner as the above except that 0.155 mol of phenylmethoxysilane and 0.005 mol of vinyltrimethoxysilane were used; and the time period for the stirring at 160° C. was changed to 10 hours. As a result, a colorless, transparent, viscous solid was obtained. The analysis of the solid by $^{29}$Si-NMR confirmed that the solid was an organopolysiloxane having a ratio T/D of 0.8. In addition, the Mw of the solid measured by GPC was found to be 141,068.

As can be seen from the above-mentioned several synthesis results, the ratio T/D can be controlled by a blending ratio among phenyltrimethoxysilane, vinyltrimethoxysilane, and dimethoxydimethylsilane, and the Mw can be controlled by adjusting a stirring time (reaction time).

Organopolysiloxanes having various ratios T/D and various Mw's were each synthesized in the same manner as the above except that conditions, i.e., the blending ratio among phenyltrimethoxysilane, vinyltrimethoxysilane, and dimethoxydimethylsilane, and the stirring time were changed.

(Preparation of Organopolysiloxane Composition)

Various organopolysiloxane compositions were prepared by selecting two organopolysiloxanes from the organopolysiloxanes synthesized in the above and mixing the two organopolysiloxanes at various ratios.

Here, each of the compositions was blended with azobisisobutyronitrile as a radical initiator so that the composition could be cured (copolymerized). The content of azobisisobutyronitrile in the composition was set to 0.1 mol %. Alternatively, part of Si—OH groups in the organopolysiloxanes synthesized in the above were reduced to Si—H groups by a heat treatment with a hydrogen gas, and a platinum-cyclovinylmethylsiloxane complex was blended as a catalyst. The content at which the platinum-cyclovinylmethylsiloxane complex was blended into the composition was set to 3 mol %.

(Production of Semiconductor Apparatus)

A semiconductor apparatus having the constitution illustrated in FIG. 3 (provided that the organopolysiloxane composition-cured product 10 was excluded) was assembled. After that, an organopolysiloxane composition was injected from above into the case 9, and was then defoamed at 10 torr (about 1333 Pa) for 15 minutes. It should be noted that the organopolysiloxane composition was sufficiently stirred and defoamed at 10 torr (about 1333 Pa) for 15 minutes before being injected into the semiconductor apparatus. Next, the injected organopolysiloxane composition was heated at 120° C. for 1 hour, and was then heated at 150° C. for 3 hours. Further, the organopolysiloxane composition was heated at 200° C. for 1 hour so as to be copolymerized. Thus, the semiconductor apparatus was sealed with a cured product of the organopolysiloxane composition.

(Dielectric Breakdown Test)

The semiconductor apparatus obtained in the above was subjected to a heat cycle test at −50° C. to 200° C. 100 times, and was then subjected to a dielectric breakdown test. In the dielectric breakdown test, a voltage applied to the cured product of the organopolysiloxane composition was increased every 30 seconds in an increment of 0.5 kV, and the maximum voltage at which the apparatus was able to be prevented from short-circuiting for 30 seconds was determined as a dielectric breakdown voltage. Tables 1 to 8 below show the results.

Table 1 shows the results of the measurement of the dielectric breakdown voltages of semiconductor apparatuses produced by using the organopolysiloxanes (A) each having a ratio T/D of 0.2. To be specific, Table 1 shows the results of the dielectric breakdown voltages of semiconductor apparatuses produced by using organopolysiloxane compositions containing the organopolysiloxanes (A) each having a ratio T/D of 0.2 and having various Mw's and the organopolysiloxanes (B) each having a ratio T/D of 0.15 and having various Mw's at various blending ratios.

Here, the cured products of the organopolysiloxane compositions in the semiconductor apparatuses produced in the tests of Table 1 were each organopolysiloxane copolymers having a structure represented by the above formula (I). In the formula (I), $R^1$, $R^2$, $R^{12}$, and $R^{13}$ each represented a methyl group, $R^3$, $R^5$ to $R^9$, $R^{11}$, and $R^{14}$ each represented hydrogen, $R^4$ and $R^{10}$ each represented a phenyl group, and $R^{15}$ represented an ethylene group. In addition, when the organopolysiloxane (A) having an Mw of 36,003 was used, a represented 360, b represented 62, and c represented 10. When the organopolysiloxane (A) having an Mw of 37,019 was used, a represented 370, b represented 64, and c represented 10. When the organopolysiloxane (A) having Mw of 100,007 was used, a represented 1,000, b represented 173, and c represented 27. When the organopolysiloxane (A) having an Mw of 139,927 was used, a represented 1,400, b represented 241, and c represented 39. When the organopolysiloxane (A) having an Mw of 141,047 was used, a represented 1,450, b represented 185, and c represented 105. In addition, when the organopolysiloxane (B) having an Mw of 900 was used, x represented 0.8, y represented 0.7, and z represented 10. When the organopolysiloxane (B) having an Mw of 1,025 was used, x represented 0.9, y represented 0.8, and z represented 11.4. When the organopolysiloxane (B) having an Mw of 3029 was used, x represented 3.2, y represented 1.9, and z represented 34. When the organopolysiloxane (B) having an Mw of 30,065 was used, x represented 4, y represented 44, and z represented 320. When the organopolysiloxane (B) having an Mw of 59,949 was used, x represented 11, y represented 85, and z represented 640. When the organopolysiloxane (B) having an Mw of 61,016 was used, x represented 9, y represented 88.5, and z represented 650. In addition, m represents a molar ratio (B/A) of the organopolysiloxane (B) to the organopolysiloxane (A).

It should be noted that the results of the dielectric breakdown voltages of semiconductor apparatuses produced by using organopolysiloxane compositions in each of which the ratio T/D of the organopolysiloxane (B) was changed to 0.1 or 0.2 are omitted because the results were the same as that in the case where the ratio T/D of the organopolysiloxane (B) was 0.15.

TABLE 1

<Organopolysiloxane (A): T/D = 0.2, Organopolysiloxane (B): T/D = 0.15>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,003 | | | | | | |
| 900 | 0.20 | 0.20 | 0.20 | 0.20 | 0.20 | 0.20 |
| 1,025 | 0.20 | 0.20 | 0.20 | 0.20 | 0.20 | 0.20 |
| 3,029 | 0.20 | 0.20 | 0.20 | 0.20 | 0.20 | 0.20 |
| 30,065 | 0.20 | 0.20 | 0.20 | 0.20 | 0.20 | 0.20 |
| 59,949 | 0.20 | 0.20 | 0.20 | 0.20 | 0.20 | 0.20 |
| 61,016 | 0.20 | 0.20 | 0.20 | 0.20 | 0.20 | 0.20 |
| 2) When the Mw of the organopolysiloxane (A) is 37,019 | | | | | | |
| 900 | 0.20 | 0.20 | 0.20 | 0.20 | 0.20 | 0.20 |
| 1,025 | 0.20 | 0.20 | 0.20 | 0.20 | 0.20 | 0.20 |
| 3,029 | 0.20 | 0.20 | 0.20 | 0.20 | 0.20 | 0.20 |
| 30,065 | 0.20 | 0.20 | 0.20 | 0.20 | 0.20 | 0.20 |
| 59,949 | 0.20 | 0.20 | 0.20 | 0.20 | 0.20 | 0.20 |
| 61,016 | 0.20 | 0.20 | 0.20 | 0.20 | 0.20 | 0.20 |

TABLE 1-continued

<Organopolysiloxane (A): T/D = 0.2, Organopolysiloxane (B): T/D = 0.15>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 3) When the Mw of the organopolysiloxane (A) is 100,007 | | | | | | |
| 900 | 0.20 | 0.20 | 0.20 | 0.20 | 0.20 | 0.20 |
| 1,025 | 0.20 | 0.20 | 0.20 | 0.20 | 0.20 | 0.20 |
| 3,029 | 0.20 | 0.20 | 0.20 | 0.20 | 0.20 | 0.20 |
| 30,065 | 0.20 | 0.20 | 0.20 | 0.20 | 0.20 | 0.20 |
| 59,949 | 0.20 | 0.20 | 0.20 | 0.20 | 0.20 | 0.20 |
| 61,016 | 0.20 | 0.20 | 0.20 | 0.20 | 0.20 | 0.20 |
| 4) When the Mw of the organopolysiloxane (A) is 139,927 | | | | | | |
| 900 | 0.20 | 0.20 | 0.20 | 0.20 | 0.20 | 0.20 |
| 1,025 | 0.20 | 0.20 | 0.20 | 0.20 | 0.20 | 0.20 |
| 3,029 | 0.20 | 0.20 | 0.20 | 0.20 | 0.20 | 0.20 |
| 30,065 | 0.20 | 0.20 | 0.20 | 0.20 | 0.20 | 0.20 |
| 59,949 | 0.20 | 0.20 | 0.20 | 0.20 | 0.20 | 0.20 |
| 61,016 | 0.20 | 0.20 | 0.20 | 0.20 | 0.20 | 0.20 |
| 5) When the Mw of the organopolysiloxane (A) is 141,047 | | | | | | |
| 900 | 0.20 | 0.20 | 0.20 | 0.20 | 0.20 | 0.20 |
| 1,025 | 0.20 | 0.20 | 0.20 | 0.20 | 0.20 | 0.20 |
| 3,029 | 0.20 | 0.20 | 0.20 | 0.20 | 0.20 | 0.20 |
| 30,065 | 0.20 | 0.20 | 0.20 | 0.20 | 0.20 | 0.20 |
| 59,949 | 0.20 | 0.20 | 0.20 | 0.20 | 0.20 | 0.20 |
| 61,016 | 0.20 | 0.20 | 0.20 | 0.20 | 0.20 | 0.20 |

*) Dielectric breakdown voltages are represented in kV units.

Tables 2 and 3 show the results of the measurement of the dielectric breakdown voltages of semiconductor apparatuses produced by using the organopolysiloxanes (A) each having a ratio T/D of 0.3. To be specific, Table 2 shows the results of the dielectric breakdown voltages of semiconductor apparatuses produced by using organopolysiloxane compositions containing the organopolysiloxanes (A) each having a ratio T/D of 0.3 and having various Mw's and the organopolysiloxanes (B) each having a ratio T/D of 0.15 and having various Mw's at various blending ratios. In addition, Table 3 shows the results of the dielectric breakdown voltages of semiconductor apparatuses produced by using organopolysiloxane compositions in each of which the ratio T/D of the organopolysiloxane (B) was changed to 0.2.

Here, the cured products of the organopolysiloxane compositions in the semiconductor apparatuses produced in the tests of Tables 2 and 3 were each organopolysiloxane copolymers having a structure represented by the above formula (I). In the formula (I), $R^1$, $R^2$, $R^{12}$, and $R^{13}$ each represented a methyl group, $R^3$, $R^5$ to $R^9$, $R^{11}$, and $R^{14}$ each represented hydrogen, $R^4$ and $R^{10}$ each represented a phenyl group, and $R^{15}$ represented an ethylene group. In addition, when the organopolysiloxane (A) having an Mw of 36,055 was used, a represented 320, b represented 81, and c represented 15. When the organopolysiloxane (A) having an Mw of 37,029 was used, a represented 330, b represented 81, and c represented 18. When the organopolysiloxane (A) having an Mw of 100,019 was used, a represented 880, b represented 238, and c represented 26. When the organopolysiloxane (A) having an Mw of 139,975 was used, a represented 1,220, b represented 352, and c represented 14. When the organopolysiloxane (A) having an Mw of 141,069 was used, a represented 1,230, b represented 354, and c represented 15. In addition, when the organopolysiloxane (B) having an Mw of 900 was used, x represented 0.8, y represented 0.7, and z represented 10. When the organopolysiloxane (B) having an Mw of 1,025 was used, x represented 0.9, y represented 0.8, and z represented 11.4. When the organopolysiloxane (B) having an Mw of 3,029 was used, x represented 3.2, y represented 1.9, and z represented 34. When the organopolysiloxane (B) having an Mw of 30,065 was used, x represented 4, y represented 44, and z represented 320. When the organopolysiloxane (B) having an Mw of 59,949 was used, x represented 11, y represented 85, and z represented 640. When the organopolysiloxane (B) having an Mw of 61,016 was used, x represented 9, y represented 88.5, and z represented 650. In addition, when the organopolysiloxane (B) having an Mw of 921 was used, x represented 1.6, y represented 0.4, and z represented 10. When the organopolysiloxane (B) having an Mw of 1,023 was used, x represented 1.6, y represented 0.6, and z represented 11. When the organopolysiloxane (B) having an Mw of 3,024 was used, x represented 3.8, y represented 2.6, and z represented 32. When the organopolysiloxane (B) having an Mw of 30,053 was used, x represented 41, y represented 23, and z represented 320. When the organopolysiloxane (B) having an Mw of 59,921 was used, x represented 102, y represented 28, and z represented 650. When the organopolysiloxane (B) having an Mw of 61,057 was used, x represented 100, y represented 32, and z represented 660. In addition, m represents a molar ratio (B/A) of the organopolysiloxane (B) to the organopolysiloxane (A).

It should be noted that the results of the dielectric breakdown voltages of semiconductor apparatuses produced by using organopolysiloxane compositions in each of which the ratio T/D of the organopolysiloxane (B) was changed to 0.1 are omitted because the results were the same as that in the case where the ratio T/D of the organopolysiloxane (B) was 0.15.

TABLE 2

Organopolysiloxane (A): T/D = 0.3, Organopolysiloxane (B): T/D = 0.15

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,055 | | | | | | |
| 900 | 0.20 | 0.20 | 0.20 | 0.20 | 0.20 | 0.20 |
| 1,025 | 0.20 | 0.20 | 0.20 | 0.20 | 0.20 | 0.20 |
| 3,029 | 0.20 | 0.20 | 0.20 | 0.20 | 0.20 | 0.20 |
| 30,065 | 0.20 | 0.20 | 0.20 | 0.20 | 0.20 | 0.20 |
| 59,949 | 0.20 | 0.20 | 0.20 | 0.20 | 0.20 | 0.20 |
| 61,016 | 0.20 | 0.20 | 0.20 | 0.20 | 0.20 | 0.20 |
| 2) When the Mw of the organopolysiloxane (A) is 37,029 | | | | | | |
| 900 | 0.20 | 0.20 | 0.20 | 0.20 | 0.20 | 0.20 |
| 1,025 | 0.20 | 0.70 | 0.70 | 0.70 | 0.70 | 0.20 |
| 3,029 | 0.20 | 0.70 | 0.70 | 0.70 | 0.70 | 0.20 |
| 30,065 | 0.20 | 0.70 | 0.70 | 0.70 | 0.70 | 0.20 |
| 59,949 | 0.20 | 0.70 | 0.70 | 0.70 | 0.70 | 0.20 |
| 61,016 | 0.20 | 0.20 | 0.20 | 0.20 | 0.20 | 0.20 |
| 3) When the Mw of the organopolysiloxane (A) is 100,019 | | | | | | |
| 900 | 0.20 | 0.20 | 0.20 | 0.20 | 0.20 | 0.20 |
| 1,025 | 0.20 | 0.70 | 0.70 | 0.70 | 0.70 | 0.20 |
| 3,029 | 0.20 | 0.70 | 0.70 | 0.70 | 0.70 | 0.20 |
| 30,065 | 0.20 | 0.70 | 0.70 | 0.70 | 0.70 | 0.20 |
| 59,949 | 0.20 | 0.70 | 0.70 | 0.70 | 0.70 | 0.20 |
| 61,016 | 0.20 | 0.20 | 0.20 | 0.20 | 0.20 | 0.20 |
| 4) When the Mw of the organopolysiloxane (A) is 139,975 | | | | | | |
| 900 | 0.20 | 0.20 | 0.20 | 0.20 | 0.20 | 0.20 |
| 1,025 | 0.20 | 0.70 | 0.70 | 0.70 | 0.70 | 0.20 |
| 3,029 | 0.20 | 0.70 | 0.70 | 0.70 | 0.70 | 0.20 |
| 30,065 | 0.20 | 0.70 | 0.70 | 0.70 | 0.70 | 0.20 |
| 59,949 | 0.20 | 0.70 | 0.70 | 0.70 | 0.70 | 0.20 |
| 61,016 | 0.20 | 0.20 | 0.20 | 0.20 | 0.20 | 0.20 |

TABLE 2-continued

Organopolysiloxane (A): T/D = 0.3, Organopolysiloxane (B): T/D = 0.15

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 5) When the Mw of the organopolysiloxane (A) is 141,069 | | | | | | |
| 900 | 0.20 | 0.20 | 0.20 | 0.20 | 0.20 | 0.20 |
| 1,025 | 0.20 | 0.20 | 0.20 | 0.20 | 0.20 | 0.20 |
| 3,029 | 0.20 | 0.20 | 0.20 | 0.20 | 0.20 | 0.20 |
| 30,065 | 0.20 | 0.20 | 0.20 | 0.20 | 0.20 | 0.20 |
| 59,949 | 0.20 | 0.20 | 0.20 | 0.20 | 0.20 | 0.20 |
| 61,016 | 0.20 | 0.20 | 0.20 | 0.20 | 0.20 | 0.20 |

*) Dielectric breakdown voltages are represented in kV units.

TABLE 3

<Organopolysiloxane (A): T/D = 0.3, Organopolysiloxane (B): T/D = 0.2>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,055 | | | | | | |
| 921 | 0.20 | 0.20 | 0.20 | 0.20 | 0.20 | 0.20 |
| 1,023 | 0.20 | 0.20 | 0.20 | 0.20 | 0.20 | 0.20 |
| 3,024 | 0.20 | 0.20 | 0.20 | 0.20 | 0.20 | 0.20 |
| 30,053 | 0.20 | 0.20 | 0.20 | 0.20 | 0.20 | 0.20 |
| 59,921 | 0.20 | 0.20 | 0.20 | 0.20 | 0.20 | 0.20 |
| 61,057 | 0.20 | 0.20 | 0.20 | 0.20 | 0.20 | 0.20 |
| 2) When the Mw of the organopolysiloxane (A) is 37,029 | | | | | | |
| 921 | 0.20 | 0.20 | 0.20 | 0.20 | 0.20 | 0.20 |
| 1,023 | 0.20 | 0.20 | 0.20 | 0.20 | 0.20 | 0.20 |
| 3,024 | 0.20 | 0.20 | 0.20 | 0.20 | 0.20 | 0.20 |
| 30,053 | 0.20 | 0.20 | 0.20 | 0.20 | 0.20 | 0.20 |
| 59,921 | 0.20 | 0.20 | 0.20 | 0.20 | 0.20 | 0.20 |
| 61,057 | 0.20 | 0.20 | 0.20 | 0.20 | 0.20 | 0.20 |
| 3) When the Mw of the organopolysiloxane (A) is 100,019 | | | | | | |
| 921 | 0.20 | 0.20 | 0.20 | 0.20 | 0.20 | 0.20 |
| 1,023 | 0.20 | 0.20 | 0.20 | 0.20 | 0.20 | 0.20 |
| 3,024 | 0.20 | 0.20 | 0.20 | 0.20 | 0.20 | 0.20 |
| 30,053 | 0.20 | 0.20 | 0.20 | 0.20 | 0.20 | 0.20 |
| 59,921 | 0.20 | 0.20 | 0.20 | 0.20 | 0.20 | 0.20 |
| 61,057 | 0.20 | 0.20 | 0.20 | 0.20 | 0.20 | 0.20 |
| 4) When the Mw of the organopolysiloxane (A) is 139,975 | | | | | | |
| 921 | 0.20 | 0.20 | 0.20 | 0.20 | 0.20 | 0.20 |
| 1,023 | 0.20 | 0.20 | 0.20 | 0.20 | 0.20 | 0.20 |
| 3,024 | 0.20 | 0.20 | 0.20 | 0.20 | 0.20 | 0.20 |
| 30,053 | 0.20 | 0.20 | 0.20 | 0.20 | 0.20 | 0.20 |
| 59,921 | 0.20 | 0.20 | 0.20 | 0.20 | 0.20 | 0.20 |
| 61,057 | 0.20 | 0.20 | 0.20 | 0.20 | 0.20 | 0.20 |
| 5) When the Mw of the organopolysiloxane (A) is 141,069 | | | | | | |
| 921 | 0.20 | 0.20 | 0.20 | 0.20 | 0.20 | 0.20 |
| 1,023 | 0.20 | 0.20 | 0.20 | 0.20 | 0.20 | 0.20 |
| 3,024 | 0.20 | 0.20 | 0.20 | 0.20 | 0.20 | 0.20 |
| 30,053 | 0.20 | 0.20 | 0.20 | 0.20 | 0.20 | 0.20 |
| 59,921 | 0.20 | 0.20 | 0.20 | 0.20 | 0.20 | 0.20 |
| 61,057 | 0.20 | 0.20 | 0.20 | 0.20 | 0.20 | 0.20 |

*) Dielectric breakdown voltages are represented in kV units.

Tables 4 and 5 show the results of the measurement of the dielectric breakdown voltages of semiconductor apparatuses produced by using the organopolysiloxanes (A) each having a ratio T/D of 0.4. To be specific, Table 4 shows the results of the dielectric breakdown voltages of semiconductor apparatuses produced by using organopolysiloxane compositions containing the organopolysiloxanes (A) each having a ratio T/D of 0.4 and having various Mw's and the organopolysiloxanes (B) each having a ratio T/D of 0.15 and having various Mw's. In addition, Table 5 shows the results of the dielectric breakdown voltages of semiconductor apparatuses produced by using organopolysiloxane compositions in each of which the ratio T/D of the organopolysiloxane (B) was changed to 0.2.

Here, the cured products of the organopolysiloxane compositions in the semiconductor apparatuses produced in the tests of Tables 4 and 5 were each organopolysiloxane copolymers having a structure represented by the above formula (I). In the formula (I), $R^1$, $R^2$, $R^{12}$, and $R^{13}$ each represented a methyl group, $R^3$, $R^5$ to $R^9$, $R^{11}$, and $R^{14}$ each represented hydrogen, $R^4$ and $R^{10}$ each represented a phenyl group, and $R^{15}$ represented an ethylene group. In addition, when the organopolysiloxane (A) having an Mw of 36,055 was used, a represented 290, b represented 92, and c represented 24. When the organopolysiloxane (A) having an Mw of 37,001 was used, a represented 295, b represented 99, and c represented 19. When the organopolysiloxane (A) having an Mw of 100,023 was used, a represented 780, b represented 299, and c represented 13. When the organopolysiloxane (A) having an Mw of 139,987 was used, a represented 1,100, b represented 404, and c represented 36. When the organopolysiloxane (A) having an Mw of 141,067 was used, a represented 1,100, b represented 422, and c represented 18. In addition, when the organopolysiloxane (B) having an Mw of 900 was used, x represented 0.8, y represented 0.7, and z represented 10. When the organopolysiloxane (B) having an Mw of 1,025 was used, x represented 0.9, y represented 0.8, and z represented 11.4. When the organopolysiloxane (B) having an Mw of 3,029 was used, x represented 3.2, y represented 1.9, and z represented 34. When the organopolysiloxane (B) having an Mw of 30,065 was used, x represented 4, y represented 44, and z represented 320. When the organopolysiloxane (B) having an Mw of 59,949 was used, x represented 11, y represented 85, and z represented 640. When the organopolysiloxane (B) having an Mw of 61,016 was used, x represented 9, y represented 88.5, and z represented 650. In addition, when the organopolysiloxane (B) having an Mw of 921 was used, x represented 1.6, y represented 0.4, and z represented 10. When the organopolysiloxane (B) having an Mw of 1,023 was used, x represented 1.6, y represented 0.6, and z represented 11. When the organopolysiloxane (B) having an Mw of 3,024 was used, x represented 3.8, y represented 2.6, and z represented 32. When the organopolysiloxane (B) having an Mw of 30,053 was used, x represented 41, y represented 23, and z represented 320. When the organopolysiloxane (B) having an Mw of 59,921 was used, x represented 102, y represented 28, and z represented 650. When the organopolysiloxane (B) having an Mw of 61,057 was used, x represented 100, y represented 32, and z represented 660. In addition, m represents a molar ratio (B/A) of the organopolysiloxane (B) to the organopolysiloxane (A).

It should be noted that the results of the dielectric breakdown voltages of semiconductor apparatuses produced by using organopolysiloxane compositions in each of which the ratio T/D of the organopolysiloxane (B) was changed to 0.1 are omitted because the results were the same as that in the case where the ratio T/D of the organopolysiloxane (B) was 0.15.

TABLE 4

<Organopolysiloxane (A): T/D = 0.4, Organopolysiloxane (B): T/D = 0.15>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,055 | | | | | | |
| 900 | 0.20 | 0.20 | 0.20 | 0.20 | 0.20 | 0.20 |
| 1,025 | 0.20 | 0.20 | 0.20 | 0.20 | 0.20 | 0.20 |
| 3,029 | 0.20 | 0.20 | 0.20 | 0.20 | 0.20 | 0.20 |
| 30,065 | 0.20 | 0.20 | 0.20 | 0.20 | 0.20 | 0.20 |
| 59,949 | 0.20 | 0.20 | 0.20 | 0.20 | 0.20 | 0.20 |
| 61,016 | 0.20 | 0.20 | 0.20 | 0.20 | 0.20 | 0.20 |
| 2) When the Mw of the organopolysiloxane (A) is 37,001 | | | | | | |
| 900 | 0.20 | 0.20 | 0.20 | 0.20 | 0.20 | 0.20 |
| 1,025 | 0.20 | 0.70 | 0.70 | 0.70 | 0.70 | 0.20 |
| 3,029 | 0.20 | 0.70 | 0.70 | 0.70 | 0.70 | 0.20 |
| 30,065 | 0.20 | 0.70 | 0.70 | 0.70 | 0.70 | 0.20 |
| 59,949 | 0.20 | 0.70 | 0.70 | 0.70 | 0.70 | 0.20 |
| 61,016 | 0.20 | 0.20 | 0.20 | 0.20 | 0.20 | 0.20 |
| 3) When the Mw of the organopolysiloxane (A) is 100,023 | | | | | | |
| 900 | 0.20 | 0.20 | 0.20 | 0.20 | 0.20 | 0.20 |
| 1,025 | 0.20 | 0.70 | 0.70 | 0.70 | 0.70 | 0.20 |
| 3,029 | 0.20 | 0.70 | 0.70 | 0.70 | 0.70 | 0.20 |
| 30,065 | 0.20 | 0.70 | 0.70 | 0.70 | 0.70 | 0.20 |
| 59,949 | 0.20 | 0.70 | 0.70 | 0.70 | 0.70 | 0.20 |
| 61,016 | 0.20 | 0.20 | 0.20 | 0.20 | 0.20 | 0.20 |
| 4) When the Mw of the organopolysiloxane (A) is 139,987 | | | | | | |
| 900 | 0.20 | 0.20 | 0.20 | 0.20 | 0.20 | 0.20 |
| 1,025 | 0.20 | 0.70 | 0.70 | 0.70 | 0.70 | 0.20 |
| 3,029 | 0.20 | 0.70 | 0.70 | 0.70 | 0.70 | 0.20 |
| 30,065 | 0.20 | 0.70 | 0.70 | 0.70 | 0.70 | 0.20 |
| 59,949 | 0.20 | 0.70 | 0.70 | 0.70 | 0.70 | 0.20 |
| 61,016 | 0.20 | 0.20 | 0.20 | 0.20 | 0.20 | 0.20 |
| 5) When the Mw of the organopolysiloxane (A) is 141,067 | | | | | | |
| 900 | 0.20 | 0.20 | 0.20 | 0.20 | 0.20 | 0.20 |
| 1,025 | 0.20 | 0.20 | 0.20 | 0.20 | 0.20 | 0.20 |
| 3,029 | 0.20 | 0.20 | 0.20 | 0.20 | 0.20 | 0.20 |
| 30,065 | 0.20 | 0.20 | 0.20 | 0.20 | 0.20 | 0.20 |
| 59,949 | 0.20 | 0.20 | 0.20 | 0.20 | 0.20 | 0.20 |
| 61,016 | 0.20 | 0.20 | 0.20 | 0.20 | 0.20 | 0.20 |

*) Dielectric breakdown voltages are represented in kV units.

TABLE 5

<Organopolysiloxane (A): T/D = 0.4, Organopolysiloxane (B): T/D = 0.2>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,055 | | | | | | |
| 921 | 0.20 | 0.20 | 0.20 | 0.20 | 0.20 | 0.20 |
| 1,023 | 0.20 | 0.20 | 0.20 | 0.20 | 0.20 | 0.20 |
| 3,024 | 0.20 | 0.20 | 0.20 | 0.20 | 0.20 | 0.20 |
| 30,053 | 0.20 | 0.20 | 0.20 | 0.20 | 0.20 | 0.20 |
| 59,921 | 0.20 | 0.20 | 0.20 | 0.20 | 0.20 | 0.20 |
| 61,057 | 0.20 | 0.20 | 0.20 | 0.20 | 0.20 | 0.20 |
| 2) When the Mw of the organopolysiloxane (A) is 37,001 | | | | | | |
| 921 | 0.20 | 0.20 | 0.20 | 0.20 | 0.20 | 0.20 |
| 1,023 | 0.20 | 0.20 | 0.20 | 0.20 | 0.20 | 0.20 |
| 3,024 | 0.20 | 0.20 | 0.20 | 0.20 | 0.20 | 0.20 |
| 30,053 | 0.20 | 0.20 | 0.20 | 0.20 | 0.20 | 0.20 |
| 59,921 | 0.20 | 0.20 | 0.20 | 0.20 | 0.20 | 0.20 |
| 61,057 | 0.20 | 0.20 | 0.20 | 0.20 | 0.20 | 0.20 |
| 3) When the Mw of the organopolysiloxane (A) is 100,023 | | | | | | |
| 921 | 0.20 | 0.20 | 0.20 | 0.20 | 0.20 | 0.20 |
| 1,023 | 0.20 | 0.20 | 0.20 | 0.20 | 0.20 | 0.20 |
| 3,024 | 0.20 | 0.20 | 0.20 | 0.20 | 0.20 | 0.20 |
| 30,053 | 0.20 | 0.20 | 0.20 | 0.20 | 0.20 | 0.20 |
| 59,921 | 0.20 | 0.20 | 0.20 | 0.20 | 0.20 | 0.20 |
| 61,057 | 0.20 | 0.20 | 0.20 | 0.20 | 0.20 | 0.20 |
| 4) When the Mw of the organopolysiloxane (A) is 139,987 | | | | | | |
| 921 | 0.20 | 0.20 | 0.20 | 0.20 | 0.20 | 0.20 |
| 1,023 | 0.20 | 0.20 | 0.20 | 0.20 | 0.20 | 0.20 |
| 3,024 | 0.20 | 0.20 | 0.20 | 0.20 | 0.20 | 0.20 |
| 30,053 | 0.20 | 0.20 | 0.20 | 0.20 | 0.20 | 0.20 |
| 59,921 | 0.20 | 0.20 | 0.20 | 0.20 | 0.20 | 0.20 |
| 61,057 | 0.20 | 0.20 | 0.20 | 0.20 | 0.20 | 0.20 |
| 5) When the Mw of the organopolysiloxane (A) is 141,067 | | | | | | |
| 921 | 0.20 | 0.20 | 0.20 | 0.20 | 0.20 | 0.20 |
| 1,023 | 0.20 | 0.20 | 0.20 | 0.20 | 0.20 | 0.20 |
| 3,024 | 0.20 | 0.20 | 0.20 | 0.20 | 0.20 | 0.20 |
| 30,053 | 0.20 | 0.20 | 0.20 | 0.20 | 0.20 | 0.20 |
| 59,921 | 0.20 | 0.20 | 0.20 | 0.20 | 0.20 | 0.20 |
| 61,057 | 0.20 | 0.20 | 0.20 | 0.20 | 0.20 | 0.20 |

*) Dielectric breakdown voltages are represented in kV units.

Tables 6 and 7 show the results of the measurement of the dielectric breakdown voltages of semiconductor apparatuses produced by using the organopolysiloxanes (A) each having a ratio T/D of 0.8. To be specific, Table 6 shows the results of the dielectric breakdown voltages of semiconductor apparatuses produced by using organopolysiloxane compositions containing the organopolysiloxanes (A) each having a ratio T/D of 0.8 and having various Mw's and the organopolysiloxanes (B) each having a ratio T/D of 0.15 and having various Mw's. In addition, Table 7 shows the results of the dielectric breakdown voltages of semiconductor apparatuses produced by using organopolysiloxane compositions in each of which the ratio T/D of the organopolysiloxane (B) was changed to 0.2.

Here, the cured products of the organopolysiloxane compositions in the semiconductor apparatuses produced in the tests of Tables 6 and 7 were each organopolysiloxane copolymers having a structure represented by the above formula (I). In the formula (I), $R^1$, $R^2$, $R^{12}$, and $R^{13}$ each represented a methyl group, $R^3$, $R^5$ to $R^9$, $R^{11}$, and $R^{14}$ each represented hydrogen, $R^4$ and $R^{10}$ each represented a phenyl group, and $R^{15}$ represented an ethylene group. In addition, when the organopolysiloxane (A) having an Mw of 36,007 was used, a represented 200, b represented 145, and c represented 15. When the organopolysiloxane (A) having an Mw of 37,049 was used, a represented 205, b represented 151, and c represented 13. When the organopolysiloxane (A) having an Mw of 100,007 was used, a represented 550, b represented 416, and c represented 24. When the organopolysiloxane (A) having an Mw of 139,953 was used, a represented 765, b represented 593, and c represented 19. When the organopolysiloxane (A) having an Mw of 141,055 was used, a represented 770, b represented 600, and c represented 16. In addition, when the organopolysiloxane (B) having an Mw of 900 was used, x represented 0.8, y represented 0.7, and z represented 10. When the organopolysiloxane (B) having an Mw of 1,025 was used, x represented 0.9, y represented 0.8, and z represented 11.4. When the organopolysiloxane (B) having an Mw of 3,029 was used, x represented 3.2, y represented 1.9, and z represented 34. When the organopolysiloxane (B) having an Mw of 30,065 was used, x represented 4, y represented 44, and z represented 320. When the organopolysiloxane (B) having an Mw of 59,949 was used, x represented 11, y represented 85, and z represented 640. When the organopolysiloxane (B) having an Mw of 61,016 was used, x represented 9, y represented 88.5, and z represented 650. In addition, when the organopolysiloxane (B) having an Mw of 921 was used, x represented 1.6, y represented 0.4, and z represented 10. When the organopolysiloxane (B) having an Mw of 1,023 was used, x represented 1.6, y represented 0.6, and z represented 11. When the organopolysiloxane (B) having an Mw of 3,024 was used, x represented 3.8, y represented 2.6, and z represented 32. When the organopolysiloxane (B) having an Mw of 30,053 was used, x represented 41, y represented 23, and z represented 320. When the organopolysiloxane (B) having an Mw of 59,921 was used, x represented 102, y represented 28, and z represented 650. When the organopolysiloxane (B) having an Mw of 61,057 was used, x represented 100, y represented 32, and z represented 660. In addition, m represents a molar ratio (B/A) of the organopolysiloxane (B) to the organopolysiloxane (A).

It should be noted that the results of the dielectric breakdown voltages of semiconductor apparatuses produced by using organopolysiloxane compositions in each of which the ratio T/D of the organopolysiloxane (B) was changed to 0.1 are omitted because the results were the same as that in the case where the ratio T/D of the organopolysiloxane (B) was 0.15.

TABLE 6

<Organopolysiloxane (A): T/D = 0.8,
Organopolysiloxane (B): T/D = 0.15>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,007 | | | | | | |
| 900 | 0.20 | 0.20 | 0.20 | 0.20 | 0.20 | 0.20 |
| 1,025 | 0.20 | 0.20 | 0.20 | 0.20 | 0.20 | 0.20 |
| 3,029 | 0.20 | 0.20 | 0.20 | 0.20 | 0.20 | 0.20 |
| 30,065 | 0.20 | 0.20 | 0.20 | 0.20 | 0.20 | 0.20 |
| 59,949 | 0.20 | 0.20 | 0.20 | 0.20 | 0.20 | 0.20 |
| 61,016 | 0.20 | 0.20 | 0.20 | 0.20 | 0.20 | 0.20 |
| 2) When the Mw of the organopolysiloxane (A) is 37,049 | | | | | | |
| 900 | 0.20 | 0.20 | 0.20 | 0.20 | 0.20 | 0.20 |
| 1,025 | 0.20 | 0.70 | 0.70 | 0.70 | 0.70 | 0.20 |
| 3,029 | 0.20 | 0.70 | 0.70 | 0.70 | 0.70 | 0.20 |
| 30,065 | 0.20 | 0.70 | 0.70 | 0.70 | 0.70 | 0.20 |
| 59,949 | 0.20 | 0.70 | 0.70 | 0.70 | 0.70 | 0.20 |
| 61,016 | 0.20 | 0.20 | 0.20 | 0.20 | 0.20 | 0.20 |
| 3) When the Mw of the organopolysiloxane (A) is 100,007 | | | | | | |
| 900 | 0.20 | 0.20 | 0.20 | 0.20 | 0.20 | 0.20 |
| 1,025 | 0.20 | 0.70 | 0.70 | 0.70 | 0.70 | 0.20 |
| 3,029 | 0.20 | 0.70 | 0.70 | 0.70 | 0.70 | 0.20 |
| 30,065 | 0.20 | 0.70 | 0.70 | 0.70 | 0.70 | 0.20 |
| 59,949 | 0.20 | 0.70 | 0.70 | 0.70 | 0.70 | 0.20 |
| 61,016 | 0.20 | 0.20 | 0.20 | 0.20 | 0.20 | 0.20 |
| 4) When the Mw of the organopolysiloxane (A) is 139,953 | | | | | | |
| 900 | 0.20 | 0.20 | 0.20 | 0.20 | 0.20 | 0.20 |
| 1,025 | 0.20 | 0.70 | 0.70 | 0.70 | 0.70 | 0.20 |
| 3,029 | 0.20 | 0.70 | 0.70 | 0.70 | 0.70 | 0.20 |
| 30,065 | 0.20 | 0.70 | 0.70 | 0.70 | 0.70 | 0.20 |
| 59,949 | 0.20 | 0.70 | 0.70 | 0.70 | 0.70 | 0.20 |
| 61,016 | 0.20 | 0.20 | 0.20 | 0.20 | 0.20 | 0.20 |
| 5) When the Mw of the organopolysiloxane (A) is 141,055 | | | | | | |
| 900 | 0.20 | 0.20 | 0.20 | 0.20 | 0.20 | 0.20 |
| 1,025 | 0.20 | 0.20 | 0.20 | 0.20 | 0.20 | 0.20 |
| 3,029 | 0.20 | 0.20 | 0.20 | 0.20 | 0.20 | 0.20 |
| 30,065 | 0.20 | 0.20 | 0.20 | 0.20 | 0.20 | 0.20 |
| 59,949 | 0.20 | 0.20 | 0.20 | 0.20 | 0.20 | 0.20 |
| 61,016 | 0.20 | 0.20 | 0.20 | 0.20 | 0.20 | 0.20 |

*) Dielectric breakdown voltages are represented in kV units.

TABLE 7

<Organopolysiloxane (A): T/D = 0.8, Organopolysiloxane (B): T/D = 0.2>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,007 | | | | | | |
| 921 | 0.20 | 0.20 | 0.20 | 0.20 | 0.20 | 0.20 |
| 1,023 | 0.20 | 0.20 | 0.20 | 0.20 | 0.20 | 0.20 |
| 3,024 | 0.20 | 0.20 | 0.20 | 0.20 | 0.20 | 0.20 |
| 30,053 | 0.20 | 0.20 | 0.20 | 0.20 | 0.20 | 0.20 |
| 59,921 | 0.20 | 0.20 | 0.20 | 0.20 | 0.20 | 0.20 |
| 61,057 | 0.20 | 0.20 | 0.20 | 0.20 | 0.20 | 0.20 |
| 2) When the Mw of the organopolysiloxane (A) is 37,049 | | | | | | |
| 921 | 0.20 | 0.20 | 0.20 | 0.20 | 0.20 | 0.20 |
| 1,023 | 0.20 | 0.20 | 0.20 | 0.20 | 0.20 | 0.20 |
| 3,024 | 0.20 | 0.20 | 0.20 | 0.20 | 0.20 | 0.20 |
| 30,053 | 0.20 | 0.20 | 0.20 | 0.20 | 0.20 | 0.20 |
| 59,921 | 0.20 | 0.20 | 0.20 | 0.20 | 0.20 | 0.20 |
| 61,057 | 0.20 | 0.20 | 0.20 | 0.20 | 0.20 | 0.20 |
| 3) When the Mw of the organopolysiloxane (A) is 100,007 | | | | | | |
| 921 | 0.20 | 0.20 | 0.20 | 0.20 | 0.20 | 0.20 |
| 1,023 | 0.20 | 0.20 | 0.20 | 0.20 | 0.20 | 0.20 |
| 3,024 | 0.20 | 0.20 | 0.20 | 0.20 | 0.20 | 0.20 |
| 30,053 | 0.20 | 0.20 | 0.20 | 0.20 | 0.20 | 0.20 |
| 59,921 | 0.20 | 0.20 | 0.20 | 0.20 | 0.20 | 0.20 |
| 61,057 | 0.20 | 0.20 | 0.20 | 0.20 | 0.20 | 0.20 |
| 4) When the Mw of the organopolysiloxane (A) is 139,953 | | | | | | |
| 921 | 0.20 | 0.20 | 0.20 | 0.20 | 0.20 | 0.20 |
| 1,023 | 0.20 | 0.20 | 0.20 | 0.20 | 0.20 | 0.20 |
| 3,024 | 0.20 | 0.20 | 0.20 | 0.20 | 0.20 | 0.20 |
| 30,053 | 0.20 | 0.20 | 0.20 | 0.20 | 0.20 | 0.20 |
| 59,921 | 0.20 | 0.20 | 0.20 | 0.20 | 0.20 | 0.20 |
| 61,057 | 0.20 | 0.20 | 0.20 | 0.20 | 0.20 | 0.20 |
| 5) When the Mw of the organopolysiloxane (A) is 141,055 | | | | | | |
| 921 | 0.20 | 0.20 | 0.20 | 0.20 | 0.20 | 0.20 |
| 1,023 | 0.20 | 0.20 | 0.20 | 0.20 | 0.20 | 0.20 |
| 3,024 | 0.20 | 0.20 | 0.20 | 0.20 | 0.20 | 0.20 |
| 30,053 | 0.20 | 0.20 | 0.20 | 0.20 | 0.20 | 0.20 |
| 59,921 | 0.20 | 0.20 | 0.20 | 0.20 | 0.20 | 0.20 |
| 61,057 | 0.20 | 0.20 | 0.20 | 0.20 | 0.20 | 0.20 |

*) Dielectric breakdown voltages are represented in kV units.

Table 8 shows the results of the measurement of the dielectric breakdown voltages of semiconductor apparatuses produced by using the organopolysiloxanes (A) each having a ratio T/D of 0.9. To be specific, Table 8 shows the results of the dielectric breakdown voltages of semiconductor apparatuses produced by using organopolysiloxane compositions containing the organopolysiloxanes (A) each having a ratio T/D of 0.9 and having various Mw's and the organopolysiloxanes (B) each having a ratio T/D of 0.15 and having various Mw's at various blending ratios.

Here, the cured products of the organopolysiloxane compositions in the semiconductor apparatuses produced in the tests of Table 8 were each organopolysiloxane copolymers having a structure represented by the above formula (I). In the formula (I), $R^1$, $R^2$, $R^{12}$, and $R^{13}$ each represented a methyl group, $R^3$, $R^5$ to $R^9$, $R^{11}$, and $R^{14}$ each represented hydrogen, $R^4$ and $R^{10}$ each represented a phenyl group, and $R^{15}$ represented an ethylene group. In addition, when the organopolysiloxane (A) having an Mw of 36,005 was used, a represented 190, b represented 143, and c represented 28. When the organopolysiloxane (A) having an Mw of 37,025 was used, a represented 190, b represented 160, and c represented 11. When the organopolysiloxane (A) having an Mw of 100,029 was used, a represented 510, b represented 441, and c represented 18. When the organopolysiloxane (A) having an Mw of 139,969 was used, a represented 710, b represented 626, and c represented 13. When the organopolysiloxane (A) having an Mw of 141,051 was used, a represented 720, b represented 620, and c represented 28. In addition, when the organopolysiloxane (B) having an Mw of 900 was used, x represented 0.8, y represented 0.7, and z represented 10. When the organopolysiloxane (B) having an Mw of 1,025 was used, x represented 0.9, y represented 0.8, and z represented 11.4. When the organopolysiloxane (B) having an Mw of 3,029 was used, x represented 3.2, y represented 1.9, and z represented 34. When the organopolysiloxane (B) having an Mw of 30,065 was used, x represented 4, y represented 44, and z represented 320. When the organopolysiloxane (B) having an Mw of 59,949 was used, x represented 11, y represented 85, and z represented 640. When the organopolysiloxane (B) having an Mw of 61,016 was used, x represented 9, y represented 88.5, and z represented 650. In addition, m represents a molar ratio (B/A) of the organopolysiloxane (B) to the organopolysiloxane (A).

It should be noted that the results of the dielectric breakdown voltages of semiconductor apparatuses produced by using organopolysiloxane compositions in each of which the ratio T/D of the organopolysiloxane (B) was changed to 0.1 or 0.2 are omitted because the results were the same as that in the case where the ratio T/D of the organopolysiloxane (B) was 0.15.

TABLE 8

<Organopolysiloxane (A): T/D = 0.9, Organopolysiloxane (B): T/D = 0.15>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,005 | | | | | | |
| 900 | 0.20 | 0.20 | 0.20 | 0.20 | 0.20 | 0.20 |
| 1,025 | 0.20 | 0.20 | 0.20 | 0.20 | 0.20 | 0.20 |
| 3,029 | 0.20 | 0.20 | 0.20 | 0.20 | 0.20 | 0.20 |
| 30,065 | 0.20 | 0.20 | 0.20 | 0.20 | 0.20 | 0.20 |
| 59,949 | 0.20 | 0.20 | 0.20 | 0.20 | 0.20 | 0.20 |
| 61,016 | 0.20 | 0.20 | 0.20 | 0.20 | 0.20 | 0.20 |
| 2) When the Mw of the organopolysiloxane (A) is 37,025 | | | | | | |
| 900 | 0.20 | 0.20 | 0.20 | 0.20 | 0.20 | 0.20 |
| 1,025 | 0.20 | 0.20 | 0.20 | 0.20 | 0.20 | 0.20 |
| 3,029 | 0.20 | 0.20 | 0.20 | 0.20 | 0.20 | 0.20 |
| 30,065 | 0.20 | 0.20 | 0.20 | 0.20 | 0.20 | 0.20 |
| 59,949 | 0.20 | 0.20 | 0.20 | 0.20 | 0.20 | 0.20 |
| 61,016 | 0.20 | 0.20 | 0.20 | 0.20 | 0.20 | 0.20 |
| 3) When the Mw of the organopolysiloxane (A) is 100,029 | | | | | | |
| 900 | 0.20 | 0.20 | 0.20 | 0.20 | 0.20 | 0.20 |
| 1,025 | 0.20 | 0.20 | 0.20 | 0.20 | 0.20 | 0.20 |
| 3,029 | 0.20 | 0.20 | 0.20 | 0.20 | 0.20 | 0.20 |
| 30,065 | 0.20 | 0.20 | 0.20 | 0.20 | 0.20 | 0.20 |
| 59,949 | 0.20 | 0.20 | 0.20 | 0.20 | 0.20 | 0.20 |
| 61,016 | 0.20 | 0.20 | 0.20 | 0.20 | 0.20 | 0.20 |
| 4) When the Mw of the organopolysiloxane (A) is 139,969 | | | | | | |
| 900 | 0.20 | 0.20 | 0.20 | 0.20 | 0.20 | 0.20 |
| 1,025 | 0.20 | 0.20 | 0.20 | 0.20 | 0.20 | 0.20 |
| 3,029 | 0.20 | 0.20 | 0.20 | 0.20 | 0.20 | 0.20 |
| 30,065 | 0.20 | 0.20 | 0.20 | 0.20 | 0.20 | 0.20 |
| 59,949 | 0.20 | 0.20 | 0.20 | 0.20 | 0.20 | 0.20 |
| 61,016 | 0.20 | 0.20 | 0.20 | 0.20 | 0.20 | 0.20 |
| 5) When the Mw of the organopolysiloxane (A) is 141,051 | | | | | | |
| 900 | 0.20 | 0.20 | 0.20 | 0.20 | 0.20 | 0.20 |
| 1,025 | 0.20 | 0.20 | 0.20 | 0.20 | 0.20 | 0.20 |
| 3,029 | 0.20 | 0.20 | 0.20 | 0.20 | 0.20 | 0.20 |
| 30,065 | 0.20 | 0.20 | 0.20 | 0.20 | 0.20 | 0.20 |
| 59,949 | 0.20 | 0.20 | 0.20 | 0.20 | 0.20 | 0.20 |
| 61,016 | 0.20 | 0.20 | 0.20 | 0.20 | 0.20 | 0.20 |

*) Dielectric breakdown voltages are represented in kV units.

As shown in the results of Tables 1 to 8, the dielectric breakdown voltage was high only when the following conditions were satisfied. That is, the ratio T/D of the organopolysiloxane (A) was 0.3 to 0.8, the Mw of the organopolysiloxane (A) was 37,000 to 140,000, the ratio T/D of the organopolysiloxane (B) was 0.15 or less, the Mw of the organopolysiloxane (B) was 1,000 to 60,000, and the molar ratio of the organopolysiloxane (B) to the organopolysiloxane (A) was 1.5 to 6.5.

The adhesive strength test and a stickiness test described below were performed in order that the results of the dielectric breakdown voltage might be discussed.

(Adhesive Strength Test)

Each of the organopolysiloxane compositions synthesized above were subjected to an adhesive strength test in accordance with JIS-K6850. To be specific, the organopolysiloxane composition was injected into a gap between a pair of aluminum plates, and was then heated at 150° C. for 3 hours and at 200° C. for 1 hour so as to be completely cured. Then, the test piece was subjected to a tensile shearing test. Tables 9 to 23 below show the results.

Tables 9 to 11 show the results of the measurement of adhesive strengths in the cured products of organopolysiloxane compositions using the organopolysiloxanes (A) each having a ratio T/D of 0.2. To be specific, Table 9 shows the results of the measurement of adhesive strengths in the cured products of organopolysiloxane compositions containing the organopolysiloxanes (A) each having a ratio T/D of 0.2 and having various Mw's and the organopolysiloxanes (B) each having a ratio T/D of 0.1 and having various Mw's at various blending ratios. In addition, Tables 10 and 11 show the results of the measurement of adhesive strengths in the cured products of organopolysiloxane compositions in each of which the ratio T/D of the organopolysiloxane (B) was changed to 0.15 or 0.2.

Here, the cured products of the organopolysiloxane compositions obtained in the tests of Tables 9 and 11 were each organopolysiloxane copolymers having a structure represented by the above formula (I). In the formula (I), $R^1$, $R^2$, $R^{12}$, and $R^{13}$ each represented a methyl group, $R^3$, $R^5$ to $R^9$, $R^{11}$, and $R^{14}$ each represented hydrogen, $R^4$ and $R^{10}$ each represented a phenyl group, and $R^{15}$ represented an ethylene group. In addition, when the organopolysiloxane (A) having an Mw of 36,003 was used, a represented 360, b represented 62, and c represented 10. When the organopolysiloxane (A) having an Mw of 37,019 was used, a represented 370, b represented 64, and c represented 10. When the organopolysiloxane (A) having an Mw of 100,007 was used, a represented 1,000, b represented 173, and c represented 27. When the organopolysiloxane (A) having an Mw of 139,927 was used, a represented 1,400, b represented 241, and c represented 39. When the organopolysiloxane (A) having an Mw of 141,047 was used, a represented 1,450, b represented 185, and c represented 105. In addition, when the organopolysiloxane (B) having an Mw of 907 was used, x represented 1, y represented 0.1, and z represented 11. When the organopolysiloxane (B) having an Mw of 1,025 was used, x represented 0.5, y represented 0.7, and z represented 12. When the organopolysiloxane (B) having an Mw of 3,026 was used, x represented 0.8, y represented 2.7, and z represented 35. When the organopolysiloxane (B) having an Mw of 30,112 was used, x represented 3, y represented 31.5, and z represented 345. When the organopolysiloxane (B) having an Mw of 59,983 was used, x represented 10, y represented 59, and z represented 690. When the organopolysiloxane (B) having an Mw of 61,041 was used, x represented 7, y represented 63, and z represented 700. In addition, when the organopolysiloxane (B) having an Mw of 921 was used, x represented 1.6, y represented 0.4, and z represented 10. When the organopolysiloxane (B) having an Mw of 1,023 was used, x represented 1.6, y represented 0.6, and z represented 11. When the organopolysiloxane (B) having an Mw of 3,024 was used, x represented 3.8, y represented 2.6, and z represented 32. When the organopolysiloxane (B) having an Mw of 30,053 was used, x represented 41, y represented 23, and z represented 320. When the organopolysiloxane (B) having an Mw of 59,921 was used, x represented 102, y represented 28, and z represented 650. When the organopolysiloxane (B) having an Mw of 61,057 was used, x represented 100, y represented 32, and z represented 660. In addition, m represents a molar ratio (B/A) of the organopolysiloxane (B) to the organopolysiloxane (A).

It should be noted that the cured products of the organopolysiloxane compositions obtained in the tests of Table 10 were all organopolysiloxane copolymers having the same structure as those of the tests of Table 1.

TABLE 9

<Organopolysiloxane (A): T/D = 0.2, Organopolysiloxane (B): T/D = 0.1>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,003 | | | | | | |
| 907 | — | — | — | — | — | — |
| 1,025 | — | — | — | — | — | — |
| 3,026 | — | — | — | — | — | — |
| 30,112 | — | — | — | — | — | — |
| 59,983 | — | — | — | — | — | — |
| 61,041 | — | — | — | — | — | — |
| 2) When the Mw of the organopolysiloxane (A) is 37,019 | | | | | | |
| 907 | 0.11 | — | — | — | — | — |
| 1,025 | 0.10 | — | — | — | — | — |
| 3,026 | 0.10 | — | — | — | — | — |
| 30,112 | — | — | — | — | — | — |
| 59,983 | — | — | — | — | — | — |
| 61,041 | — | — | — | — | — | — |
| 3) When the Mw of the organopolysiloxane (A) is 100,007 | | | | | | |
| 907 | 0.11 | — | — | — | — | — |
| 1,025 | 0.11 | — | — | — | — | — |
| 3,026 | 0.10 | — | — | — | — | — |
| 30,112 | — | — | — | — | — | — |
| 59,983 | — | — | — | — | — | — |
| 61,041 | — | — | — | — | — | — |
| 4) When the Mw of the organopolysiloxane (A) is 139,927 | | | | | | |
| 907 | 0.11 | — | — | — | — | — |
| 1,025 | 0.11 | — | — | — | — | — |
| 3,026 | 0.10 | — | — | — | — | — |
| 30,112 | — | — | — | — | — | — |
| 59,983 | — | — | — | — | — | — |
| 61,041 | — | — | — | — | — | — |
| 5) When the Mw of the organopolysiloxane (A) is 141,047 | | | | | | |
| 907 | 0.12 | — | — | — | — | — |
| 1,025 | 0.12 | — | — | — | — | — |
| 3,026 | 0.11 | — | — | — | — | — |
| 30,112 | — | — | — | — | — | — |
| 59,983 | — | — | — | — | — | — |
| 61,041 | — | — | — | — | — | — |

*) Adhesive strengths are represented in MPa units.
*) — means that an adhesive strength is equal to or lower than a measurement limit.

TABLE 10

<Organopolysiloxane (A): T/D = 0.2, Organopolysiloxane (B): T/D = 0.15>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,003 | | | | | | |
| 900 | — | — | — | — | — | — |
| 1,025 | — | — | — | — | — | — |
| 3,029 | — | — | — | — | — | — |
| 30,065 | — | — | — | — | — | — |
| 59,949 | — | — | — | — | — | — |
| 61,016 | — | — | — | — | — | — |
| 2) When the Mw of the organopolysiloxane (A) is 37,019 | | | | | | |
| 900 | 0.11 | — | — | — | — | — |
| 1,025 | 0.11 | — | — | — | — | — |
| 3,029 | 0.10 | — | — | — | — | — |
| 30,065 | — | — | — | — | — | — |
| 59,949 | — | — | — | — | — | — |
| 61,016 | — | — | — | — | — | — |
| 3) When the Mw of the organopolysiloxane (A) is 100,007 | | | | | | |
| 900 | 0.11 | — | — | — | — | — |
| 1,025 | 0.11 | — | — | — | — | — |
| 3,029 | 0.11 | — | — | — | — | — |
| 30,065 | — | — | — | — | — | — |
| 59,949 | — | — | — | — | — | — |
| 61,016 | — | — | — | — | — | — |

TABLE 10-continued

<Organopolysiloxane (A): T/D = 0.2, Organopolysiloxane (B): T/D = 0.15>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 4) When the Mw of the organopolysiloxane (A) is 139,927 | | | | | | |
| 900 | 0.11 | — | — | — | — | — |
| 1,025 | 0.11 | — | — | — | — | — |
| 3,029 | 0.11 | — | — | — | — | — |
| 30,065 | — | — | — | — | — | — |
| 59,949 | — | — | — | — | — | — |
| 61,016 | — | — | — | — | — | — |
| 5) When the Mw of the organopolysiloxane (A) is 141,047 | | | | | | |
| 900 | 0.12 | 0.10 | — | — | — | — |
| 1,025 | 0.12 | 0.10 | — | — | — | — |
| 3,029 | 0.12 | — | — | — | — | — |
| 30,065 | — | — | — | — | — | — |
| 59,949 | — | — | — | — | — | — |
| 61,016 | — | — | — | — | — | — |

*) Adhesive strengths are represented in MPa units.
*) — means that an adhesive strength is equal to or lower than a measurement limit.

TABLE 11

<Organopolysiloxane (A): T/D = 0.2, Organopolysiloxane (B): T/D = 0.2>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,003 | | | | | | |
| 921 | — | — | — | — | — | — |
| 1,023 | — | — | — | — | — | — |
| 3,024 | — | — | — | — | — | — |
| 30,053 | — | — | — | — | — | — |
| 59,921 | — | — | — | — | — | — |
| 61,057 | — | — | — | — | — | — |
| 2) When the Mw of the organopolysiloxane (A) is 37,019 | | | | | | |
| 921 | 0.12 | 0.10 | — | — | — | — |
| 1,023 | 0.12 | — | — | — | — | — |
| 3,024 | 0.11 | — | — | — | — | — |
| 30,053 | — | — | — | — | — | — |
| 59,921 | — | — | — | — | — | — |
| 61,057 | — | — | — | — | — | — |
| 3) When the Mw of the organopolysiloxane (A) is 100,007 | | | | | | |
| 921 | 0.12 | 0.10 | — | — | — | — |
| 1,023 | 0.12 | — | — | — | — | — |
| 3,024 | 0.12 | — | — | — | — | — |
| 30,053 | 0.10 | — | — | — | — | — |
| 59,921 | — | — | — | — | — | — |
| 61,057 | — | — | — | — | — | — |
| 4) When the Mw of the organopolysiloxane (A) is 139,927 | | | | | | |
| 921 | 0.13 | 0.10 | — | — | — | — |
| 1,023 | 0.12 | 0.10 | — | — | — | — |
| 3,024 | 0.12 | — | — | — | — | — |
| 30,053 | — | — | — | — | — | — |
| 59,921 | — | — | — | — | — | — |
| 61,057 | — | — | — | — | — | — |
| 5) When the Mw of the organopolysiloxane (A) is 141,047 | | | | | | |
| 921 | 0.14 | 0.11 | — | — | — | — |
| 1,023 | 0.13 | 0.11 | — | — | — | — |
| 3,024 | 0.13 | 0.10 | — | — | — | — |
| 30,053 | 0.10 | — | — | — | — | — |
| 59,921 | — | — | — | — | — | — |
| 61,057 | — | — | — | — | — | — |

*) Adhesive strengths are represented in MPa units.
*) — means that an adhesive strength is equal to or lower than a measurement limit.

Tables 12 to 14 show the results of the measurement of adhesive strengths in the cured products of organopolysiloxane compositions using the organopolysiloxanes (A) each having a ratio T/D of 0.3. To be specific, Table 12 shows the results of the measurement of adhesive strengths in the cured products of organopolysiloxane compositions containing the organopolysiloxanes (A) each having a ratio T/D of 0.3 and having various Mw's and the organopolysiloxanes (B) each having a ratio T/D of 0.1 and having various Mw's at various blending ratios. In addition, Tables 13 and 14 show the results of the measurement of adhesive strengths in the cured products of organopolysiloxane compositions in each of which the ratio T/D of the organopolysiloxane (B) was changed to 0.15 or 0.2.

Here, the cured products of the organopolysiloxane compositions obtained in the tests of Table 12 were each organopolysiloxane copolymers having a structure represented by the above formula (I). In the formula (I), $R^1$, $R^2$, $R^{12}$, and $R^{13}$ each represented a methyl group, $R^3$, $R^5$ to $R^9$, $R^{11}$, and $R^{14}$ each represented hydrogen, $R^4$ and $R^{10}$ each represented a phenyl group, and $R^{15}$ represented an ethylene group. In addition, when the organopolysiloxane (A) having an Mw of 36,055 was used, a represented 320, b represented 81, and c represented 15. When the organopolysiloxane (A) having an Mw of 37,029 was used, a represented 330, b represented 81, and c represented 18. When the organopolysiloxane (A) having an Mw of 100,019 was used, a represented 880, b represented 238, and c represented 26. When the organopolysiloxane (A) having an Mw of 139,975 was used, a represented 1,220, b represented 352, and c represented 14. When the organopolysiloxane (A) having an Mw of 141,069 was used, a represented 1,230, b represented 354, and c represented 15. In addition, when the organopolysiloxane (B) having an Mw of 907 was used, x represented 1, y represented 0.1, and z represented 11. When the organopolysiloxane (B) having an Mw of 1,025 was used, x represented 0.5, y represented 0.7, and z represented 12. When the organopolysiloxane (B) having an Mw of 3,026 was used, x represented 0.8, y represented 2.7, and z represented 35. When the organopolysiloxane (B) having an Mw of 30,112 was used, x represented 3, y represented 31.5, and z represented 345. When the organopolysiloxane (B) having an Mw of 59,983 was used, x represented 10, y represented 59, and z represented 690. When the organopolysiloxane (B) having an Mw of 61,041 was used, x represented 7, y represented 63, and z represented 700. In addition, m represents a molar ratio (B/A) of the organopolysiloxane (B) to the organopolysiloxane (A).

It should be noted that the cured products of the organopolysiloxane compositions obtained in the tests of Tables 13 and 14 were all organopolysiloxane copolymers having the same structure as those of the tests of Tables 2 and 3.

TABLE 12

<Organopolysiloxane (A): T/D = 0.3, Organopolysiloxane (B): T/D = 0.1>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,055 | | | | | | |
| 907 | 0.68 | — | — | — | — | — |
| 1,025 | 0.63 | — | — | — | — | — |
| 3,026 | 0.56 | — | — | — | — | — |
| 30,112 | 0.10 | — | — | — | — | — |
| 59,983 | — | — | — | — | — | — |
| 61,041 | — | — | — | — | — | — |
| 2) When the Mw of the organopolysiloxane (A) is 37,029 | | | | | | |
| 907 | 3.07 | 2.39 | 1.98 | 1.51 | 0.74 | — |
| 1,025 | 3.01 | 2.33 | 1.90 | 1.43 | 0.66 | — |
| 3,026 | 2.88 | 2.18 | 1.69 | 1.21 | 0.53 | — |
| 30,112 | 2.37 | 1.82 | 1.39 | 0.77 | 0.30 | — |
| 59,983 | 1.85 | 1.22 | 0.89 | 0.62 | 0.20 | — |
| 61,041 | 0.12 | 0.06 | 0.03 | 0.01 | — | — |
| 3) When the Mw of the organopolysiloxane (A) is 100,019 | | | | | | |
| 907 | 3.11 | 2.43 | 2.03 | 1.55 | 0.78 | — |
| 1,025 | 3.06 | 2.37 | 1.94 | 1.47 | 0.71 | — |
| 3,026 | 2.92 | 2.22 | 1.73 | 1.25 | 0.57 | — |
| 30,112 | 2.41 | 1.86 | 1.43 | 0.82 | 0.34 | — |
| 59,983 | 1.89 | 1.26 | 0.93 | 0.66 | 0.24 | — |
| 61,041 | 0.16 | 0.10 | — | — | — | — |
| 4) When the Mw of the organopolysiloxane (A) is 139,975 | | | | | | |
| 907 | 3.17 | 2.50 | 2.09 | 1.61 | 0.84 | — |
| 1,025 | 3.12 | 2.43 | 2.00 | 1.53 | 0.77 | — |
| 3,026 | 2.98 | 2.28 | 1.80 | 1.31 | 0.64 | — |
| 30,112 | 2.19 | 1.60 | 1.25 | 0.91 | 0.50 | — |
| 59,983 | 1.85 | 1.26 | 0.91 | 0.60 | 0.28 | — |
| 61,041 | 0.22 | 0.17 | 0.13 | 0.11 | — | — |
| 5) When the Mw of the organopolysiloxane (A) is 141,069 | | | | | | |
| 907 | 3.40 | 2.72 | 2.31 | 1.82 | 1.06 | — |
| 1,025 | 3.34 | 2.64 | 2.23 | 1.76 | 0.98 | — |
| 3,026 | 3.20 | 2.50 | 2.02 | 1.53 | 0.85 | — |
| 30,112 | 2.41 | 1.82 | 1.47 | 1.13 | 0.72 | — |
| 59,983 | 2.06 | 1.48 | 1.12 | 0.82 | 0.43 | — |
| 61,041 | 0.40 | 0.35 | 0.31 | 0.29 | — | — |

*) Adhesive strengths are represented in MPa units.
*) — means that an adhesive strength is equal to or lower than a measurement limit.

TABLE 13

<Organopolysiloxane (A): T/D = 0.3, Organopolysiloxane (B): T/D = 0.15>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,055 | | | | | | |
| 900 | 0.85 | — | — | — | — | — |
| 1,025 | 0.79 | — | — | — | — | — |
| 3,029 | 0.65 | — | — | — | — | — |
| 30,065 | 0.12 | — | — | — | — | — |
| 59,949 | — | — | — | — | — | — |
| 61,016 | — | — | — | — | — | — |
| 2) When the Mw of the organopolysiloxane (A) is 37,029 | | | | | | |
| 900 | 3.20 | 2.49 | 2.07 | 1.57 | 0.77 | — |
| 1,025 | 3.14 | 2.43 | 1.98 | 1.49 | 0.69 | — |
| 3,029 | 3.00 | 2.27 | 1.76 | 1.26 | 0.55 | — |
| 30,065 | 2.47 | 1.89 | 1.45 | 0.81 | 0.31 | — |
| 59,949 | 1.93 | 1.27 | 0.93 | 0.65 | 0.21 | — |
| 61,016 | 0.12 | — | — | — | — | — |
| 3) When the Mw of the organopolysiloxane (A) is 100,019 | | | | | | |
| 900 | 3.24 | 2.53 | 2.11 | 1.61 | 0.81 | — |
| 1,025 | 3.18 | 2.47 | 2.02 | 1.53 | 0.73 | — |
| 3,029 | 3.04 | 2.31 | 1.81 | 1.30 | 0.60 | — |
| 30,065 | 2.51 | 1.94 | 1.49 | 0.85 | 0.35 | — |
| 59,949 | 1.97 | 1.31 | 0.97 | 0.69 | 0.25 | — |
| 61,016 | 0.17 | 0.11 | — | — | — | — |
| 4) When the Mw of the organopolysiloxane (A) is 139,975 | | | | | | |
| 900 | 3.30 | 2.60 | 2.17 | 1.68 | 0.88 | — |
| 1,025 | 3.25 | 2.53 | 2.09 | 1.60 | 0.80 | — |
| 3,029 | 3.10 | 2.38 | 1.87 | 1.37 | 0.66 | — |
| 30,065 | 2.28 | 1.66 | 1.30 | 0.94 | 0.52 | — |
| 59,949 | 1.92 | 1.31 | 0.94 | 0.63 | 0.29 | — |
| 61,016 | 0.23 | 0.17 | 0.14 | 0.12 | — | — |
| 5) When the Mw of the organopolysiloxane (A) is 141,069 | | | | | | |
| 900 | 3.54 | 2.83 | 2.40 | 1.90 | 1.11 | — |
| 1,025 | 3.48 | 2.75 | 2.32 | 1.83 | 1.02 | — |
| 3,029 | 3.33 | 2.61 | 2.10 | 1.60 | 0.89 | — |
| 30,065 | 2.51 | 1.89 | 1.53 | 1.17 | 0.75 | — |
| 59,949 | 2.15 | 1.54 | 1.17 | 0.85 | 0.45 | — |
| 61,016 | 0.42 | 0.36 | 0.32 | 0.30 | — | — |

*) Adhesive strengths are represented in MPa units.
*) — means that an adhesive strength is equal to or lower than a measurement limit.

TABLE 14

<Organopolysiloxane (A): T/D = 0.3, Organopolysiloxane (B): T/D = 0.2>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,055 | | | | | | |
| 921 | 0.93 | — | — | — | — | — |
| 1,023 | 0.87 | — | — | — | — | — |
| 3,024 | 0.71 | — | — | — | — | — |
| 30,053 | 0.13 | — | — | — | — | — |
| 59,921 | — | — | — | — | — | — |
| 61,057 | — | — | — | — | — | — |
| 2) When the Mw of the organopolysiloxane (A) is 37,029 | | | | | | |
| 921 | 3.52 | 2.74 | 2.27 | 1.73 | 0.85 | — |
| 1,023 | 3.45 | 2.67 | 2.18 | 1.64 | 0.76 | — |
| 3,024 | 3.29 | 2.49 | 1.94 | 1.39 | 0.61 | — |
| 30,053 | 2.72 | 2.08 | 1.59 | 0.89 | 0.34 | — |
| 59,921 | 2.12 | 1.39 | 1.02 | 0.71 | 0.23 | — |
| 61,057 | 0.13 | — | — | — | — | — |
| 3) When the Mw of the organopolysiloxane (A) is 100,019 | | | | | | |
| 921 | 3.56 | 2.79 | 2.32 | 1.77 | 0.89 | — |
| 1,023 | 3.50 | 2.72 | 2.23 | 1.69 | 0.81 | — |
| 3,024 | 3.34 | 2.54 | 1.99 | 1.43 | 0.66 | — |
| 30,053 | 2.76 | 2.13 | 1.64 | 0.93 | 0.39 | — |
| 59,921 | 2.17 | 1.44 | 1.07 | 0.76 | 0.28 | — |
| 61,057 | 0.18 | 0.12 | — | — | — | — |
| 4) When the Mw of the organopolysiloxane (A) is 139,975 | | | | | | |
| 921 | 3.64 | 2.86 | 2.39 | 1.85 | 0.97 | — |
| 1,023 | 3.57 | 2.79 | 2.30 | 1.76 | 0.88 | — |
| 3,024 | 3.41 | 2.61 | 2.06 | 1.50 | 0.73 | — |
| 30,053 | 2.51 | 1.83 | 1.43 | 1.04 | 0.57 | — |
| 59,921 | 2.11 | 1.44 | 1.04 | 0.69 | 0.32 | — |
| 61,057 | 0.25 | 0.19 | 0.15 | 0.13 | — | — |

TABLE 14-continued

<Organopolysiloxane (A): T/D = 0.3, Organopolysiloxane (B): T/D = 0.2>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 5) When the Mw of the organopolysiloxane (A) is 141,069 | | | | | | |
| 921 | 3.90 | 3.11 | 2.65 | 2.09 | 1.22 | — |
| 1,023 | 3.83 | 3.03 | 2.55 | 2.01 | 1.12 | — |
| 3,024 | 3.67 | 2.87 | 2.31 | 1.76 | 0.97 | — |
| 30,053 | 2.76 | 2.08 | 1.69 | 1.29 | 0.82 | — |
| 59,921 | 2.36 | 1.69 | 1.28 | 0.93 | 0.49 | — |
| 61,057 | 0.46 | 0.40 | 0.36 | 0.33 | — | — |

*) Adhesive strengths are represented in MPa units.
*) — means that an adhesive strength is equal to or lower than a measurement limit.

Tables 15 to 17 show the results of the measurement of adhesive strengths in the cured products of organopolysiloxane compositions using the organopolysiloxanes (A) each having a ratio T/D of 0.4. To be specific, Table 15 shows the results of the measurement of adhesive strengths in the cured products of organopolysiloxane compositions containing the organopolysiloxanes (A) each having a ratio T/D of 0.4 and having various Mw's and the organopolysiloxanes (B) each having a ratio T/D of 0.1 and having various Mw's at various blending ratios. In addition, Tables 16 and 17 show the results of the measurement of adhesive strengths in the cured products of organopolysiloxane compositions in each of which the ratio T/D of the organopolysiloxane (B) was changed to 0.15 or 0.2.

Here, the cured products of the organopolysiloxane compositions obtained in the tests of Table 15 were each organopolysiloxane copolymers having a structure represented by the above formula (I). In the formula (I), $R^1$, $R^2$, $R^{12}$, and $R^{13}$ each represented a methyl group, $R^3$, $R^5$ to $R^9$, $R^{11}$, and $R^{14}$ each represented hydrogen, $R^4$ and $R^{10}$ each represented a phenyl group, and $R^{15}$ represented an ethylene group. In addition, when the organopolysiloxane (A) having an Mw of 36,055 was used, a represented 290, b represented 92, and c represented 24. When the organopolysiloxane (A) having an Mw of 37,001 was used, a represented 295, b represented 99, and c represented 19. When the organopolysiloxane (A) having an Mw of 100,023 was used, a represented 780, b represented 299, and c represented 13. When the organopolysiloxane (A) having an Mw of 139,987 was used, a represented 1,100, b represented 404, and c represented 36. When the organopolysiloxane (A) having an Mw of 141,067 was used, a represented 1,100, b represented 422, and c represented 18. In addition, when the organopolysiloxane (B) having an Mw of 907 was used, x represented 1, y represented 0.1, and z represented 11. When the organopolysiloxane (B) having an Mw of 1,025 was used, x represented 0.5, y represented 0.7, and z represented 12. When the organopolysiloxane (B) having an Mw of 3,026 was used, x represented 0.8, y represented 2.7, and z represented 35. When the organopolysiloxane (B) having an Mw of 30,112 was used, x represented 3, y represented 31.5, and z represented 345. When the organopolysiloxane (B) having an Mw of 59,983 was used, x represented 10, y represented 59, and z represented 690. When the organopolysiloxane (B) having an Mw of 61,041 was used, x represented 7, y represented 63, and z represented 700. In addition, m represents a molar ratio (B/A) of the organopolysiloxane (B) to the organopolysiloxane (A).

It should be noted that the cured products of the organopolysiloxane compositions obtained in the tests of Tables 16 and 17 were all organopolysiloxane copolymers having the same structure as those of the tests of Tables 4 and 5.

TABLE 15

<Organopolysiloxane (A): T/D = 0.4, Organopolysiloxane (B): T/D = 0.1>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,055 | | | | | | |
| 907 | 0.83 | 0.10 | — | — | — | — |
| 1,025 | 0.77 | — | — | — | — | — |
| 3,026 | 0.63 | — | — | — | — | — |
| 30,112 | 0.12 | — | — | — | — | — |
| 59,983 | — | — | — | — | — | — |
| 61,041 | — | — | — | — | — | — |
| 2) When the Mw of the organopolysiloxane (A) is 37,001 | | | | | | |
| 907 | 3.75 | 2.92 | 2.42 | 1.84 | 0.90 | — |
| 1,025 | 3.68 | 2.85 | 2.32 | 1.75 | 0.81 | — |
| 3,026 | 3.51 | 2.66 | 2.07 | 1.48 | 0.65 | — |
| 30,112 | 2.90 | 2.22 | 1.70 | 0.95 | 0.36 | — |
| 59,983 | 2.26 | 1.49 | 1.09 | 0.76 | 0.24 | — |
| 61,041 | 0.14 | — | — | — | — | — |
| 3) When the Mw of the organopolysiloxane (A) is 100,023 | | | | | | |
| 907 | 3.80 | 2.97 | 2.48 | 1.89 | 0.95 | — |
| 1,025 | 3.73 | 2.90 | 2.37 | 1.80 | 0.86 | — |
| 3,026 | 3.57 | 2.71 | 2.12 | 1.53 | 0.70 | — |
| 30,112 | 2.95 | 2.27 | 1.75 | 1.00 | 0.41 | — |
| 59,983 | 2.31 | 1.54 | 1.14 | 0.81 | 0.30 | — |
| 61,041 | 0.19 | 0.13 | — | — | — | — |
| 4) When the Mw of the organopolysiloxane (A) is 139,987 | | | | | | |
| 907 | 3.88 | 3.05 | 2.55 | 1.97 | 1.03 | — |
| 1,025 | 3.81 | 2.97 | 2.45 | 1.88 | 0.94 | — |
| 3,026 | 3.64 | 2.79 | 2.20 | 1.61 | 0.78 | — |
| 30,112 | 2.68 | 1.95 | 1.53 | 1.11 | 0.61 | — |
| 59,983 | 2.26 | 1.54 | 1.11 | 0.73 | 0.34 | — |
| 61,041 | 0.27 | 0.20 | 0.16 | 0.14 | — | — |
| 5) When the Mw of the organopolysiloxane (A) is 141,067 | | | | | | |
| 907 | 4.16 | 3.32 | 2.82 | 2.23 | 1.30 | 0.10 |
| 1,025 | 4.08 | 3.23 | 2.72 | 2.15 | 1.20 | — |
| 3,026 | 3.91 | 3.06 | 2.47 | 1.88 | 1.04 | — |
| 30,112 | 2.95 | 2.22 | 1.80 | 1.38 | 0.88 | — |
| 59,983 | 2.52 | 1.81 | 1.37 | 1.00 | 0.52 | — |
| 61,041 | 0.49 | 0.42 | 0.38 | 0.35 | — | — |

*) Adhesive strengths are represented in MPa units.
*) — means that an adhesive strength is equal to or lower than a measurement limit.

TABLE 16

<Organopolysiloxane (A): T/D = 0.4, Organopolysiloxane (B): T/D = 0.15>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,055 | | | | | | |
| 900 | 1.04 | 0.11 | — | — | — | — |
| 1,025 | 0.97 | — | — | — | — | — |
| 3,029 | 0.79 | — | — | — | — | — |
| 30,065 | 0.15 | — | — | — | — | — |
| 59,949 | — | — | — | — | — | — |
| 61,016 | — | — | — | — | — | — |
| 2) When the Mw of the organopolysiloxane (A) is 37,001 | | | | | | |
| 900 | 3.91 | 3.04 | 2.53 | 1.92 | 0.94 | — |
| 1,025 | 3.84 | 2.97 | 2.42 | 1.82 | 0.84 | — |
| 3,029 | 3.66 | 2.77 | 2.16 | 1.54 | 0.68 | — |
| 30,065 | 3.02 | 2.31 | 1.77 | 0.99 | 0.38 | — |

TABLE 16-continued

<Organopolysiloxane (A): T/D = 0.4, Organopolysiloxane (B): T/D = 0.15>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 59,949 | 2.36 | 1.55 | 1.14 | 0.79 | 0.26 | — |
| 61,016 | 0.15 | — | — | — | — | — |
| 3) When the Mw of the organopolysiloxane (A) is 100,023 | | | | | | |
| 900 | 3.96 | 3.10 | 2.58 | 1.97 | 0.99 | — |
| 1,025 | 3.89 | 3.02 | 2.47 | 1.87 | 0.90 | — |
| 3,029 | 3.71 | 2.82 | 2.21 | 1.59 | 0.73 | — |
| 30,065 | 3.07 | 2.37 | 1.82 | 1.04 | 0.43 | — |
| 59,949 | 2.41 | 1.60 | 1.19 | 0.84 | 0.31 | — |
| 61,016 | 0.20 | 0.13 | — | — | — | — |
| 4) When the Mw of the organopolysiloxane (A) is 139,987 | | | | | | |
| 900 | 4.04 | 3.18 | 2.66 | 2.05 | 1.07 | — |
| 1,025 | 3.97 | 3.10 | 2.55 | 1.95 | 0.98 | — |
| 3,029 | 3.79 | 2.90 | 2.29 | 1.67 | 0.81 | — |
| 30,065 | 2.79 | 2.03 | 1.59 | 1.15 | 0.63 | — |
| 59,949 | 2.35 | 1.60 | 1.15 | 0.77 | 0.35 | — |
| 61,016 | 0.28 | 0.21 | 0.17 | 0.14 | — | — |
| 5) When the Mw of the organopolysiloxane (A) is 141,067 | | | | | | |
| 900 | 4.33 | 3.46 | 2.94 | 2.32 | 1.36 | 0.10 |
| 1,025 | 4.25 | 3.36 | 2.83 | 2.24 | 1.25 | 0.10 |
| 3,029 | 4.07 | 3.19 | 2.57 | 1.95 | 1.08 | — |
| 30,065 | 3.07 | 2.31 | 1.87 | 1.43 | 0.92 | — |
| 59,949 | 2.62 | 1.88 | 1.43 | 1.04 | 0.55 | — |
| 61,016 | 0.51 | 0.44 | 0.40 | 0.37 | — | — |

*) Adhesive strengths are represented in MPa units.
*) — means that an adhesive strength is equal to or lower than a measurement limit.

TABLE 17

<Organopolysiloxane (A): T/D = 0.4, Organopolysiloxane (B): T/D = 0.2>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,055 | | | | | | |
| 921 | 1.14 | 0.13 | — | — | — | — |
| 1,023 | 1.06 | — | — | — | — | — |
| 3,024 | 0.87 | — | — | — | — | — |
| 30,053 | 0.16 | — | — | — | — | — |
| 59,921 | — | — | — | — | — | — |
| 61,057 | — | — | — | — | — | — |
| 2) When the Mw of the organopolysiloxane (A) is 37,001 | | | | | | |
| 921 | 4.30 | 3.35 | 2.78 | 2.11 | 1.04 | — |
| 1,023 | 4.22 | 3.26 | 2.66 | 2.00 | 0.93 | — |
| 3,024 | 4.03 | 3.05 | 2.37 | 1.69 | 0.75 | — |
| 30,053 | 3.32 | 2.55 | 1.95 | 1.08 | 0.42 | — |
| 59,921 | 2.59 | 1.70 | 1.25 | 0.87 | 0.28 | — |
| 61,057 | 0.16 | — | — | — | — | — |
| 3) When the Mw of the organopolysiloxane (A) is 100,023 | | | | | | |
| 921 | 4.36 | 3.41 | 2.84 | 2.17 | 1.09 | — |
| 1,023 | 4.28 | 3.32 | 2.72 | 2.06 | 0.99 | — |
| 3,024 | 4.08 | 3.11 | 2.43 | 1.75 | 0.80 | — |
| 30,053 | 3.38 | 2.60 | 2.00 | 1.14 | 0.47 | — |
| 59,921 | 2.65 | 1.76 | 1.31 | 0.93 | 0.34 | — |
| 61,057 | 0.22 | 0.15 | 0.10 | — | — | — |
| 4) When the Mw of the organopolysiloxane (A) is 139,987 | | | | | | |
| 921 | 4.44 | 3.49 | 2.92 | 2.26 | 1.18 | — |
| 1,023 | 4.37 | 3.41 | 2.81 | 2.15 | 1.07 | — |
| 3,024 | 4.17 | 3.19 | 2.52 | 1.84 | 0.89 | — |
| 30,053 | 3.07 | 2.24 | 1.75 | 1.27 | 0.70 | — |
| 59,921 | 2.58 | 1.76 | 1.27 | 0.84 | 0.39 | — |
| 61,057 | 0.31 | 0.23 | 0.18 | 0.15 | — | — |
| 5) When the Mw of the organopolysiloxane (A) is 141,067 | | | | | | |
| 921 | 4.76 | 3.80 | 3.23 | 2.56 | 1.49 | 0.11 |
| 1,023 | 4.68 | 3.70 | 3.12 | 2.46 | 1.37 | 0.11 |
| 3,024 | 4.48 | 3.50 | 2.83 | 2.15 | 1.19 | — |
| 30,053 | 3.38 | 2.55 | 2.06 | 1.58 | 1.01 | — |
| 59,921 | 2.88 | 2.07 | 1.57 | 1.14 | 0.60 | — |
| 61,057 | 0.56 | 0.48 | 0.44 | 0.41 | — | — |

*) Adhesive strengths are represented in MPa units.
*) — means that an adhesive strength is equal to or lower than a measurement limit.

Tables 18 to 20 show the results of the measurement of adhesive strengths in the cured products of organopolysiloxane compositions using the organopolysiloxanes (A) each having a ratio T/D of 0.8. To be specific, Table 18 shows the results of the measurement of adhesive strengths in the cured products of organopolysiloxane compositions containing the organopolysiloxanes (A) each having a ratio T/D of 0.8 and having various Mw's and the organopolysiloxanes (B) each having a ratio T/D of 0.1 and having various Mw's at various blending ratios. In addition, Tables 19 and 20 show the results of the measurement of adhesive strengths in the cured products of organopolysiloxane compositions in each of which the ratio T/D of the organopolysiloxane (B) was changed to 0.15 or 0.2.

Here, the cured products of the organopolysiloxane compositions obtained in the tests of Table 18 were each organopolysiloxane copolymers having a structure represented by the above formula (I). In the formula (I), $R^1$, $R^2$, $R^{12}$, and $R^{13}$ each represented a methyl group, $R^3$, $R^5$ to $R^9$, $R^{11}$, and $R^{14}$ each represented hydrogen, $R^4$ and $R^{10}$ each represented a phenyl group, and $R^{15}$ represented an ethylene group. In addition, when the organopolysiloxane (A) having an Mw of 36,007 was used, a represented 200, b represented 145, and c represented 15. When the organopolysiloxane (A) having an Mw of 37,049 was used, a represented 205, b represented 151, and c represented 13. When the organopolysiloxane (A) having an Mw of 100,007 was used, a represented 550, b represented 416, and c represented 24. When the organopolysiloxane (A) having an Mw of 139,953 was used, a represented 765, b represented 593, and c represented 19. When the organopolysiloxane (A) having an Mw of 141,055 was used, a represented 770, b represented 600, and c represented 16. In addition, when the organopolysiloxane (B) having an Mw of 907 was used, x represented 1, y represented 0.1, and z represented 11. When the organopolysiloxane (B) having an Mw of 1,025 was used, x represented 0.5, y represented 0.7, and z represented 12. When the organopolysiloxane (B) having an Mw of 3,026 was used, x represented 0.8, y represented 2.7, and z represented 35. When the organopolysiloxane (B) having an Mw of 30,112 was used, x represented 3, y represented 31.5, and z represented 345. When the organopolysiloxane (B) having an Mw of 59,983 was used, x represented 10, y represented 59, and z represented 690. When the organopolysiloxane (B) having an Mw of 61,041 was used, x represented 7, y represented 63, and z represented 700. In addition, m represents a molar ratio (B/A) of the organopolysiloxane (B) to the organopolysiloxane (A).

It should be noted that the cured products of the organopolysiloxane compositions obtained in the tests of Tables 19 and 20 were all organopolysiloxane copolymers having the same structure as those of the tests of Tables 6 and 7.

TABLE 18

<Organopolysiloxane (A): T/D = 0.8, Organopolysiloxane (B): T/D = 0.1>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,007 | | | | | | |
| 907 | 0.94 | 0.16 | — | — | — | — |
| 1,025 | 0.88 | — | — | — | — | — |
| 3,026 | 0.72 | — | — | — | — | — |
| 30,112 | 0.14 | — | — | — | — | — |
| 59,983 | — | — | — | — | — | — |
| 61,041 | — | — | — | — | — | — |
| 2) When the Mw of the organopolysiloxane (A) is 37,049 | | | | | | |
| 907 | 4.26 | 3.32 | 2.76 | 2.09 | 1.03 | — |
| 1,025 | 4.19 | 3.24 | 2.64 | 1.99 | 0.92 | — |
| 3,026 | 3.99 | 3.02 | 2.35 | 1.68 | 0.74 | — |
| 30,112 | 3.29 | 2.52 | 1.93 | 1.08 | 0.41 | — |
| 59,983 | 2.57 | 1.69 | 1.24 | 0.86 | 0.28 | — |
| 61,041 | 0.16 | — | — | — | — | — |
| 3) When the Mw of the organopolysiloxane (A) is 100,007 | | | | | | |
| 907 | 4.32 | 3.38 | 2.81 | 2.15 | 1.08 | — |
| 1,025 | 4.24 | 3.29 | 2.70 | 2.04 | 0.98 | — |
| 3,026 | 4.05 | 3.08 | 2.41 | 1.74 | 0.80 | — |
| 30,112 | 3.35 | 2.58 | 1.99 | 1.13 | 0.47 | — |
| 59,983 | 2.63 | 1.75 | 1.30 | 0.92 | 0.34 | — |
| 61,041 | 0.22 | 0.14 | 0.10 | — | — | — |
| 4) When the Mw of the organopolysiloxane (A) is 139,953 | | | | | | |
| 907 | 4.41 | 3.47 | 2.90 | 2.24 | 1.17 | — |
| 1,025 | 4.33 | 3.38 | 2.78 | 2.13 | 1.07 | — |
| 3,026 | 4.14 | 3.17 | 2.50 | 1.82 | 0.88 | — |
| 30,112 | 3.04 | 2.22 | 1.74 | 1.26 | 0.69 | — |
| 59,983 | 2.56 | 1.75 | 1.26 | 0.84 | 0.38 | — |
| 61,041 | 0.31 | 0.23 | 0.18 | 0.15 | — | — |
| 5) When the Mw of the organopolysiloxane (A) is 141,055 | | | | | | |
| 907 | 4.72 | 3.77 | 3.21 | 2.53 | 1.48 | 0.11 |
| 1,025 | 4.64 | 3.67 | 3.09 | 2.44 | 1.36 | 0.10 |
| 3,026 | 4.44 | 3.48 | 2.80 | 2.13 | 1.18 | — |
| 30,112 | 3.35 | 2.52 | 2.04 | 1.56 | 1.00 | — |
| 59,983 | 2.86 | 2.05 | 1.56 | 1.13 | 0.60 | — |
| 61,041 | 0.56 | 0.48 | 0.43 | 0.40 | — | — |

*) Adhesive strengths are represented in MPa units.
*) — means that an adhesive strength is equal to or lower than a measurement limit.

TABLE 19

<Organopolysiloxane (A): T/D = 0.8, Organopolysiloxane (B): T/D = 0.15>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,007 | | | | | | |
| 900 | 1.18 | 0.20 | — | — | — | — |
| 1,025 | 1.10 | 0.11 | — | — | — | — |
| 3,029 | 0.90 | — | — | — | — | — |
| 30,065 | 0.17 | — | — | — | — | — |
| 59,949 | — | — | — | — | — | — |
| 61,016 | — | — | — | — | — | — |
| 2) When the Mw of the organopolysiloxane (A) is 37,049 | | | | | | |
| 900 | 4.44 | 3.46 | 2.87 | 2.18 | 1.07 | — |
| 1,025 | 4.36 | 3.37 | 2.75 | 2.07 | 0.96 | — |
| 3,029 | 4.16 | 3.15 | 2.45 | 1.75 | 0.77 | — |
| 30,065 | 3.43 | 2.63 | 2.01 | 1.12 | 0.43 | — |
| 59,949 | 2.68 | 1.76 | 1.29 | 0.90 | 0.29 | — |
| 61,016 | 0.17 | — | — | — | — | — |
| 3) When the Mw of the organopolysiloxane (A) is 100,007 | | | | | | |
| 900 | 4.50 | 3.52 | 2.93 | 2.24 | 1.13 | — |
| 1,025 | 4.42 | 3.43 | 2.81 | 2.13 | 1.02 | — |
| 3,029 | 4.22 | 3.21 | 2.51 | 1.81 | 0.83 | — |
| 30,065 | 3.49 | 2.69 | 2.07 | 1.18 | 0.49 | — |
| 59,949 | 2.74 | 1.82 | 1.35 | 0.96 | 0.35 | — |
| 61,016 | 0.23 | 0.15 | 0.10 | — | — | — |
| 4) When the Mw of the organopolysiloxane (A) is 139,953 | | | | | | |
| 900 | 4.59 | 3.61 | 3.02 | 2.33 | 1.22 | — |
| 1,025 | 4.51 | 3.52 | 2.90 | 2.22 | 1.11 | — |
| 3,029 | 4.31 | 3.30 | 2.60 | 1.90 | 0.92 | — |
| 30,065 | 3.17 | 2.31 | 1.81 | 1.31 | 0.72 | — |
| 59,949 | 2.67 | 1.82 | 1.31 | 0.87 | 0.40 | — |
| 61,016 | 0.32 | 0.24 | 0.19 | 0.16 | — | — |
| 5) When the Mw of the organopolysiloxane (A) is 141,055 | | | | | | |
| 900 | 4.92 | 3.93 | 3.34 | 2.64 | 1.54 | 0.12 |
| 1,025 | 4.83 | 3.82 | 3.22 | 2.54 | 1.42 | 0.11 |
| 3,029 | 4.63 | 3.62 | 2.92 | 2.22 | 1.23 | — |
| 30,065 | 3.49 | 2.63 | 2.13 | 1.63 | 1.04 | — |
| 59,949 | 2.98 | 2.14 | 1.62 | 1.18 | 0.62 | — |
| 61,016 | 0.58 | 0.50 | 0.45 | 0.42 | — | — |

*) Adhesive strengths are represented in MPa units.
*) — means that an adhesive strength is equal to or lower than a measurement limit.

TABLE 20

<Organopolysiloxane (A): T/D = 0.8, Organopolysiloxane (B): T/D = 0.2>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,007 | | | | | | |
| 921 | 1.30 | 0.22 | — | — | — | — |
| 1,023 | 1.21 | 0.12 | — | — | — | — |
| 3,024 | 0.99 | — | — | — | — | — |
| 30,053 | 0.19 | — | — | — | — | — |
| 59,921 | — | — | — | — | — | — |
| 61,057 | — | — | — | — | — | — |
| 2) When the Mw of the organopolysiloxane (A) is 37,049 | | | | | | |
| 921 | 4.88 | 3.81 | 3.16 | 2.40 | 1.18 | — |
| 1,023 | 4.80 | 3.71 | 3.03 | 2.28 | 1.06 | — |
| 3,024 | 4.58 | 3.47 | 2.70 | 1.93 | 0.85 | — |
| 30,053 | 3.77 | 2.89 | 2.21 | 1.23 | 0.47 | — |
| 59,921 | 2.95 | 1.94 | 1.42 | 0.99 | 0.32 | — |
| 61,057 | 0.19 | 0.10 | — | — | — | — |
| 3) When the Mw of the organopolysiloxane (A) is 100,007 | | | | | | |
| 921 | 4.95 | 3.87 | 3.22 | 2.46 | 1.24 | — |
| 1,023 | 4.86 | 3.77 | 3.09 | 2.34 | 1.12 | — |
| 3,024 | 4.64 | 3.53 | 2.76 | 1.99 | 0.91 | — |
| 30,053 | 3.84 | 2.96 | 2.28 | 1.30 | 0.54 | — |
| 59,921 | 3.01 | 2.00 | 1.49 | 1.06 | 0.39 | — |
| 61,057 | 0.25 | 0.17 | 0.11 | — | — | — |

TABLE 20-continued

<Organopolysiloxane (A): T/D = 0.8, Organopolysiloxane (B): T/D = 0.2>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 4) When the Mw of the organopolysiloxane (A) is 139,953 | | | | | | |
| 921 | 5.05 | 3.97 | 3.32 | 2.56 | 1.34 | 0.10 |
| 1,023 | 4.96 | 3.87 | 3.19 | 2.44 | 1.22 | — |
| 3,024 | 4.74 | 3.63 | 2.86 | 2.09 | 1.01 | — |
| 30,053 | 3.49 | 2.54 | 1.99 | 1.44 | 0.79 | — |
| 59,921 | 2.94 | 2.00 | 1.44 | 0.96 | 0.44 | — |
| 61,057 | 0.35 | 0.26 | 0.21 | 0.18 | — | — |
| 5) When the Mw of the organopolysiloxane (A) is 141,055 | | | | | | |
| 921 | 5.41 | 4.32 | 3.67 | 2.90 | 1.69 | 0.13 |
| 1,023 | 5.31 | 4.20 | 3.54 | 2.79 | 1.56 | 0.12 |
| 3,024 | 5.09 | 3.98 | 3.21 | 2.44 | 1.35 | 0.10 |
| 30,053 | 3.84 | 2.89 | 2.34 | 1.79 | 1.14 | — |
| 59,921 | 3.28 | 2.35 | 1.78 | 1.30 | 0.68 | — |
| 61,057 | 0.64 | 0.55 | 0.50 | 0.46 | — | — |

*) Adhesive strengths are represented in MPa units.
*) — means that an adhesive strength is equal to or lower than a measurement limit.

Tables 21 to 23 show the results of the measurement of adhesive strengths in the cured products of organopolysiloxane compositions using the organopolysiloxanes (A) each having a ratio T/D of 0.9. To be specific, Table 21 shows the results of the measurement of adhesive strengths in the cured products of organopolysiloxane compositions containing the organopolysiloxanes (A) each having a ratio T/D of 0.9 and having various Mw's and the organopolysiloxanes (B) each having a ratio T/D of 0.1 and having various Mw's at various blending ratios. In addition, Tables 22 and 23 show the results of the measurement of adhesive strengths in the cured products of organopolysiloxane compositions in each of which the ratio T/D of the organopolysiloxane (B) was changed to 0.15 or 0.2.

Here, the cured products of the organopolysiloxane compositions obtained in the tests of Tables 21 and 23 were each organopolysiloxane copolymers having a structure represented by the above formula (I). In the formula (I), $R^1$, $R^2$, $R^{12}$, and $R^{13}$ each represented a methyl group, $R^3$, $R^5$ to $R^9$, $R^{11}$, and $R^{14}$ each represented hydrogen, $R^4$ and $R^{10}$ each represented a phenyl group, and $R^{15}$ represented an ethylene group. In addition, when the organopolysiloxane (A) having an Mw of 36,005 was used, a represented 190, b represented 143, and c represented 28. When the organopolysiloxane (A) having an Mw of 37,025 was used, a represented 190, b represented 160, and c represented 11. When the organopolysiloxane (A) having an Mw of 100,029 was used, a represented 510, b represented 441, and c represented 18. When the organopolysiloxane (A) having an Mw of 139,969 was used, a represented 710, b represented 626, and c represented 13. When the organopolysiloxane (A) having an Mw of 141,051 was used, a represented 720, b represented 620, and c represented 28. In addition, when the organopolysiloxane (B) having an Mw of 907 was used, x represented 1, y represented 0.1, and z represented 11. When the organopolysiloxane (B) having an Mw of 1,025 was used, x represented 0.5, y represented 0.7, and z represented 12. When the organopolysiloxane (B) having an Mw of 3,026 was used, x represented 0.8, y represented 2.7, and z represented 35. When the organopolysiloxane (B) having an Mw of 30,112 was used, x represented 3, y represented 31.5, and z represented 345. When the organopolysiloxane (B) having an Mw of 59,983 was used, x represented 10, y represented 59, and z represented 690. When the organopolysiloxane (B) having an Mw of 61,041 was used, x represented 7, y represented 63, and z represented 700. In addition, when the organopolysiloxane (B) having an Mw of 921 was used, x represented 1.6, y represented 0.4, and z represented 10. When the organopolysiloxane (B) having an Mw of 1,023 was used, x represented 1.6, y represented 0.6, and z represented 11. When the organopolysiloxane (B) having an Mw of 3,024 was used, x represented 3.8, y represented 2.6, and z represented 32. When the organopolysiloxane (B) having an Mw of 30,053 was used, x represented 41, y represented 23, and z represented 320. When the organopolysiloxane (B) having an Mw of 59,921 was used, x represented 102, y represented 28, and z represented 650. When the organopolysiloxane (B) having an Mw of 61,057 was used, x represented 100, y represented 32, and z represented 660. In addition, m represents a molar ratio (B/A) of the organopolysiloxane (B) to the organopolysiloxane (A).

It should be noted that the cured products of the organopolysiloxane compositions obtained in the tests of Table 22 were all organopolysiloxane copolymers having the same structure as those of the tests of Table 8.

TABLE 21

<Organopolysiloxane (A): T/D = 0.9, Organopolysiloxane (B): T/D = 0.1>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,005 | | | | | | |
| 907 | 1.42 | 0.24 | — | — | — | — |
| 1,025 | 1.32 | 0.13 | — | — | — | — |
| 3,026 | 1.08 | — | — | — | — | — |
| 30,112 | 0.20 | — | — | — | — | — |
| 59,983 | — | — | — | — | — | — |
| 61,041 | — | — | — | — | — | — |
| 2) When the Mw of the organopolysiloxane (A) is 37,025 | | | | | | |
| 907 | 6.39 | 4.98 | 4.13 | 3.14 | 1.54 | 0.11 |
| 1,025 | 6.28 | 4.85 | 3.96 | 2.98 | 1.38 | 0.10 |
| 3,026 | 5.99 | 4.54 | 3.53 | 2.52 | 1.11 | — |
| 30,112 | 4.94 | 3.79 | 2.89 | 1.61 | 0.62 | — |
| 59,983 | 3.86 | 2.53 | 1.86 | 1.30 | 0.42 | — |
| 61,041 | 0.24 | 0.13 | — | — | — | — |
| 3) When the Mw of the organopolysiloxane (A) is 100,029 | | | | | | |
| 907 | 6.48 | 5.07 | 4.22 | 3.23 | 1.63 | 0.12 |
| 1,025 | 6.36 | 4.94 | 4.05 | 3.07 | 1.47 | 0.11 |
| 3,026 | 6.08 | 4.62 | 3.61 | 2.61 | 1.20 | — |
| 30,112 | 5.03 | 3.87 | 2.98 | 1.70 | 0.71 | — |
| 59,983 | 3.95 | 2.62 | 1.94 | 1.38 | 0.50 | — |
| 61,041 | 0.33 | 0.22 | 0.14 | 0.10 | — | — |
| 4) When the Mw of the organopolysiloxane (A) is 139,969 | | | | | | |
| 907 | 6.61 | 5.20 | 4.35 | 3.36 | 1.76 | 0.14 |
| 1,025 | 6.49 | 5.07 | 4.18 | 3.20 | 1.60 | 0.12 |
| 3,026 | 6.21 | 4.75 | 3.74 | 2.74 | 1.32 | 0.10 |
| 30,112 | 4.56 | 3.33 | 2.61 | 1.89 | 1.04 | — |
| 59,983 | 3.84 | 2.62 | 1.89 | 1.25 | 0.58 | — |
| 61,041 | 0.46 | 0.35 | 0.27 | 0.23 | — | — |
| 5) When the Mw of the organopolysiloxane (A) is 141,051 | | | | | | |
| 907 | 7.08 | 5.66 | 4.81 | 3.80 | 2.22 | 0.17 |
| 1,025 | 6.96 | 5.50 | 4.64 | 3.66 | 2.04 | 0.16 |
| 3,026 | 6.67 | 5.21 | 4.20 | 3.20 | 1.77 | 0.14 |
| 30,112 | 5.03 | 3.79 | 3.07 | 2.35 | 1.50 | 0.12 |
| 59,983 | 4.29 | 3.08 | 2.33 | 1.70 | 0.89 | — |
| 61,041 | 0.84 | 0.72 | 0.65 | 0.60 | — | — |

*) Adhesive strengths are represented in MPa units.
*) — means that an adhesive strength is equal to or lower than a measurement limit.

TABLE 22

<Organopolysiloxane (A): T/D = 0.9, Organopolysiloxane (B): T/D = 0.15>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,005 | | | | | | |
| 900 | 1.77 | 0.30 | — | — | — | — |
| 1,025 | 1.65 | 0.17 | — | — | — | — |
| 3,029 | 1.35 | — | — | — | — | — |
| 30,065 | 0.26 | — | — | — | — | — |
| 59,949 | — | — | — | — | — | — |
| 61,016 | — | — | — | — | — | — |
| 2) When the Mw of the organopolysiloxane (A) is 37,025 | | | | | | |
| 900 | 6.66 | 5.19 | 4.31 | 3.27 | 1.61 | 0.12 |
| 1,025 | 6.54 | 5.06 | 4.13 | 3.11 | 1.44 | 0.11 |
| 3,029 | 6.24 | 4.73 | 3.68 | 2.63 | 1.16 | — |
| 30,065 | 5.15 | 3.95 | 3.02 | 1.68 | 0.65 | — |
| 59,949 | 4.02 | 2.64 | 1.94 | 1.35 | 0.44 | — |
| 61,016 | 0.26 | 0.14 | — | — | — | — |
| 3) When the Mw of the organopolysiloxane (A) is 100,029 | | | | | | |
| 900 | 6.75 | 5.28 | 4.40 | 3.36 | 1.70 | 0.13 |
| 1,025 | 6.63 | 5.15 | 4.22 | 3.20 | 1.53 | 0.12 |
| 3,029 | 6.33 | 4.82 | 3.77 | 2.72 | 1.25 | — |
| 30,065 | 5.24 | 4.04 | 3.11 | 1.77 | 0.74 | — |
| 59,949 | 4.11 | 2.73 | 2.03 | 1.44 | 0.53 | — |
| 61,016 | 0.35 | 0.23 | 0.15 | 0.11 | — | — |
| 4) When the Mw of the organopolysiloxane (A) is 139,969 | | | | | | |
| 900 | 6.89 | 5.42 | 4.53 | 3.50 | 1.83 | 0.14 |
| 1,025 | 6.77 | 5.28 | 4.35 | 3.33 | 1.67 | 0.13 |
| 3,029 | 6.47 | 4.95 | 3.90 | 2.85 | 1.38 | 0.11 |
| 30,065 | 4.76 | 3.47 | 2.72 | 1.97 | 1.08 | — |
| 59,949 | 4.01 | 2.73 | 1.97 | 1.31 | 0.60 | — |
| 61,016 | 0.48 | 0.36 | 0.29 | 0.24 | — | — |
| 5) When the Mw of the organopolysiloxane (A) is 141,051 | | | | | | |
| 900 | 7.38 | 5.90 | 5.01 | 3.96 | 2.31 | 0.18 |
| 1,025 | 7.25 | 5.73 | 4.83 | 3.81 | 2.13 | 0.16 |
| 3,029 | 6.95 | 5.43 | 4.38 | 3.33 | 1.85 | 0.14 |
| 30,065 | 5.24 | 3.95 | 3.20 | 2.45 | 1.56 | 0.12 |
| 59,949 | 4.47 | 3.21 | 2.43 | 1.77 | 0.93 | — |
| 61,016 | 0.87 | 0.75 | 0.68 | 0.63 | — | — |

*) Adhesive strengths are represented in MPa units.
*) — means that an adhesive strength is equal to or lower than a measurement limit.

TABLE 23

<Organopolysiloxane (A): T/D = 0.9, Organopolysiloxane (B): T/D = 0.2>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,005 | | | | | | |
| 921 | 1.95 | 0.33 | — | — | — | — |
| 1,023 | 1.82 | 0.18 | — | — | — | — |
| 3,024 | 1.49 | — | — | — | — | — |
| 30,053 | 0.28 | — | — | — | — | — |
| 59,921 | — | — | — | — | — | — |
| 61,057 | — | — | — | — | — | — |
| 2) When the Mw of the organopolysiloxane (A) is 37,025 | | | | | | |
| 921 | 7.33 | 5.71 | 4.74 | 3.60 | 1.77 | 0.13 |
| 1,023 | 7.19 | 5.56 | 4.54 | 3.42 | 1.58 | 0.12 |
| 3,024 | 6.86 | 5.20 | 4.04 | 2.89 | 1.27 | 0.09 |
| 30,053 | 5.66 | 4.34 | 3.32 | 1.85 | 0.71 | 0.15 |
| 59,921 | 4.42 | 2.90 | 2.13 | 1.49 | 0.48 | — |
| 61,057 | 0.28 | 0.15 | — | — | — | — |
| 3) When the Mw of the organopolysiloxane (A) is 100,029 | | | | | | |
| 921 | 7.43 | 5.81 | 4.83 | 3.70 | 1.86 | 0.14 |
| 1,023 | 7.29 | 5.66 | 4.64 | 3.51 | 1.68 | 0.13 |
| 3,024 | 6.96 | 5.30 | 4.14 | 2.99 | 1.37 | 0.10 |
| 30,053 | 5.76 | 4.44 | 3.42 | 1.95 | 0.81 | — |
| 59,921 | 4.52 | 3.00 | 2.23 | 1.58 | 0.58 | — |
| 61,057 | 0.38 | 0.25 | 0.27 | 0.12 | — | — |
| 4) When the Mw of the organopolysiloxane (A) is 139,969 | | | | | | |
| 921 | 7.57 | 5.96 | 4.98 | 3.84 | 2.01 | 0.15 |
| 1,023 | 7.44 | 5.81 | 4.79 | 3.66 | 1.83 | 0.14 |
| 3,024 | 7.11 | 5.45 | 4.29 | 3.14 | 1.52 | 0.12 |
| 30,053 | 5.23 | 3.81 | 2.99 | 2.16 | 1.19 | — |
| 59,921 | 4.41 | 3.00 | 2.16 | 1.44 | 0.66 | — |
| 61,057 | 0.53 | 0.40 | 0.31 | 0.26 | — | — |
| 5) When the Mw of the organopolysiloxane (A) is 141,051 | | | | | | |
| 921 | 8.12 | 6.48 | 5.51 | 4.36 | 2.54 | 0.20 |
| 1,023 | 7.97 | 6.30 | 5.31 | 4.19 | 2.34 | 0.18 |
| 3,024 | 7.64 | 5.97 | 4.82 | 3.66 | 2.03 | 0.16 |
| 30,053 | 5.76 | 4.34 | 3.51 | 2.69 | 1.72 | 0.13 |
| 59,921 | 4.92 | 3.53 | 2.67 | 1.95 | 1.02 | — |
| 61,057 | 0.96 | 0.83 | 0.74 | 0.69 | — | — |

*) Adhesive strengths are represented in MPa units.
*) — means that an adhesive strength is equal to or lower than a measurement limit.

As shown in the results of Tables 9 to 23, the adhesive strength of a cured product is found to be largely affected by the ratio T/D and Mw of each of the organopolysiloxane (A) and the organopolysiloxane (B), and the molar ratio of the organopolysiloxane (B) to the organopolysiloxane (A). In particular, the adhesive strength of the cured product increases as the ratio T/D of the organopolysiloxane (A) increases. When the ratio T/D of the organopolysiloxane (A) was less than 0.3, the adhesive strength was as low as less than 0.2 MPa. Therefore, a reduction in dielectric breakdown voltage when the ratio T/D of the organopolysiloxane (A) was less than 0.3 possibly resulted from the fact that the adhesive strength of the cured product was so low that the cured product peeled.

(Stickiness Test)

The cured products of the organopolysiloxane compositions synthesized in the above were each formed into a test piece measuring 10 mm wide by 50 mm long by 1 mm thick. The tan δ of the test piece was calculated by measuring the storage modulus and loss modulus of the test piece at −50° C. to 200° C., and then the area S of the tan δ at −50° C. to 200° C. was determined. Tables 24 to 38 show the results.

Tables 24 to 26 show the results of the calculation of the area S of a tan δ in each of the cured products of organopolysiloxane compositions using the organopolysiloxanes (A) each having a ratio T/D of 0.2. To be specific, Table 24 shows the results of the calculation of the area S of a tan δ in each of the cured products of organopolysiloxane compositions containing the organopolysiloxanes (A) each having a ratio T/D of 0.2 and having various Mw's and the organopolysiloxanes (B) each having a ratio T/D of 0.1 and having various Mw's at various blending ratios. In addition, Tables 25 and 26 show the results of the calculation of the area S of a tan δ in each of the cured products of organopolysiloxane compositions in each of which the ratio T/D of the organopolysiloxane (B) was changed to 0.15 or 0.2.

Here, the cured products of the organopolysiloxane compositions obtained in the tests of Tables 24 to 26 were all organopolysiloxane copolymers having the same structure as those of the tests of Tables 9 to 11.

TABLE 24

<Organopolysiloxane (A): T/D = 0.2, Organopolysiloxane (B): T/D = 0.1>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,003 | | | | | | |
| 907 | 4.98 | 6.25 | 10.25 | 13.46 | 20.16 | 22.73 |
| 1,025 | 10.08 | 35.43 | 43.81 | 57.85 | 81.51 | 86.26 |
| 3,026 | 10.88 | 36.51 | 44.96 | 59.11 | 82.80 | 87.33 |
| 30,112 | 14.76 | 48.87 | 57.18 | 72.03 | 92.32 | 96.04 |
| 59,983 | 17.94 | 52.63 | 61.52 | 74.56 | 93.98 | 98.58 |
| 61,041 | 18.29 | 53.43 | 62.42 | 75.47 | 94.43 | 99.22 |
| 2) When the Mw of the organopolysiloxane (A) is 37,019 | | | | | | |
| 907 | 4.91 | 6.15 | 10.10 | 13.26 | 19.85 | 22.38 |
| 1,025 | 9.93 | 34.89 | 43.15 | 56.97 | 80.27 | 84.96 |
| 3,026 | 10.71 | 35.96 | 44.28 | 58.22 | 81.54 | 86.01 |
| 30,112 | 14.53 | 48.13 | 56.31 | 70.94 | 90.92 | 94.58 |
| 59,983 | 17.66 | 51.83 | 60.59 | 73.43 | 92.56 | 97.09 |
| 61,041 | 18.01 | 52.62 | 61.47 | 74.32 | 93.00 | 97.71 |
| 3) When the Mw of the organopolysiloxane (A) is 100,007 | | | | | | |
| 907 | 4.08 | 5.11 | 8.39 | 11.02 | 16.49 | 18.60 |
| 1,025 | 8.25 | 28.98 | 35.85 | 47.33 | 66.69 | 70.58 |
| 3,026 | 8.90 | 29.87 | 36.79 | 48.36 | 67.74 | 71.46 |
| 30,112 | 12.07 | 39.99 | 46.78 | 58.94 | 75.53 | 78.58 |
| 59,983 | 14.48 | 43.06 | 50.34 | 61.00 | 76.89 | 80.66 |
| 61,041 | 14.96 | 43.71 | 51.07 | 61.75 | 77.26 | 81.18 |
| 4) When the Mw of the organopolysiloxane (A) is 139,927 | | | | | | |
| 907 | 3.66 | 4.59 | 7.54 | 9.89 | 14.81 | 16.70 |
| 1,025 | 7.41 | 26.03 | 32.19 | 42.51 | 59.89 | 63.39 |
| 3,026 | 7.99 | 26.83 | 33.04 | 43.44 | 60.84 | 64.18 |
| 30,112 | 10.84 | 35.92 | 42.02 | 52.93 | 67.84 | 70.57 |
| 59,983 | 13.18 | 38.67 | 45.21 | 54.79 | 69.06 | 72.44 |
| 61,041 | 13.44 | 39.26 | 45.87 | 55.46 | 69.39 | 72.91 |
| 5) When the Mw of the organopolysiloxane (A) is 141,047 | | | | | | |
| 907 | 1.01 | 1.26 | 2.08 | 2.73 | 4.08 | 4.60 |
| 1,025 | 2.04 | 7.17 | 8.87 | 11.71 | 16.50 | 17.47 |
| 3,026 | 2.20 | 7.39 | 9.10 | 11.97 | 16.77 | 17.68 |
| 30,112 | 2.99 | 9.90 | 11.58 | 14.59 | 18.69 | 19.45 |
| 59,983 | 3.63 | 10.66 | 12.46 | 15.10 | 19.03 | 19.96 |
| 61,041 | 3.70 | 10.82 | 12.64 | 15.28 | 19.12 | 20.09 |

TABLE 25

<Organopolysiloxane (A): T/D = 0.2, Organopolysiloxane (B): T/D = 0.15>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,003 | | | | | | |
| 900 | 4.53 | 5.68 | 9.32 | 12.24 | 18.32 | 20.66 |
| 1,025 | 9.16 | 32.21 | 39.83 | 52.59 | 74.10 | 78.42 |
| 3,029 | 9.89 | 33.19 | 40.87 | 53.74 | 75.27 | 79.40 |
| 30,065 | 13.42 | 44.43 | 51.98 | 65.49 | 83.93 | 87.31 |
| 59,949 | 16.31 | 47.84 | 55.93 | 67.78 | 85.44 | 89.62 |
| 61,016 | 16.63 | 48.57 | 56.74 | 68.61 | 85.84 | 90.20 |
| 2) When the Mw of the organopolysiloxane (A) is 37,019 | | | | | | |
| 900 | 4.46 | 5.59 | 9.18 | 12.05 | 18.05 | 20.35 |
| 1,025 | 9.02 | 31.72 | 39.22 | 51.79 | 72.97 | 77.23 |
| 3,029 | 9.74 | 32.69 | 40.25 | 52.92 | 74.13 | 78.19 |
| 30,065 | 13.21 | 43.76 | 51.19 | 64.49 | 82.65 | 85.99 |
| 59,949 | 16.06 | 47.12 | 55.08 | 66.75 | 84.14 | 88.26 |
| 61,016 | 16.37 | 47.83 | 55.88 | 67.57 | 84.54 | 88.83 |
| 3) When the Mw of the organopolysiloxane (A) is 100,007 | | | | | | |
| 900 | 3.71 | 4.65 | 7.63 | 10.01 | 14.99 | 16.91 |
| 1,025 | 7.50 | 26.35 | 32.59 | 43.03 | 60.62 | 64.16 |
| 3,029 | 8.09 | 27.16 | 33.44 | 43.97 | 61.59 | 64.96 |
| 30,065 | 10.98 | 36.35 | 42.53 | 53.58 | 68.67 | 71.43 |
| 59,949 | 13.34 | 39.14 | 45.76 | 55.46 | 69.90 | 73.32 |
| 61,016 | 13.60 | 39.74 | 46.43 | 56.13 | 70.23 | 73.80 |
| 4) When the Mw of the organopolysiloxane (A) is 139,927 | | | | | | |
| 900 | 3.33 | 4.17 | 6.85 | 8.99 | 13.47 | 15.18 |
| 1,025 | 6.73 | 23.67 | 29.27 | 38.65 | 54.45 | 57.63 |
| 3,029 | 7.27 | 24.39 | 30.04 | 39.49 | 55.31 | 58.34 |
| 30,065 | 9.86 | 32.65 | 38.20 | 48.12 | 61.67 | 64.16 |
| 59,949 | 11.98 | 35.16 | 41.10 | 49.81 | 62.78 | 65.86 |
| 61,016 | 12.22 | 35.69 | 41.70 | 50.42 | 63.08 | 66.28 |
| 5) When the Mw of the organopolysiloxane (A) is 141,047 | | | | | | |
| 900 | 0.96 | 1.20 | 1.98 | 2.60 | 3.89 | 4.38 |
| 1,025 | 1.94 | 6.83 | 8.45 | 11.16 | 15.72 | 16.64 |
| 3,029 | 2.10 | 7.04 | 8.67 | 11.40 | 15.97 | 16.84 |
| 30,065 | 2.85 | 9.42 | 11.03 | 13.89 | 17.80 | 18.52 |
| 59,949 | 3.46 | 10.15 | 11.86 | 14.38 | 18.12 | 19.01 |
| 61,016 | 3.53 | 10.30 | 12.04 | 14.55 | 18.21 | 19.13 |

TABLE 26

<Organopolysiloxane (A): T/D = 0.2, Organopolysiloxane (B): T/D = 0.2>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,003 | | | | | | |
| 921 | 0.95 | 1.19 | 1.96 | 2.57 | 3.85 | 4.34 |
| 1,023 | 1.92 | 6.76 | 8.36 | 11.04 | 15.56 | 16.47 |
| 3,024 | 2.08 | 6.97 | 8.58 | 11.29 | 15.81 | 16.67 |
| 30,053 | 2.82 | 9.33 | 10.92 | 13.75 | 17.62 | 18.33 |
| 59,921 | 3.42 | 10.05 | 11.75 | 14.23 | 17.94 | 18.82 |
| 61,057 | 3.49 | 11.20 | 11.92 | 14.41 | 18.03 | 18.94 |
| 2) When the Mw of the organopolysiloxane (A) is 37,019 | | | | | | |
| 921 | 0.94 | 1.17 | 1.93 | 2.53 | 3.79 | 4.27 |
| 1,023 | 1.89 | 6.66 | 8.24 | 10.88 | 15.32 | 16.22 |
| 3,024 | 2.05 | 6.86 | 8.45 | 11.11 | 15.57 | 16.42 |
| 30,053 | 2.77 | 9.19 | 10.75 | 13.54 | 17.36 | 18.06 |
| 59,921 | 3.37 | 9.89 | 11.57 | 14.02 | 17.67 | 18.53 |
| 61,057 | 3.44 | 10.05 | 11.74 | 14.19 | 17.75 | 18.65 |
| 3) When the Mw of the organopolysiloxane (A) is 100,007 | | | | | | |
| 921 | 0.78 | 0.98 | 1.60 | 2.10 | 3.15 | 3.55 |
| 1,023 | 1.57 | 5.53 | 6.84 | 9.04 | 12.73 | 13.47 |
| 3,024 | 1.70 | 5.70 | 7.02 | 9.23 | 12.93 | 13.64 |
| 30,053 | 2.31 | 7.63 | 8.93 | 11.25 | 14.42 | 15.00 |
| 59,921 | 2.80 | 8.22 | 9.61 | 11.65 | 14.68 | 15.40 |
| 61,057 | 2.86 | 8.35 | 9.75 | 11.79 | 14.75 | 15.50 |
| 4) When the Mw of the organopolysiloxane (A) is 139,927 | | | | | | |
| 921 | 0.70 | 0.88 | 1.44 | 1.89 | 2.83 | 3.19 |
| 1,023 | 1.41 | 4.97 | 6.15 | 8.12 | 11.43 | 12.10 |
| 3,024 | 1.53 | 5.12 | 6.31 | 8.29 | 11.62 | 12.25 |
| 30,053 | 2.07 | 6.86 | 8.02 | 10.11 | 12.95 | 13.47 |

TABLE 26-continued

<Organopolysiloxane (A): T/D = 0.2,
Organopolysiloxane (B): T/D = 0.2>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 59,921 | 2.52 | 7.38 | 8.63 | 10.46 | 13.18 | 13.83 |
| 61,057 | 2.57 | 7.50 | 8.76 | 10.59 | 13.25 | 13.92 |
| 5) When the Mw of the organopolysiloxane (A) is 141,047 | | | | | | |
| 921 | 0.29 | 0.36 | 0.59 | 0.78 | 1.17 | 1.31 |
| 1,023 | 0.58 | 2.05 | 2.53 | 3.35 | 4.72 | 4.99 |
| 3,024 | 0.63 | 2.11 | 2.60 | 3.42 | 4.79 | 5.05 |
| 30,053 | 0.85 | 2.83 | 3.31 | 4.17 | 5.34 | 5.56 |
| 59,921 | 1.04 | 3.04 | 3.56 | 4.31 | 5.44 | 5.70 |
| 61,057 | 1.06 | 3.09 | 3.61 | 4.37 | 5.46 | 5.74 |

Tables 27 to 29 show the results of the calculation of the area S of a tan δ in each of the cured products of organopolysiloxane compositions using the organopolysiloxanes (A) each having a ratio T/D of 0.3. To be specific, Table 27 shows the results of the calculation of the area S of a tan δ in each of the cured products of organopolysiloxane compositions containing the organopolysiloxanes (A) each having a ratio T/D of 0.3 and having various Mw's and the organopolysiloxanes (B) each having a ratio T/D of 0.1 and having various Mw's at various blending ratios. In addition, Tables 28 and 29 show the results of the calculation of the area S of a tan δ in each of the cured products of organopolysiloxane compositions in each of which the ratio T/D of the organopolysiloxane (B) was changed to 0.15 or 0.2.

Here, the cured products of the organopolysiloxane compositions obtained in the tests of Tables 27 to 29 were all organopolysiloxane copolymers having the same structure as those of the tests of Tables 12 to 14.

TABLE 27

<Organopolysiloxane (A): T/D = 0.3,
Organopolysiloxane (B): T/D = 0.1>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,055 | | | | | | |
| 907 | 4.89 | 6.13 | 10.07 | 13.22 | 19.79 | 22.31 |
| 1,025 | 9.90 | 34.78 | 43.01 | 56.80 | 80.02 | 84.70 |
| 3,026 | 10.68 | 35.85 | 44.14 | 58.04 | 81.29 | 85.75 |
| 30,112 | 14.49 | 47.99 | 56.14 | 70.72 | 90.64 | 94.29 |
| 59,983 | 17.61 | 51.67 | 60.41 | 73.20 | 92.27 | 96.79 |
| 61,041 | 17.96 | 52.45 | 61.28 | 74.10 | 92.71 | 97.41 |
| 2) When the Mw of the organopolysiloxane (A) is 37,029 | | | | | | |
| 907 | 4.82 | 6.04 | 9.92 | 13.02 | 19.49 | 21.98 |
| 1,025 | 9.75 | 34.25 | 42.36 | 55.94 | 78.81 | 83.41 |
| 3,026 | 10.52 | 35.30 | 43.47 | 57.16 | 80.06 | 84.45 |
| 30,112 | 14.27 | 47.26 | 55.29 | 69.65 | 89.27 | 92.86 |
| 59,983 | 17.34 | 50.89 | 59.49 | 72.09 | 90.87 | 95.32 |
| 61,041 | 17.68 | 51.66 | 60.36 | 72.97 | 91.30 | 95.94 |
| 3) When the Mw of the organopolysiloxane (A) is 100,019 | | | | | | |
| 907 | 4.00 | 5.02 | 8.24 | 10.82 | 16.19 | 18.26 |
| 1,025 | 8.10 | 28.46 | 35.19 | 46.47 | 65.47 | 69.30 |
| 3,026 | 8.74 | 29.33 | 36.12 | 47.79 | 66.51 | 70.16 |
| 30,112 | 11.86 | 39.26 | 45.93 | 57.87 | 74.16 | 77.15 |
| 59,983 | 14.41 | 42.28 | 49.42 | 59.89 | 75.49 | 79.19 |
| 61,041 | 14.69 | 42.92 | 50.14 | 60.62 | 75.85 | 79.70 |

TABLE 27-continued

<Organopolysiloxane (A): T/D = 0.3,
Organopolysiloxane (B): T/D = 0.1>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 4) When the Mw of the organopolysiloxane (A) is 139,975 | | | | | | |
| 907 | 3.60 | 4.51 | 7.40 | 9.71 | 14.54 | 16.40 |
| 1,025 | 7.27 | 25.56 | 31.61 | 41.74 | 58.80 | 62.24 |
| 3,026 | 7.85 | 26.34 | 32.44 | 42.65 | 59.74 | 63.01 |
| 30,112 | 10.65 | 35.26 | 41.25 | 51.97 | 66.61 | 69.29 |
| 59,983 | 12.94 | 37.97 | 44.39 | 53.79 | 67.80 | 71.12 |
| 61,041 | 13.19 | 38.55 | 45.03 | 54.45 | 68.13 | 71.58 |
| 5) When the Mw of the organopolysiloxane (A) is 141,069 | | | | | | |
| 907 | 0.99 | 1.24 | 2.04 | 2.68 | 4.01 | 4.52 |
| 1,025 | 2.00 | 7.04 | 8.71 | 11.50 | 16.20 | 17.15 |
| 3,026 | 2.16 | 7.26 | 8.94 | 11.75 | 16.46 | 17.36 |
| 30,112 | 2.93 | 9.72 | 11.37 | 14.32 | 18.35 | 19.09 |
| 59,983 | 3.57 | 10.46 | 12.23 | 14.82 | 18.68 | 19.60 |
| 61,041 | 3.64 | 10.62 | 12.41 | 15.00 | 18.77 | 19.72 |

TABLE 28

<Organopolysiloxane (A): T/D = 0.3,
Organopolysiloxane (B): T/D = 0.15>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,055 | | | | | | |
| 900 | 4.45 | 5.57 | 9.15 | 12.02 | 17.99 | 20.29 |
| 1,025 | 9.00 | 31.62 | 39.10 | 51.64 | 72.75 | 77.00 |
| 3,029 | 9.71 | 32.59 | 40.13 | 52.76 | 73.90 | 77.95 |
| 30,065 | 13.17 | 43.62 | 51.04 | 64.29 | 82.40 | 85.72 |
| 59,949 | 16.01 | 46.97 | 54.91 | 66.55 | 83.88 | 87.99 |
| 61,016 | 16.32 | 47.69 | 55.71 | 67.36 | 84.28 | 88.56 |
| 2) When the Mw of the organopolysiloxane (A) is 37,029 | | | | | | |
| 900 | 4.38 | 5.49 | 9.01 | 11.84 | 17.72 | 19.98 |
| 1,025 | 8.86 | 31.14 | 38.51 | 50.85 | 71.65 | 75.83 |
| 3,029 | 9.56 | 32.10 | 39.52 | 51.96 | 72.78 | 76.77 |
| 30,065 | 12.97 | 42.96 | 50.26 | 63.32 | 81.15 | 84.42 |
| 59,949 | 15.77 | 46.26 | 54.08 | 65.54 | 82.61 | 86.65 |
| 61,016 | 16.08 | 49.96 | 54.87 | 66.34 | 83.00 | 87.22 |
| 3) When the Mw of the organopolysiloxane (A) is 100,019 | | | | | | |
| 900 | 3.64 | 4.56 | 7.49 | 9.83 | 14.72 | 16.60 |
| 1,025 | 7.36 | 25.87 | 31.99 | 42.25 | 59.52 | 63.00 |
| 3,029 | 7.94 | 26.66 | 32.83 | 43.17 | 60.47 | 63.78 |
| 30,065 | 10.78 | 35.69 | 41.76 | 52.60 | 67.42 | 70.14 |
| 59,949 | 13.10 | 38.43 | 44.93 | 54.45 | 68.63 | 71.99 |
| 61,016 | 13.36 | 39.02 | 45.58 | 55.11 | 68.96 | 72.46 |
| 4) When the Mw of the organopolysiloxane (A) is 139,975 | | | | | | |
| 900 | 3.27 | 4.10 | 6.73 | 8.83 | 13.22 | 14.91 |
| 1,025 | 6.61 | 23.24 | 28.74 | 37.94 | 53.46 | 56.58 |
| 3,029 | 7.13 | 23.95 | 29.49 | 38.77 | 54.31 | 57.28 |
| 30,065 | 9.68 | 32.06 | 37.50 | 47.25 | 60.55 | 62.99 |
| 59,949 | 11.76 | 34.52 | 40.35 | 48.90 | 61.64 | 64.66 |
| 61,016 | 12.00 | 35.04 | 40.94 | 49.50 | 61.93 | 65.08 |
| 5) When the Mw of the organopolysiloxane (A) is 141,069 | | | | | | |
| 900 | 0.94 | 1.18 | 1.94 | 2.55 | 3.82 | 4.30 |
| 1,025 | 1.91 | 6.71 | 8.29 | 10.95 | 15.43 | 16.33 |
| 3,029 | 2.06 | 6.91 | 8.51 | 11.19 | 15.68 | 16.54 |
| 30,065 | 2.79 | 9.25 | 10.83 | 13.64 | 17.48 | 18.18 |
| 59,949 | 3.40 | 9.96 | 11.65 | 14.12 | 17.79 | 18.66 |
| 61,016 | 3.46 | 10.12 | 11.82 | 14.29 | 17.88 | 18.79 |

TABLE 29

<Organopolysiloxane (A): T/D = 0.3,
Organopolysiloxane (B): T/D = 0.2>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,055 | | | | | | |
| 921 | 0.93 | 1.17 | 1.92 | 2.52 | 3.78 | 4.26 |
| 1,023 | 1.89 | 6.64 | 8.21 | 10.84 | 15.28 | 16.17 |
| 3,024 | 2.04 | 6.84 | 8.43 | 11.08 | 15.52 | 16.37 |
| 30,053 | 2.77 | 9.16 | 10.72 | 13.50 | 17.30 | 18.00 |
| 59,921 | 3.36 | 9.86 | 11.53 | 13.97 | 17.62 | 18.48 |
| 61,057 | 3.43 | 10.01 | 11.70 | 14.15 | 17.70 | 18.60 |
| 2) When the Mw of the organopolysiloxane (A) is 37,029 | | | | | | |
| 921 | 0.92 | 1.15 | 1.89 | 2.49 | 3.72 | 4.20 |
| 1,023 | 1.86 | 6.54 | 8.09 | 10.68 | 15.05 | 15.92 |
| 3,024 | 2.01 | 6.74 | 8.30 | 10.91 | 15.28 | 16.12 |
| 30,053 | 2.72 | 9.02 | 10.56 | 13.30 | 17.04 | 17.73 |
| 59,921 | 3.31 | 9.71 | 11.36 | 13.76 | 17.35 | 18.20 |
| 61,057 | 3.38 | 9.86 | 11.52 | 13.93 | 17.43 | 18.32 |
| 3) When the Mw of the organopolysiloxane (A) is 100,019 | | | | | | |
| 921 | 0.76 | 0.96 | 1.57 | 2.06 | 3.09 | 3.49 |
| 1,023 | 1.55 | 5.43 | 6.72 | 8.87 | 12.50 | 13.23 |
| 3,024 | 1.67 | 5.60 | 6.90 | 9.07 | 12.70 | 13.39 |
| 30,053 | 2.26 | 7.50 | 8.77 | 11.05 | 14.16 | 14.73 |
| 59,921 | 2.75 | 8.07 | 9.44 | 11.43 | 14.41 | 15.12 |
| 61,057 | 2.80 | 8.19 | 9.57 | 11.57 | 14.48 | 15.22 |
| 4) When the Mw of the organopolysiloxane (A) is 139,975 | | | | | | |
| 921 | 0.69 | 0.86 | 1.41 | 1.85 | 2.78 | 3.13 |
| 1,023 | 1.39 | 4.88 | 6.03 | 7.97 | 11.23 | 11.88 |
| 3,024 | 1.50 | 5.03 | 6.19 | 8.14 | 11.40 | 12.03 |
| 30,053 | 2.03 | 6.73 | 7.88 | 9.92 | 12.72 | 13.23 |
| 59,921 | 2.47 | 7.25 | 8.47 | 10.27 | 12.94 | 13.58 |
| 61,057 | 2.52 | 7.36 | 8.60 | 10.39 | 13.01 | 13.67 |
| 5) When the Mw of the organopolysiloxane (A) is 141,069 | | | | | | |
| 921 | 0.28 | 0.35 | 0.58 | 0.76 | 1.14 | 1.29 |
| 1,023 | 0.57 | 2.01 | 2.49 | 3.29 | 4.63 | 4.90 |
| 3,024 | 0.62 | 2.07 | 2.55 | 3.36 | 4.70 | 4.96 |
| 30,053 | 0.84 | 2.78 | 3.25 | 4.09 | 5.24 | 5.45 |
| 59,921 | 1.02 | 2.99 | 3.49 | 4.23 | 5.34 | 5.60 |
| 61,057 | 1.04 | 3.03 | 3.55 | 4.29 | 5.36 | 5.64 |

TABLE 30

<Organopolysiloxane (A): T/D = 0.4,
Organopolysiloxane (B): T/D = 0.1>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,055 | | | | | | |
| 907 | 4.73 | 5.93 | 9.74 | 12.79 | 19.15 | 21.59 |
| 1,025 | 9.57 | 33.65 | 41.62 | 54.96 | 77.43 | 81.95 |
| 3,026 | 10.33 | 34.69 | 42.71 | 56.16 | 78.66 | 82.97 |
| 30,112 | 14.02 | 46.43 | 54.32 | 68.43 | 87.70 | 91.24 |
| 59,983 | 17.04 | 50.00 | 58.45 | 70.83 | 89.28 | 93.65 |
| 61,041 | 17.37 | 50.76 | 59.30 | 71.69 | 89.71 | 94.26 |
| 2) When the Mw of the organopolysiloxane (A) is 37,001 | | | | | | |
| 907 | 4.66 | 5.84 | 9.59 | 12.60 | 18.86 | 21.26 |
| 1,025 | 9.43 | 33.14 | 40.99 | 54.13 | 76.26 | 80.71 |
| 3,026 | 10.18 | 34.16 | 42.07 | 55.31 | 77.47 | 81.71 |
| 30,112 | 13.81 | 45.73 | 53.50 | 67.40 | 86.37 | 89.86 |
| 59,983 | 16.78 | 49.24 | 57.56 | 69.76 | 87.93 | 92.23 |
| 61,041 | 17.11 | 49.99 | 58.40 | 70.61 | 88.35 | 92.83 |
| 3) When the Mw of the organopolysiloxane (A) is 100,023 | | | | | | |
| 907 | 3.87 | 4.85 | 7.97 | 10.47 | 15.67 | 17.67 |
| 1,025 | 7.83 | 27.54 | 34.05 | 44.97 | 63.35 | 67.05 |
| 3,026 | 8.45 | 28.38 | 34.95 | 45.95 | 64.36 | 67.88 |
| 30,112 | 11.47 | 37.99 | 44.44 | 55.99 | 71.76 | 74.65 |
| 59,983 | 13.94 | 40.91 | 47.82 | 57.95 | 73.05 | 76.62 |
| 61,041 | 14.21 | 41.53 | 48.52 | 58.66 | 73.40 | 77.12 |
| 4) When the Mw of the organopolysiloxane (A) is 139,987 | | | | | | |
| 907 | 3.48 | 4.36 | 7.16 | 9.40 | 14.07 | 15.87 |
| 1,025 | 7.04 | 24.73 | 30.58 | 40.39 | 56.90 | 60.22 |
| 3,026 | 7.59 | 25.49 | 31.39 | 41.27 | 57.80 | 60.97 |
| 30,112 | 10.30 | 34.12 | 39.92 | 50.29 | 64.45 | 67.05 |
| 59,983 | 12.52 | 36.74 | 42.95 | 52.05 | 65.61 | 68.82 |
| 61,041 | 12.77 | 37.30 | 43.57 | 52.68 | 65.92 | 69.26 |
| 5) When the Mw of the organopolysiloxane (A) is 141,067 | | | | | | |
| 907 | 0.96 | 1.20 | 1.97 | 2.59 | 3.88 | 4.37 |
| 1,025 | 1.94 | 6.81 | 8.43 | 11.13 | 15.68 | 16.59 |
| 3,026 | 2.09 | 7.02 | 8.65 | 11.37 | 15.93 | 16.80 |
| 30,112 | 2.84 | 9.40 | 11.00 | 13.86 | 17.76 | 18.47 |
| 59,983 | 3.45 | 10.12 | 11.83 | 14.34 | 18.08 | 18.96 |
| 61,041 | 3.52 | 10.28 | 12.01 | 14.52 | 18.16 | 19.09 |

Tables 30 to 32 show the results of the calculation of the area S of a tan δ in each of the cured products of organopolysiloxane compositions using the organopolysiloxanes (A) each having a ratio T/D of 0.4. To be specific, Table 30 shows the results of the calculation of the area S of a tan δ in each of the cured products of organopolysiloxane compositions containing the organopolysiloxanes (A) each having a ratio T/D of 0.4 and having various Mw's and the organopolysiloxanes (B) each having a ratio T/D of 0.1 and having various Mw's at various blending ratios. In addition, Tables 31 and 32 show the results of the calculation of the area S of a tan δ in each of the cured products of organopolysiloxane compositions in each of which the ratio T/D of the organopolysiloxane (B) was changed to 0.15 or 0.2.

Here, the cured products of the organopolysiloxane compositions obtained in the tests of Tables 30 to 32 were all organopolysiloxane copolymers having the same structure as those of the tests of Tables 15 to 17.

TABLE 31

<Organopolysiloxane (A): T/D = 0.4,
Organopolysiloxane (B): T/D = 0.15>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,055 | | | | | | |
| 900 | 4.30 | 5.39 | 8.86 | 11.63 | 17.41 | 19.63 |
| 1,025 | 8.70 | 30.60 | 37.84 | 49.96 | 70.39 | 74.50 |
| 3,029 | 9.39 | 31.53 | 38.83 | 51.05 | 71.51 | 75.43 |
| 30,065 | 12.75 | 42.21 | 49.38 | 62.21 | 79.73 | 82.94 |
| 59,949 | 15.49 | 45.45 | 53.13 | 64.39 | 81.16 | 85.14 |
| 61,016 | 15.79 | 46.14 | 53.91 | 65.18 | 81.55 | 58.69 |
| 2) When the Mw of the organopolysiloxane (A) is 37,001 | | | | | | |
| 900 | 4.24 | 5.31 | 8.72 | 11.45 | 17.14 | 19.33 |
| 1,025 | 8.57 | 30.13 | 37.26 | 49.20 | 69.32 | 73.37 |
| 3,029 | 9.25 | 31.06 | 38.24 | 50.28 | 70.42 | 74.28 |
| 30,065 | 12.55 | 41.57 | 48.63 | 61.27 | 78.52 | 81.69 |
| 59,949 | 15.26 | 44.76 | 52.33 | 63.41 | 79.93 | 83.85 |
| 61,016 | 15.55 | 45.44 | 53.09 | 64.19 | 80.31 | 84.39 |

TABLE 31-continued

<Organopolysiloxane (A): T/D = 0.4,
Organopolysiloxane (B): T/D = 0.15>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 3) When the Mw of the organopolysiloxane (A) is 100,023 | | | | | | |
| 900 | 3.52 | 4.41 | 7.25 | 9.51 | 14.24 | 16.06 |
| 1,025 | 7.12 | 25.03 | 30.96 | 40.88 | 57.59 | 60.96 |
| 3,029 | 7.69 | 25.80 | 31.77 | 41.77 | 58.51 | 61.71 |
| 30,065 | 10.43 | 34.54 | 40.40 | 50.90 | 65.23 | 67.86 |
| 59,949 | 12.67 | 37.19 | 43.47 | 52.68 | 66.41 | 69.66 |
| 61,016 | 12.92 | 37.75 | 44.11 | 53.33 | 66.72 | 70.11 |
| 4) When the Mw of the organopolysiloxane (A) is 139,987 | | | | | | |
| 900 | 3.16 | 3.96 | 6.51 | 8.55 | 12.79 | 14.42 |
| 1,025 | 6.40 | 22.48 | 27.80 | 36.71 | 51.73 | 54.75 |
| 3,029 | 6.90 | 23.17 | 28.53 | 37.52 | 52.55 | 55.43 |
| 30,065 | 9.37 | 31.02 | 36.29 | 45.72 | 58.59 | 60.95 |
| 59,949 | 11.38 | 33.40 | 39.05 | 47.32 | 59.64 | 62.56 |
| 61,016 | 11.61 | 33.91 | 39.61 | 47.89 | 59.93 | 62.97 |
| 5) When the Mw of the organopolysiloxane (A) is 141,067 | | | | | | |
| 900 | 0.91 | 1.14 | 1.88 | 2.47 | 3.69 | 4.16 |
| 1,025 | 1.85 | 6.49 | 8.03 | 10.60 | 14.93 | 15.80 |
| 3,029 | 1.99 | 6.69 | 8.24 | 10.83 | 15.17 | 16.00 |
| 30,065 | 2.70 | 8.95 | 10.48 | 13.20 | 16.91 | 17.59 |
| 59,949 | 3.29 | 9.64 | 11.27 | 13.66 | 17.22 | 18.06 |
| 61,016 | 3.35 | 9.79 | 11.43 | 13.83 | 17.30 | 18.18 |

TABLE 32

<Organopolysiloxane (A): T/D = 0.4,
Organopolysiloxane (B): T/D = 0.2>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,055 | | | | | | |
| 921 | 0.90 | 1.13 | 1.86 | 2.44 | 3.66 | 4.12 |
| 1,023 | 1.83 | 6.42 | 7.95 | 10.49 | 14.78 | 15.65 |
| 3,024 | 1.97 | 6.62 | 8.15 | 10.72 | 15.02 | 15.84 |
| 30,053 | 2.68 | 8.86 | 10.37 | 13.06 | 16.74 | 17.42 |
| 59,921 | 3.25 | 9.54 | 11.16 | 13.52 | 17.04 | 17.88 |
| 61,057 | 3.32 | 9.69 | 11.32 | 13.69 | 17.13 | 17.99 |
| 2) When the Mw of the organopolysiloxane (A) is 37,001 | | | | | | |
| 921 | 0.89 | 1.12 | 1.83 | 2.40 | 3.60 | 4.06 |
| 1,023 | 1.80 | 6.33 | 7.83 | 10.33 | 14.56 | 15.41 |
| 3,024 | 1.94 | 6.52 | 8.03 | 10.56 | 14.79 | 15.60 |
| 30,053 | 2.64 | 8.73 | 10.21 | 12.87 | 16.49 | 17.15 |
| 59,921 | 3.20 | 9.40 | 10.99 | 13.32 | 16.79 | 17.61 |
| 61,057 | 3.27 | 9.54 | 11.15 | 13.48 | 16.87 | 17.72 |
| 3) When the Mw of the organopolysiloxane (A) is 100,023 | | | | | | |
| 921 | 0.74 | 0.93 | 1.52 | 2.00 | 2.99 | 3.37 |
| 1,023 | 1.50 | 5.26 | 6.50 | 8.58 | 12.09 | 12.80 |
| 3,024 | 1.61 | 5.42 | 6.67 | 8.77 | 12.29 | 12.96 |
| 30,053 | 2.19 | 7.25 | 8.48 | 10.69 | 13.70 | 14.25 |
| 59,921 | 2.66 | 7.81 | 9.13 | 11.06 | 13.95 | 14.63 |
| 61,057 | 2.71 | 7.93 | 9.26 | 11.20 | 14.01 | 14.72 |
| 4) When the Mw of the organopolysiloxane (A) is 139,987 | | | | | | |
| 921 | 0.66 | 0.83 | 1.37 | 1.79 | 2.69 | 3.03 |
| 1,023 | 1.34 | 4.72 | 5.84 | 7.71 | 10.86 | 11.50 |
| 3,024 | 1.45 | 4.87 | 5.99 | 7.88 | 11.03 | 11.64 |
| 30,053 | 1.97 | 6.51 | 7.62 | 9.60 | 12.30 | 12.80 |
| 59,921 | 2.39 | 7.01 | 8.20 | 9.94 | 12.53 | 13.14 |
| 61,057 | 2.44 | 7.12 | 8.32 | 10.06 | 12.58 | 13.22 |

TABLE 32-continued

<Organopolysiloxane (A): T/D = 0.4,
Organopolysiloxane (B): T/D = 0.2>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 5) When the Mw of the organopolysiloxane (A) is 141,067 | | | | | | |
| 921 | 0.27 | 0.34 | 0.56 | 0.74 | 1.11 | 1.25 |
| 1,023 | 0.55 | 1.95 | 2.41 | 3.18 | 4.48 | 4.74 |
| 3,024 | 0.60 | 2.01 | 2.47 | 3.25 | 4.55 | 4.80 |
| 30,053 | 0.81 | 2.69 | 3.14 | 3.96 | 5.07 | 5.28 |
| 59,921 | 0.99 | 2.89 | 3.38 | 4.10 | 5.16 | 5.42 |
| 61,057 | 1.01 | 2.94 | 3.43 | 4.15 | 5.19 | 5.45 |

Tables 33 to 35 show the results of the calculation of the area S of a tan δ in each of the cured products of organopolysiloxane compositions using the organopolysiloxanes (A) each having a ratio T/D of 0.8. To be specific, Table 33 shows the results of the calculation of the area S of a tan δ in each of the cured products of organopolysiloxane compositions containing the organopolysiloxanes (A) each having a ratio T/D of 0.8 and having various Mw's and the organopolysiloxanes (B) each having a ratio T/D of 0.1 and having various Mw's at various blending ratios. In addition, Tables 34 and 35 show the results of the calculation of the area S of a twit) in each of the cured products of organopolysiloxane compositions in each of which the ratio T/D of the organopolysiloxane (B) was changed to 0.15 or 0.2.

Here, the cured products of the organopolysiloxane compositions obtained in the tests of Tables 33 to 35 were all organopolysiloxane copolymers having the same structure as those of the tests of Tables 18 to 20.

TABLE 33

<Organopolysiloxane (A): T/D = 0.8,
Organopolysiloxane (B): T/D = 0.1>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,007 | | | | | | |
| 907 | 4.53 | 5.68 | 9.32 | 12.24 | 18.32 | 20.66 |
| 1,025 | 9.16 | 32.21 | 39.83 | 52.59 | 74.10 | 78.42 |
| 3,026 | 9.89 | 33.19 | 40.87 | 53.74 | 75.27 | 79.40 |
| 30,112 | 13.42 | 44.43 | 51.98 | 65.49 | 83.93 | 87.31 |
| 59,983 | 16.31 | 47.84 | 55.93 | 67.78 | 85.44 | 89.62 |
| 61,041 | 16.63 | 48.57 | 56.74 | 68.61 | 85.84 | 90.20 |
| 2) When the Mw of the organopolysiloxane (A) is 37,049 | | | | | | |
| 907 | 4.46 | 5.59 | 9.18 | 12.05 | 18.05 | 20.35 |
| 1,025 | 9.02 | 31.72 | 39.22 | 51.79 | 72.97 | 77.23 |
| 3,026 | 9.74 | 32.69 | 40.25 | 52.92 | 74.13 | 78.19 |
| 30,112 | 13.21 | 43.76 | 51.19 | 64.49 | 82.65 | 85.99 |
| 59,983 | 16.06 | 47.12 | 55.08 | 66.75 | 84.14 | 88.26 |
| 61,041 | 16.37 | 47.83 | 55.88 | 67.57 | 84.54 | 88.83 |
| 3) When the Mw of the organopolysiloxane (A) is 100,007 | | | | | | |
| 907 | 3.71 | 4.65 | 7.63 | 10.01 | 14.99 | 16.91 |
| 1,025 | 7.50 | 26.35 | 32.59 | 43.03 | 60.62 | 64.16 |
| 3,026 | 8.09 | 27.16 | 33.44 | 43.97 | 61.59 | 64.96 |
| 30,112 | 10.98 | 36.35 | 42.53 | 53.58 | 68.67 | 71.43 |
| 59,983 | 13.34 | 39.14 | 45.76 | 55.46 | 69.90 | 73.32 |
| 61,041 | 13.60 | 39.74 | 46.43 | 56.13 | 70.23 | 73.80 |

TABLE 33-continued

<Organopolysiloxane (A): T/D = 0.8,
Organopolysiloxane (B): T/D = 0.1>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 4) When the Mw of the organopolysiloxane (A) is 139,953 | | | | | | |
| 907 | 3.33 | 4.17 | 6.85 | 8.99 | 13.47 | 15.18 |
| 1,025 | 6.73 | 23.67 | 29.27 | 38.65 | 54.45 | 57.63 |
| 3,026 | 7.27 | 24.39 | 30.04 | 39.49 | 55.31 | 58.34 |
| 30,112 | 9.86 | 32.65 | 38.20 | 48.12 | 61.67 | 64.16 |
| 59,983 | 11.98 | 35.16 | 41.10 | 49.81 | 62.78 | 65.86 |
| 61,041 | 12.22 | 35.69 | 41.70 | 50.42 | 63.08 | 66.28 |
| 5) When the Mw of the organopolysiloxane (A) is 141,055 | | | | | | |
| 907 | 0.92 | 1.15 | 1.89 | 2.48 | 3.71 | 4.18 |
| 1,025 | 1.86 | 6.52 | 8.06 | 10.65 | 15.00 | 15.88 |
| 3,026 | 2.00 | 6.72 | 8.28 | 10.88 | 15.24 | 16.08 |
| 30,112 | 2.72 | 9.00 | 10.53 | 13.26 | 16.99 | 17.68 |
| 59,983 | 3.30 | 9.69 | 11.32 | 13.72 | 17.30 | 18.15 |
| 61,041 | 3.37 | 9.83 | 11.49 | 13.89 | 17.38 | 18.26 |

TABLE 34

<Organopolysiloxane (A): T/D = 0.8,
Organopolysiloxane (B): T/D = 0.15>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,007 | | | | | | |
| 900 | 4.12 | 5.16 | 8.47 | 11.13 | 16.66 | 18.78 |
| 1,025 | 8.33 | 29.28 | 36.21 | 47.81 | 67.36 | 71.29 |
| 3,029 | 8.99 | 30.18 | 37.16 | 48.85 | 68.43 | 72.18 |
| 30,065 | 12.20 | 40.39 | 47.26 | 59.53 | 76.30 | 79.37 |
| 59,949 | 14.82 | 43.19 | 50.85 | 61.62 | 77.67 | 81.47 |
| 61,016 | 15.11 | 44.15 | 51.59 | 62.37 | 78.04 | 82.00 |
| 2) When the Mw of the organopolysiloxane (A) is 37,049 | | | | | | |
| 900 | 4.06 | 5.08 | 8.35 | 10.96 | 16.41 | 18.50 |
| 1,025 | 8.20 | 28.83 | 35.66 | 47.09 | 66.34 | 70.21 |
| 3,029 | 8.85 | 29.72 | 36.60 | 48.11 | 67.39 | 71.08 |
| 30,065 | 12.01 | 39.78 | 46.54 | 58.63 | 75.14 | 78.17 |
| 59,949 | 14.60 | 42.84 | 50.08 | 60.68 | 76.49 | 80.24 |
| 61,016 | 14.89 | 43.49 | 50.08 | 61.43 | 76.86 | 80.76 |
| 3) When the Mw of the organopolysiloxane (A) is 100,007 | | | | | | |
| 900 | 3.37 | 4.22 | 6.93 | 9.10 | 13.63 | 15.37 |
| 1,025 | 6.81 | 23.95 | 29.62 | 39.12 | 55.11 | 58.33 |
| 3,029 | 7.35 | 24.69 | 30.40 | 39.97 | 55.99 | 59.05 |
| 30,065 | 9.98 | 33.05 | 38.66 | 48.71 | 62.42 | 64.94 |
| 59,949 | 12.13 | 35.59 | 41.60 | 50.41 | 63.55 | 66.66 |
| 61,016 | 12.37 | 36.13 | 42.21 | 51.03 | 63.85 | 67.09 |
| 4) When the Mw of the organopolysiloxane (A) is 139,953 | | | | | | |
| 900 | 3.03 | 3.79 | 6.23 | 8.18 | 12.24 | 13.80 |
| 1,025 | 6.12 | 21.51 | 26.61 | 35.13 | 49.50 | 52.39 |
| 3,029 | 6.61 | 22.17 | 27.31 | 35.90 | 50.28 | 53.04 |
| 30,065 | 8.96 | 29.68 | 34.73 | 43.75 | 56.07 | 58.33 |
| 59,949 | 10.89 | 31.96 | 37.36 | 45.28 | 57.07 | 59.87 |
| 61,016 | 11.11 | 32.45 | 37.91 | 45.83 | 57.35 | 60.26 |
| 5) When the Mw of the organopolysiloxane (A) is 141,055 | | | | | | |
| 900 | 0.87 | 1.09 | 1.80 | 2.36 | 3.53 | 3.98 |
| 1,025 | 1.77 | 6.21 | 7.68 | 10.14 | 14.29 | 15.12 |
| 3,029 | 1.91 | 6.40 | 7.88 | 10.36 | 14.52 | 15.31 |
| 30,065 | 2.59 | 8.57 | 10.02 | 12.63 | 16.18 | 16.84 |
| 59,949 | 3.14 | 9.23 | 10.79 | 13.07 | 16.48 | 17.28 |
| 61,016 | 3.21 | 9.37 | 10.94 | 13.23 | 16.55 | 17.39 |

TABLE 35

<Organopolysiloxane (A): T/D = 0.8,
Organopolysiloxane (B): T/D = 0.2>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,007 | | | | | | |
| 921 | 0.86 | 1.08 | 1.78 | 2.34 | 3.50 | 3.94 |
| 1,023 | 1.75 | 6.15 | 7.60 | 10.04 | 14.15 | 14.97 |
| 3,024 | 1.89 | 6.34 | 7.80 | 10.26 | 14.37 | 15.16 |
| 30,053 | 2.56 | 8.48 | 9.92 | 12.50 | 16.02 | 16.67 |
| 59,921 | 3.11 | 9.13 | 10.68 | 12.94 | 16.31 | 17.11 |
| 61,057 | 3.17 | 9.27 | 10.83 | 13.10 | 16.39 | 17.22 |
| 2) When the Mw of the organopolysiloxane (A) is 37,049 | | | | | | |
| 921 | 0.85 | 1.07 | 1.75 | 2.30 | 3.45 | 3.88 |
| 1,023 | 1.72 | 6.06 | 7.49 | 9.89 | 13.93 | 14.74 |
| 3,024 | 1.86 | 6.24 | 7.68 | 10.10 | 14.15 | 14.93 |
| 30,053 | 2.52 | 8.35 | 9.77 | 12.31 | 15.78 | 16.42 |
| 59,921 | 3.07 | 9.00 | 10.52 | 12.74 | 16.06 | 16.85 |
| 61,057 | 3.13 | 9.13 | 10.67 | 12.90 | 16.14 | 16.96 |
| 3) When the Mw of the organopolysiloxane (A) is 100,007 | | | | | | |
| 921 | 0.71 | 0.89 | 1.46 | 1.91 | 2.86 | 3.23 |
| 1,023 | 1.43 | 5.03 | 6.22 | 8.21 | 11.57 | 12.25 |
| 3,024 | 1.54 | 5.18 | 6.38 | 8.39 | 11.76 | 12.40 |
| 30,053 | 2.10 | 6.94 | 8.12 | 10.23 | 13.11 | 13.64 |
| 59,921 | 2.55 | 7.47 | 8.74 | 10.59 | 13.34 | 14.00 |
| 61,057 | 2.60 | 7.59 | 8.86 | 10.72 | 13.41 | 14.09 |
| 4) When the Mw of the organopolysiloxane (A) is 139,953 | | | | | | |
| 921 | 0.64 | 0.80 | 1.31 | 1.72 | 2.57 | 2.90 |
| 1,023 | 1.29 | 4.52 | 5.59 | 7.38 | 10.39 | 11.00 |
| 3,024 | 1.39 | 4.66 | 5.73 | 7.54 | 10.56 | 11.14 |
| 30,053 | 1.88 | 6.23 | 7.29 | 9.19 | 11.77 | 12.25 |
| 59,921 | 2.29 | 6.71 | 7.85 | 9.51 | 11.99 | 12.57 |
| 61,057 | 2.33 | 6.81 | 7.96 | 9.62 | 12.04 | 12.65 |
| 5) When the Mw of the organopolysiloxane (A) is 141,055 | | | | | | |
| 921 | 0.26 | 0.33 | 0.54 | 0.71 | 1.06 | 1.20 |
| 1,023 | 0.53 | 1.86 | 2.30 | 3.04 | 4.29 | 4.54 |
| 3,024 | 0.57 | 1.92 | 2.36 | 3.11 | 4.35 | 4.59 |
| 30,053 | 0.78 | 2.57 | 3.01 | 3.79 | 4.86 | 5.05 |
| 59,921 | 0.94 | 2.77 | 3.24 | 3.92 | 4.94 | 5.18 |
| 61,057 | 0.96 | 2.81 | 3.28 | 3.97 | 4.97 | 5.22 |

Tables 36 to 38 show the results of the calculation of the area S of a tan δ in each of the cured products of organopolysiloxane compositions using the organopolysiloxanes (A) each having a ratio T/D of 0.9. To be specific, Table 36 shows the results of the calculation of the area S of a tan δ in each of the cured products of organopolysiloxane compositions containing the organopolysiloxanes (A) each having a ratio T/D of 0.9 and having various Mw's and the organopolysiloxanes (B) each having a ratio T/D of 0.1 and having various Mw's at various blending ratios. In addition, Tables 37 and 38 show the results of the calculation of the area S of a tan δ in each of the cured products of organopolysiloxane compositions in each of which the ratio T/D of the organopolysiloxane (B) was changed to 0.15 or 0.2.

Here, the cured products of the organopolysiloxane compositions obtained in the tests of Tables 36 to 38 were all organopolysiloxane copolymers having the same structure as those of the tests of Tables 21 to 23.

TABLE 36

<Organopolysiloxane (A): T/D = 0.9, Organopolysiloxane (B): T/D = 0.1>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,005 | | | | | | |
| 907 | 0.91 | 1.14 | 1.86 | 2.45 | 3.66 | 4.13 |
| 1,025 | 1.83 | 6.44 | 7.97 | 10.52 | 14.82 | 15.68 |
| 3,026 | 1.98 | 6.64 | 8.17 | 10.75 | 15.05 | 15.88 |
| 30,112 | 2.68 | 8.89 | 10.40 | 13.10 | 16.79 | 17.46 |
| 59,983 | 3.26 | 9.57 | 11.19 | 13.56 | 17.09 | 17.92 |
| 61,041 | 3.33 | 9.71 | 11.35 | 13.72 | 17.17 | 18.04 |
| 2) When the Mw of the organopolysiloxane (A) is 37,025 | | | | | | |
| 907 | 0.89 | 1.12 | 1.84 | 2.41 | 3.61 | 4.07 |
| 1,025 | 1.80 | 6.34 | 7.84 | 10.36 | 14.59 | 15.45 |
| 3,026 | 1.95 | 6.54 | 8.05 | 10.58 | 14.83 | 15.64 |
| 30,112 | 2.64 | 8.75 | 10.24 | 12.90 | 16.53 | 17.20 |
| 59,983 | 3.21 | 9.42 | 11.02 | 13.35 | 16.83 | 17.65 |
| 61,041 | 3.27 | 9.57 | 11.18 | 13.51 | 16.91 | 17.77 |
| 3) When the Mw of the organopolysiloxane (A) is 100,029 | | | | | | |
| 907 | 0.74 | 0.93 | 1.53 | 2.00 | 3.00 | 3.38 |
| 1,025 | 1.50 | 5.27 | 6.52 | 8.61 | 12.12 | 12.83 |
| 3,026 | 1.62 | 5.43 | 6.69 | 8.79 | 12.32 | 12.99 |
| 30,112 | 2.20 | 7.27 | 8.51 | 10.72 | 13.73 | 14.29 |
| 59,983 | 2.67 | 7.83 | 9.15 | 11.09 | 13.98 | 14.66 |
| 61,041 | 2.72 | 7.95 | 9.29 | 11.23 | 14.05 | 14.76 |
| 4) When the Mw of the organopolysiloxane (A) is 139,969 | | | | | | |
| 907 | 0.67 | 0.83 | 1.37 | 1.80 | 2.69 | 3.04 |
| 1,025 | 1.35 | 4.73 | 5.85 | 7.73 | 10.89 | 11.53 |
| 3,026 | 1.45 | 4.88 | 6.01 | 7.90 | 11.06 | 11.67 |
| 30,112 | 1.97 | 6.53 | 7.64 | 9.62 | 12.33 | 12.83 |
| 59,983 | 2.40 | 7.03 | 8.22 | 9.96 | 12.56 | 13.17 |
| 61,041 | 2.44 | 7.14 | 8.34 | 10.08 | 12.62 | 13.26 |
| 5) When the Mw of the organopolysiloxane (A) is 141,051 | | | | | | |
| 907 | 0.18 | 0.23 | 0.38 | 0.80 | 0.74 | 0.84 |
| 1,025 | 0.37 | 1.30 | 1.61 | 2.13 | 3.00 | 3.18 |
| 3,026 | 0.40 | 1.34 | 1.66 | 2.18 | 3.05 | 3.22 |
| 30,112 | 0.54 | 1.80 | 2.11 | 2.65 | 3.40 | 3.54 |
| 59,983 | 0.66 | 1.94 | 2.26 | 2.74 | 3.46 | 3.63 |
| 61,041 | 0.67 | 1.97 | 2.30 | 2.78 | 3.48 | 3.65 |

TABLE 37

<Organopolysiloxane (A): T/D = 0.9, Organopolysiloxane (B): T/D = 0.15>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,005 | | | | | | |
| 900 | 0.82 | 1.03 | 1.69 | 2.23 | 3.33 | 3.76 |
| 1,025 | 1.67 | 5.86 | 7.24 | 9.56 | 13.47 | 14.26 |
| 3,029 | 1.80 | 6.04 | 7.43 | 9.77 | 13.69 | 14.44 |
| 30,065 | 2.44 | 8.08 | 9.45 | 11.91 | 15.26 | 15.87 |
| 59,949 | 2.96 | 8.70 | 10.17 | 12.32 | 15.53 | 16.29 |
| 61,016 | 3.02 | 8.83 | 10.32 | 12.47 | 15.61 | 16.40 |
| 2) When the Mw of the organopolysiloxane (A) is 37,025 | | | | | | |
| 900 | 0.81 | 1.02 | 1.67 | 2.19 | 3.28 | 3.70 |
| 1,025 | 1.64 | 5.77 | 7.13 | 9.42 | 13.27 | 14.04 |
| 3,029 | 1.77 | 5.94 | 7.32 | 9.62 | 13.48 | 14.22 |
| 30,065 | 2.40 | 7.96 | 9.31 | 11.73 | 15.03 | 15.63 |
| 59,949 | 2.92 | 8.57 | 10.02 | 12.14 | 15.30 | 16.05 |
| 61,016 | 2.98 | 8.70 | 10.16 | 12.29 | 15.37 | 16.15 |
| 3) When the Mw of the organopolysiloxane (A) is 100,029 | | | | | | |
| 900 | 0.67 | 0.84 | 1.39 | 1.82 | 2.73 | 3.07 |
| 1,025 | 1.36 | 4.79 | 5.92 | 7.82 | 11.02 | 11.67 |
| 3,029 | 1.47 | 4.94 | 6.08 | 7.99 | 11.20 | 11.81 |
| 30,065 | 2.00 | 6.61 | 7.73 | 9.74 | 12.48 | 12.99 |
| 59,949 | 2.43 | 7.12 | 8.32 | 10.08 | 12.71 | 13.33 |
| 61,016 | 2.47 | 7.23 | 8.44 | 10.21 | 12.77 | 13.42 |
| 4) When the Mw of the organopolysiloxane (A) is 139,969 | | | | | | |
| 900 | 0.61 | 0.76 | 1.25 | 1.64 | 2.45 | 2.76 |
| 1,025 | 1.22 | 4.30 | 5.32 | 7.03 | 9.90 | 10.48 |
| 3,029 | 1.32 | 4.43 | 5.46 | 7.18 | 10.06 | 10.61 |
| 30,065 | 1.79 | 5.94 | 6.95 | 8.75 | 11.21 | 11.67 |
| 59,949 | 2.18 | 6.39 | 7.47 | 9.06 | 11.41 | 11.97 |
| 61,016 | 2.22 | 6.49 | 7.58 | 9.17 | 11.47 | 12.05 |
| 5) When the Mw of the organopolysiloxane (A) is 141,051 | | | | | | |
| 900 | 0.17 | 0.22 | 0.36 | 0.47 | 0.71 | 0.80 |
| 1,025 | 0.35 | 1.24 | 1.54 | 2.03 | 2.86 | 3.02 |
| 3,029 | 0.38 | 1.28 | 1.58 | 2.07 | 2.90 | 3.06 |
| 30,065 | 0.52 | 1.71 | 2.00 | 2.53 | 3.24 | 3.37 |
| 59,949 | 0.63 | 1.85 | 2.16 | 2.61 | 3.30 | 3.46 |
| 61,016 | 0.64 | 1.87 | 2.19 | 2.65 | 3.31 | 3.48 |

TABLE 38

<Organopolysiloxane (A): T/D = 0.9, Organopolysiloxane (B): T/D = 0.2>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the Mw of the organopolysiloxane (A) is 36,005 | | | | | | |
| 921 | 0.17 | 0.22 | 0.36 | 0.47 | 0.70 | 0.79 |
| 1,023 | 0.35 | 1.23 | 1.52 | 2.01 | 2.83 | 2.99 |
| 3,024 | 0.38 | 1.27 | 1.56 | 2.05 | 2.87 | 3.03 |
| 30,053 | 0.51 | 1.70 | 1.98 | 2.50 | 3.20 | 3.33 |
| 59,921 | 0.62 | 1.83 | 2.14 | 2.59 | 3.26 | 3.42 |
| 61,057 | 0.63 | 1.85 | 2.17 | 2.62 | 3.28 | 3.44 |
| 2) When the Mw of the organopolysiloxane (A) is 37,025 | | | | | | |
| 921 | 0.17 | 0.21 | 0.35 | 0.46 | 0.69 | 0.78 |
| 1,023 | 0.34 | 1.21 | 1.50 | 1.98 | 2.79 | 2.95 |
| 3,024 | 0.37 | 1.25 | 1.54 | 2.02 | 2.83 | 2.99 |
| 30,053 | 0.50 | 1.67 | 1.95 | 2.46 | 3.16 | 3.28 |
| 59,921 | 0.61 | 1.80 | 2.10 | 2.55 | 3.21 | 3.37 |
| 61,057 | 0.63 | 1.83 | 2.13 | 2.58 | 3.23 | 3.39 |
| 3) When the Mw of the organopolysiloxane (A) is 100,029 | | | | | | |
| 921 | 0.14 | 0.18 | 0.29 | 0.38 | 0.57 | 0.65 |
| 1,023 | 0.29 | 1.01 | 1.24 | 1.64 | 2.31 | 2.45 |
| 3,024 | 0.31 | 1.04 | 1.28 | 1.68 | 2.35 | 2.48 |
| 30,053 | 0.42 | 1.39 | 1.62 | 2.05 | 2.62 | 2.73 |
| 59,921 | 0.51 | 1.49 | 1.75 | 2.12 | 2.67 | 2.80 |
| 61,057 | 0.52 | 1.52 | 1.77 | 2.14 | 2.68 | 2.82 |
| 4) When the Mw of the organopolysiloxane (A) is 139,969 | | | | | | |
| 921 | 0.13 | 0.16 | 0.26 | 0.34 | 0.51 | 0.58 |
| 1,023 | 0.26 | 0.90 | 1.12 | 1.48 | 2.08 | 2.20 |
| 3,024 | 0.28 | 0.93 | 1.15 | 1.51 | 2.11 | 2.23 |
| 30,053 | 0.38 | 1.25 | 1.46 | 1.84 | 2.35 | 2.45 |
| 59,921 | 0.46 | 1.34 | 1.57 | 1.90 | 2.40 | 2.51 |
| 61,057 | 0.47 | 1.36 | 1.59 | 1.92 | 2.41 | 2.53 |

TABLE 38-continued

<Organopolysiloxane (A): T/D = 0.9, Organopolysiloxane (B): T/D = 0.2>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 5) When the Mw of the organopolysiloxane (A) is 141,051 | | | | | | |
| 921 | 0.05 | 0.07 | 0.11 | 0.14 | 0.21 | 0.24 |
| 1,023 | 0.11 | 0.37 | 0.46 | 0.61 | 0.86 | 0.91 |
| 3,024 | 0.11 | 0.38 | 0.47 | 0.62 | 0.87 | 0.92 |
| 30,053 | 0.16 | 0.51 | 0.60 | 0.76 | 0.97 | 1.03 |
| 59,921 | 0.19 | 0.55 | 0.65 | 0.78 | 0.99 | 1.04 |
| 61,057 | 0.19 | 0.56 | 0.66 | 0.79 | 0.99 | 1.04 |

As shown in the results of Tables 24 to 38, the area S of the tan δ of a cured product is found to be greatly affected by the ratio T/D and Mw of each of the organopolysiloxane (A) and the organopolysiloxane (B), and the molar ratio of the organopolysiloxane (B) to the organopolysiloxane (A). In particular, the area S of the tan δ of the cured product reduces as the ratio T/D of the organopolysiloxane (A) increases. When the ratio T/D of the organopolysiloxane (A) exceeded 0.8, the area S of the tan δ was particularly small. Therefore, a reduction in dielectric breakdown voltage when the ratio T/D of the organopolysiloxane (A) exceeded 0.8 possibly resulted from the fact that the stickiness of the cured product was so low that the cured product could not resist the occurring distortion and hence peeled or cracked even when its adhesive strength was high.

In addition, even when the ratio T/D of the organopolysiloxane (A) is 0.3 or more and 0.8 or less, either adhesive strength or the area S of the tan δ reduces unless the other conditions are satisfied. As a result, a balance between the adhesiveness and stickiness of the cured product cannot be kept within a proper range. Accordingly, the peeling or cracking of the cured product may occur.

Example 2

Synthesis of Organopolysiloxane

Organopolysiloxanes having various ratios T/D and various Mw's were each synthesized in the same manner as in Example 1 except that vinyltrimethoxysilane (LS-815, Shin-Etsu Chemical Co., Ltd.) was used instead of phenyltrimethoxysilane; and conditions, i.e., the blending ratio between vinyltrimethoxysilane and dimethoxydimethylsilane, and the stirring time were changed.

(Preparation of Organopolysiloxane Composition)

Various organopolysiloxane compositions were prepared by selecting two organopolysiloxanes from the organopolysiloxanes synthesized from the above and mixing the two organopolysiloxanes at various ratios.

(Production of Semiconductor Apparatus)

Semiconductor apparatuses were each produced in the same manner as in Example 1 by using any one of the above-mentioned organopolysiloxane compositions.

(Dielectric Breakdown Test)

Each of the semiconductor apparatuses obtained in the above was subjected to a heat cycle test at −50° C. to 200° C. 100 times, and was then subjected to a dielectric breakdown test in the same manner as in Example 1. Tables 39 to 42 below show the results.

Table 39 shows the results of the measurement of the dielectric breakdown voltages of semiconductor apparatuses each produced by using the organopolysiloxane (A) having a ratio T/D of 0.2 and an Mw of 37,008.

TABLE 39

<Organopolysiloxane (A): T/D = 0.2, Mw = 37,008>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the ratio T/D of the organopolysiloxane (B) is 0.1 | | | | | | |
| 906 | 0.20 | 0.20 | 0.20 | 0.20 | 0.20 | 0.20 |
| 1,070 | 0.20 | 0.20 | 0.20 | 0.20 | 0.20 | 0.20 |
| 2,966 | 0.20 | 0.20 | 0.20 | 0.20 | 0.20 | 0.20 |
| 30,056 | 0.20 | 0.20 | 0.20 | 0.20 | 0.20 | 0.20 |
| 59,947 | 0.20 | 0.20 | 0.20 | 0.20 | 0.20 | 0.20 |
| 61,104 | 0.20 | 0.20 | 0.20 | 0.20 | 0.20 | 0.20 |
| 2) When the ratio T/D of the organopolysiloxane (B) is 0.15 | | | | | | |
| 925 | 0.20 | 0.20 | 0.20 | 0.20 | 0.20 | 0.20 |
| 1,038 | 0.20 | 0.20 | 0.20 | 0.20 | 0.20 | 0.20 |
| 3,059 | 0.20 | 0.20 | 0.20 | 0.20 | 0.20 | 0.20 |
| 30,137 | 0.20 | 0.20 | 0.20 | 0.20 | 0.20 | 0.20 |
| 59,980 | 0.20 | 0.20 | 0.20 | 0.20 | 0.20 | 0.20 |
| 61,055 | 0.20 | 0.20 | 0.20 | 0.20 | 0.20 | 0.20 |
| 3) When the ratio T/D of the organopolysiloxane (B) is 0.2 | | | | | | |
| 908 | 0.20 | 0.20 | 0.20 | 0.20 | 0.20 | 0.20 |
| 999 | 0.20 | 0.20 | 0.20 | 0.20 | 0.20 | 0.20 |
| 2,994 | 0.20 | 0.20 | 0.20 | 0.20 | 0.20 | 0.20 |
| 30,023 | 0.20 | 0.20 | 0.20 | 0.20 | 0.20 | 0.20 |
| 59,954 | 0.20 | 0.20 | 0.20 | 0.20 | 0.20 | 0.20 |
| 61,042 | 0.20 | 0.20 | 0.20 | 0.20 | 0.20 | 0.20 |

*) Dielectric breakdown voltages are represented in kV units.

Table 40 shows the results of the measurement of the dielectric breakdown voltages of semiconductor apparatuses each produced by using the organopolysiloxane (A) having a ratio T/D of 0.3 and an Mw of 37,011.

TABLE 40

<Organopolysiloxane (A): T/D = 0.3, Mw = 37,011>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the ratio T/D of the organopolysiloxane (B) is 0.1 | | | | | | |
| 906 | 0.20 | 0.20 | 0.20 | 0.20 | 0.20 | 0.20 |
| 1,070 | 0.20 | 7.00 | 7.00 | 7.00 | 7.00 | 0.20 |
| 2,966 | 0.20 | 7.00 | 7.00 | 7.00 | 7.00 | 0.20 |
| 30,056 | 0.20 | 7.00 | 7.00 | 7.00 | 7.00 | 0.20 |
| 59,947 | 0.20 | 7.00 | 7.00 | 7.00 | 7.00 | 0.20 |
| 61,104 | 0.20 | 0.20 | 0.20 | 0.20 | 0.20 | 0.20 |
| 2) When the ratio T/D of the organopolysiloxane (B) is 0.15 | | | | | | |
| 925 | 0.20 | 0.20 | 0.20 | 0.20 | 0.20 | 0.20 |
| 1,038 | 0.20 | 7.00 | 7.00 | 7.00 | 7.00 | 0.20 |
| 3,059 | 0.20 | 7.00 | 7.00 | 7.00 | 7.00 | 0.20 |
| 30,137 | 0.20 | 7.00 | 7.00 | 7.00 | 7.00 | 0.20 |
| 59,980 | 0.20 | 7.00 | 7.00 | 7.00 | 7.00 | 0.20 |
| 61,055 | 0.20 | 0.20 | 0.20 | 0.20 | 0.20 | 0.20 |
| 3) When the ratio T/D of the organopolysiloxane (B) is 0.2 | | | | | | |
| 908 | 0.20 | 0.20 | 0.20 | 0.20 | 0.20 | 0.20 |
| 999 | 0.20 | 0.20 | 0.20 | 0.20 | 0.20 | 0.20 |
| 2,994 | 0.20 | 0.20 | 0.20 | 0.20 | 0.20 | 0.20 |
| 30,023 | 0.20 | 0.20 | 0.20 | 0.20 | 0.20 | 0.20 |
| 59,954 | 0.20 | 0.20 | 0.20 | 0.20 | 0.20 | 0.20 |
| 61,042 | 0.20 | 0.20 | 0.20 | 0.20 | 0.20 | 0.20 |

*) Dielectric breakdown voltages are represented in kV units.

Table 41 shows the results of the measurement of the dielectric breakdown voltages of semiconductor apparatuses each produced by using the organopolysiloxane (A) having a ratio T/D of 0.8 and an Mw of 139,925.

TABLE 41

<Organopolysiloxane (A): T/D = 0.8, Mw = 139,925>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the ratio T/D of the organopolysiloxane (B) is 0.1 | | | | | | |
| 906 | 0.20 | 0.20 | 0.20 | 0.20 | 0.20 | 0.20 |
| 1,070 | 0.20 | 7.00 | 7.00 | 7.00 | 7.00 | 0.20 |
| 2,966 | 0.20 | 7.00 | 7.00 | 7.00 | 7.00 | 0.20 |
| 30,056 | 0.20 | 7.00 | 7.00 | 7.00 | 7.00 | 0.20 |
| 59,947 | 0.20 | 7.00 | 7.00 | 7.00 | 7.00 | 0.20 |
| 61,104 | 0.20 | 0.20 | 0.20 | 0.20 | 0.20 | 0.20 |
| 2) When the ratio T/D of the organopolysiloxane (B) is 0.15 | | | | | | |
| 925 | 0.20 | 0.20 | 0.20 | 0.20 | 0.20 | 0.20 |
| 1,038 | 0.20 | 7.00 | 7.00 | 7.00 | 7.00 | 0.20 |
| 3,059 | 0.20 | 7.00 | 7.00 | 7.00 | 7.00 | 0.20 |
| 30,137 | 0.20 | 7.00 | 7.00 | 7.00 | 7.00 | 0.20 |
| 59,980 | 0.20 | 7.00 | 7.00 | 7.00 | 7.00 | 0.20 |
| 61,055 | 0.20 | 0.20 | 0.20 | 0.20 | 0.20 | 0.20 |
| 3) When the ratio T/D of the organopolysiloxane (B) is 0.2 | | | | | | |
| 908 | 0.20 | 0.20 | 0.20 | 0.20 | 0.20 | 0.20 |
| 999 | 0.20 | 0.20 | 0.20 | 0.20 | 0.20 | 0.20 |
| 2,994 | 0.20 | 0.20 | 0.20 | 0.20 | 0.20 | 0.20 |
| 30,023 | 0.20 | 0.20 | 0.20 | 0.20 | 0.20 | 0.20 |
| 59,954 | 0.20 | 0.20 | 0.20 | 0.20 | 0.20 | 0.20 |
| 61,042 | 0.20 | 0.20 | 0.20 | 0.20 | 0.20 | 0.20 |

*) Dielectric breakdown voltages are represented in kV units.

Table 42 shows the results of the measurement of the dielectric breakdown voltages of semiconductor apparatuses each produced by using the organopolysiloxane (A) having a ratio T/D of 0.9 and an Mw of 139,928.

TABLE 42

<Organopolysiloxane (A): T/D = 0.9, Mw = 139,928>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the ratio T/D of the organopolysiloxane (B) is 0.1 | | | | | | |
| 906 | 0.20 | 0.20 | 0.20 | 0.20 | 0.20 | 0.20 |
| 1,070 | 0.20 | 0.20 | 0.20 | 0.20 | 0.20 | 0.20 |
| 2,966 | 0.20 | 0.20 | 0.20 | 0.20 | 0.20 | 0.20 |
| 30,056 | 0.20 | 0.20 | 0.20 | 0.20 | 0.20 | 0.20 |
| 59,947 | 0.20 | 0.20 | 0.20 | 0.20 | 0.20 | 0.20 |
| 61,104 | 0.20 | 0.20 | 0.20 | 0.20 | 0.20 | 0.20 |
| 2) When the ratio T/D of the organopolysiloxane (B) is 0.15 | | | | | | |
| 925 | 0.20 | 0.20 | 0.20 | 0.20 | 0.20 | 0.20 |
| 1,038 | 0.20 | 0.20 | 0.20 | 0.20 | 0.20 | 0.20 |
| 3,059 | 0.20 | 0.20 | 0.20 | 0.20 | 0.20 | 0.20 |
| 30,137 | 0.20 | 0.20 | 0.20 | 0.20 | 0.20 | 0.20 |
| 59,980 | 0.20 | 0.20 | 0.20 | 0.20 | 0.20 | 0.20 |
| 61,055 | 0.20 | 0.20 | 0.20 | 0.20 | 0.20 | 0.20 |
| 3) When the ratio T/D of the organopolysiloxane (B) is 0.2 | | | | | | |
| 908 | 0.20 | 0.20 | 0.20 | 0.20 | 0.20 | 0.20 |
| 999 | 0.20 | 0.20 | 0.20 | 0.20 | 0.20 | 0.20 |
| 2,994 | 0.20 | 0.20 | 0.20 | 0.20 | 0.20 | 0.20 |
| 30,023 | 0.20 | 0.20 | 0.20 | 0.20 | 0.20 | 0.20 |
| 59,954 | 0.20 | 0.20 | 0.20 | 0.20 | 0.20 | 0.20 |
| 61,042 | 0.20 | 0.20 | 0.20 | 0.20 | 0.20 | 0.20 |

*) Dielectric breakdown voltages are represented in kV units.

As shown in the results of Tables 39 to 42, the dielectric breakdown voltage was high only when the following conditions were satisfied. That is, the ratio T/D of the organopolysiloxane (A) was 0.3 to 0.8, the Mw of the organopolysiloxane (A) was 37,000 to 140,000, the ratio T/D of the organopolysiloxane (B) was 0.15 or less, the Mw of the organopolysiloxane (B) was 1,000 to 60,000, and the molar ratio of the organopolysiloxane (B) to the organopolysiloxane (A) was 1.5 to 6.5.

In addition, the cured products of the organopolysiloxane compositions obtained in the tests of Tables 39 to 42 were each an organopolysiloxane copolymer having a structure represented by the above formula (I). In the formula (I), $R^1$, $R^2$, $R^{12}$, and $R^{13}$ each represented a methyl group, $R^3$, $R^5$ to $R^9$, $R^{11}$, and $R^{14}$ each represented hydrogen, $R^4$ and $R^{10}$ each represented a vinyl group, and $R^{15}$ represented an ethylene group. In addition, when the organopolysiloxane (A) having a ratio T/D of 0.2 and an Mw of 37,008 was used, a represented 405, b represented 63, and c represented 18. When the organopolysiloxane (A) having a ratio T/D of 0.3 and an Mw of 37,011 was used, a represented 370, b represented 86, and c represented 25. When the organopolysiloxane (A) having a ratio T/D of 0.8 and an Mw of 139,925 was used, a represented 965, b represented 752, and c represented 20. When the organopolysiloxane (A) having a ratio T/D of 0.9 and an Mw of 139,928 was used, a represented 910, b represented 789, and c represented 30.

In addition, when the organopolysiloxane (B) having a ratio T/D of 0.1 and an Mw of 906 was used, x represented 0.6, y represented 0.5, and z represented 11. When the organopolysiloxane (B) having a ratio T/D of 0.1 and an Mw of 1,070 was used, x represented 0.8, y represented 0.5, and z represented 13. When the organopolysiloxane (B) having a ratio T/D of 0.1 and an Mw of 2,966 was used, x represented 1.8, y represented 1.8, and z represented 36. When the organopolysiloxane (B) having a ratio T/D of 0.1 and an Mw of 30,056 was used, x represented 18.5, y represented 18, and z represented 365. When the organopolysiloxane (B) having a ratio T/D of 0.1 and an Mw of 59,947 was used, x represented 36.8, y represented 36, and z represented 728. When the organopolysiloxane (B) having a ratio T/D of 0.1 and an Mw of 61,104 was used, x represented 37.2, y represented 37, and z represented 742.

In addition, when the organopolysiloxane (B) having a ratio T/D of 0.15 and an Mw of 925 was used, x represented 0.9, y represented 0.7, and z represented 10.7. When the organopolysiloxane (B) having a ratio T/D of 0.15 and an Mw of 1,038 was used, x represented 1, y represented 0.8, and z represented 12. When the organopolysiloxane (B) having a ratio T/D of 0.15 and an Mw of 3,059 was used, x represented 3, y represented 2.3, and z represented 35.4. When the organopolysiloxane (B) having a ratio T/D of 0.15 and an Mw of 30,137 was used, x represented 27.2, y represented 25, and z represented 348. When the organopolysiloxane (B) having a ratio T/D of 0.15 and an Mw of 59,980 was used, x represented 50, y represented 53.9, and z represented 693. When the organopolysiloxane (B) having a ratio T/D of 0.15 and an Mw of 61,055 was used, x represented 55.9, y represented 50, and z represented 706.

In addition, when the organopolysiloxane (B) having a ratio T/D of 0.2 and an Mw of 908 was used, x represented 1, y represented 1, and z represented 10. When the organopolysiloxane (B) having a ratio T/D of 0.2 and an Mw of 999 was used, x represented 1.1, y represented 1.1, and z represented 11. When the organopolysiloxane (B) having a ratio T/D of 0.2 and an Mw of 2,994 was used, x represented 3.3, y represented 3.3, and z represented 33. When the organopolysiloxane (B) having a ratio T/D of 0.2 and an Mw of 30,023 was used, x represented 33.1, y represented 33.1, and z represented 331. When the organopolysiloxane (B) having a ratio T/D of 0.2 and an Mw of 59,954 was used, x represented 66.1, y represented 66.1, and z represented 661. When the organopolysiloxane (B) having a ratio T/D of 0.2 and an Mw of 61,042 was used, x represented 67.3, y represented 67.3, and z represented 673.

It should be noted that m represents a molar ratio (B/A) of the organopolysiloxane (B) to the organopolysiloxane (A).

(Adhesive Strength Test)

Each of the organopolysiloxane compositions synthesized in the above was subjected to an adhesive strength test in accordance with JIS-K6850 in the same manner as in Example 1. Tables 43 to 46 below show the results.

Table 43 shows the results of the measurement of adhesive strengths in the cured products of organopolysiloxane compositions each using the organopolysiloxane (A) having a ratio T/D of 0.2 and an Mw of 37,008.

TABLE 43

<Organopolysiloxane (A): T/D = 0.2, Mw = 37,008>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the ratio T/D of the organopolysiloxane (B) is 0.1 | | | | | | |
| 906 | 0.10 | — | — | — | — | — |
| 1,070 | 0.10 | — | — | — | — | — |
| 2,966 | 0.10 | — | — | — | — | — |
| 30,056 | — | — | — | — | — | — |
| 59,947 | — | — | — | — | — | — |
| 61,104 | — | — | — | — | — | — |
| 2) When the ratio T/D of the organopolysiloxane (B) is 0.15 | | | | | | |
| 925 | 0.11 | — | — | — | — | — |
| 1,038 | 0.11 | — | — | — | — | — |
| 3,059 | 0.10 | — | — | — | — | — |
| 30,137 | — | — | — | — | — | — |
| 59,980 | — | — | — | — | — | — |
| 61,055 | — | — | — | — | — | — |
| 3) When the ratio T/D of the organopolysiloxane (B) is 0.2 | | | | | | |
| 908 | 0.12 | 0.09 | — | — | — | — |
| 999 | 0.12 | — | — | — | — | — |
| 2,994 | 0.11 | — | — | — | — | — |
| 30,023 | — | — | — | — | — | — |
| 59,954 | — | — | — | — | — | — |
| 61,042 | — | — | — | — | — | — |

*) Adhesive strengths are represented in MPa units.
*) — means that an adhesive strength is equal to or lower than a measurement limit.

Table 44 shows the results of the measurement of adhesive strengths in the cured products of organopolysiloxane compositions each using the organopolysiloxane (A) having a ratio T/D of 0.3 and an Mw of 37,011.

TABLE 44

<Organopolysiloxane (A): T/D = 0.3, Mw = 37,011>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the ratio T/D of the organopolysiloxane (B) is 0.1 | | | | | | |
| 906 | 2.98 | 2.32 | 1.92 | 1.46 | 0.72 | — |
| 1,070 | 2.92 | 2.26 | 1.84 | 1.39 | 0.64 | — |
| 2,966 | 2.76 | 2.11 | 1.64 | 1.17 | 0.52 | — |
| 30,056 | 2.30 | 1.76 | 1.35 | 0.74 | 0.29 | — |
| 59,947 | 1.80 | 1.18 | 0.86 | 0.60 | 0.19 | — |
| 61,104 | 0.11 | 0.06 | 0.03 | 0.01 | — | — |
| 2) When the ratio T/D of the organopolysiloxane (B) is 0.15 | | | | | | |
| 925 | 3.13 | 2.44 | 2.03 | 1.54 | 0.75 | — |
| 1,038 | 3.08 | 2.38 | 1.94 | 1.46 | 0.68 | — |
| 3,059 | 2.94 | 2.22 | 1.73 | 1.23 | 0.54 | — |
| 30,137 | 2.42 | 1.86 | 1.42 | 0.78 | 0.30 | — |
| 59,980 | 1.89 | 1.24 | 0.91 | 0.64 | 0.20 | — |
| 61,055 | 0.12 | — | — | — | — | — |
| 3) When the ratio T/D of the organopolysiloxane (B) is 0.2 | | | | | | |
| 908 | 3.41 | 2.66 | 2.20 | 1.67 | 0.82 | — |
| 999 | 3.35 | 2.59 | 2.11 | 1.59 | 0.74 | — |
| 2,994 | 3.18 | 2.42 | 1.88 | 1.34 | 0.59 | — |
| 30,023 | 2.64 | 2.02 | 1.54 | 0.85 | 0.33 | — |
| 59,954 | 2.06 | 1.35 | 0.99 | 0.69 | 0.22 | — |
| 61,042 | 0.13 | — | — | — | — | — |

*) Adhesive strengths are represented in MPa units.
*) — means that an adhesive strength is equal to or lower than a measurement limit.

Table 45 shows the results of the measurement of adhesive strengths in the cured products of organopolysiloxane compositions each using the organopolysiloxane (A) having a ratio T/D of 0.8 and an Mw of 139,925.

TABLE 45

<Organopolysiloxane (A): T/D = 0.8, Mw = 139,925>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the ratio T/D of the organopolysiloxane (B) is 0.1 | | | | | | |
| 906 | 4.27 | 3.36 | 2.81 | 2.17 | 1.14 | — |
| 1,070 | 4.20 | 3.28 | 2.70 | 2.07 | 1.03 | — |
| 2,966 | 4.01 | 3.07 | 2.42 | 1.75 | 0.86 | — |
| 30,056 | 2.95 | 2.15 | 1.69 | 1.22 | 0.67 | — |
| 59,947 | 2.49 | 1.69 | 1.21 | 0.81 | 0.37 | — |
| 61,104 | 0.30 | 0.22 | 0.18 | 0.15 | — | — |
| 2) When the ratio T/D of the organopolysiloxane (B) is 0.15 | | | | | | |
| 925 | 4.50 | 3.54 | 2.95 | 2.28 | 1.20 | — |
| 1,038 | 4.42 | 3.45 | 2.84 | 2.18 | 1.09 | — |
| 3,059 | 4.21 | 3.23 | 2.55 | 1.86 | 0.90 | — |
| 30,137 | 3.11 | 2.26 | 1.77 | 1.28 | 0.71 | — |
| 59,980 | 2.62 | 1.77 | 1.28 | 0.85 | 0.40 | — |
| 61,055 | 0.31 | 0.24 | 0.19 | 0.16 | — | — |
| 3) When the ratio T/D of the organopolysiloxane (B) is 0.2 | | | | | | |
| 908 | 4.90 | 3.85 | 3.22 | 2.49 | 1.30 | 0.10 |
| 999 | 4.81 | 3.74 | 3.09 | 2.37 | 1.17 | — |
| 2,994 | 4.60 | 3.52 | 2.77 | 2.03 | 0.98 | — |
| 30,023 | 3.38 | 2.46 | 1.93 | 1.40 | 0.77 | — |
| 59,954 | 2.85 | 1.94 | 1.40 | 0.93 | 0.43 | — |
| 61,042 | 0.34 | 0.26 | 0.20 | 0.17 | — | — |

*) Adhesive strengths are represented in MPa units.
*) — means that an adhesive strength is equal to or lower than a measurement limit.

Table 46 shows the results of the measurement of adhesive strengths in the cured products of organopolysiloxane compositions each using the organopolysiloxane (A) having a ratio T/D of 0.9 and an Mw of 139,928.

TABLE 46

<Organopolysiloxane (A): T/D = 0.9, Mw = 139,928>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the ratio T/D of the organopolysiloxane (B) is 0.1 | | | | | | |
| 906 | 6.41 | 5.04 | 4.22 | 3.25 | 1.70 | 0.13 |
| 1,070 | 6.30 | 4.92 | 4.05 | 3.10 | 1.55 | 0.13 |
| 2,966 | 6.02 | 4.61 | 3.63 | 2.65 | 1.29 | 0.10 |
| 30,056 | 4.43 | 3.23 | 2.53 | 1.82 | 1.01 | — |
| 59,947 | 3.73 | 2.54 | 1.83 | 1.22 | 0.56 | — |
| 61,104 | 0.45 | 0.34 | 0.27 | 0.22 | — | — |
| 2) When the ratio T/D of the organopolysiloxane (B) is 0.15 | | | | | | |
| 925 | 6.75 | 5.31 | 4.44 | 3.43 | 1.79 | 0.14 |
| 1,038 | 6.62 | 5.17 | 4.25 | 3.26 | 1.63 | 0.12 |
| 3,059 | 6.34 | 4.84 | 3.82 | 2.79 | 1.35 | 0.10 |
| 30,137 | 4.66 | 3.40 | 2.66 | 1.93 | 1.05 | — |
| 59,980 | 3.92 | 2.67 | 1.93 | 1.28 | 0.59 | — |
| 61,055 | 0.47 | 0.35 | 0.28 | 0.24 | — | — |
| 3) When the ratio T/D of the organopolysiloxane (B) is 0.2 | | | | | | |
| 908 | 7.35 | 5.78 | 4.83 | 3.73 | 1.95 | 0.15 |
| 999 | 7.22 | 5.63 | 4.64 | 3.54 | 1.78 | 0.14 |
| 2,994 | 6.89 | 5.28 | 4.16 | 3.04 | 1.47 | 0.11 |
| 30,023 | 5.07 | 3.70 | 2.90 | 2.10 | 1.15 | — |
| 59,954 | 4.27 | 2.91 | 2.10 | 1.39 | 0.64 | — |
| 61,042 | 0.51 | 0.38 | 0.30 | 0.26 | — | — |

*) Adhesive strengths are represented in MPa units.
*) — means that an adhesive strength is equal to or lower than a measurement limit.

As shown in the results of Tables 43 to 46, when the ratio T/D of the organopolysiloxane (A) was less than 0.3, the adhesive strength of a cured product was as low as less than 0.2 MPa. Therefore, the fact that the dielectric breakdown voltage was low when the ratio T/D of the organopolysiloxane (A) was less than 0.3 possibly resulted from the fact that the adhesive strength of the cured product was so low that the cured product peeled.

It should be noted that the cured products of the organopolysiloxane compositions obtained in the tests of Tables 43 to 46 were all organopolysiloxane copolymers having the same structure as those of the tests of Tables 39 to 42.

(Stickiness Test)

The area S of the tan δ of each of the cured products of the organopolysiloxane compositions synthesized in the above was determined in the same manner as in Example 1. Tables 47 to 50 show the results.

Table 47 shows the area S of a tan δ in each of the cured products of organopolysiloxane compositions each using the organopolysiloxane (A) having a ratio T/D of 0.2 and an Mw of 37,008.

TABLE 47

<Organopolysiloxane (A): T/D = 0.2, Mw = 37,008>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the ratio T/D of the organopolysiloxane (B) is 0.1 | | | | | | |
| 906 | 4.96 | 6.21 | 10.20 | 13.39 | 20.05 | 22.61 |
| 1,070 | 10.02 | 35.24 | 43.58 | 57.54 | 81.07 | 85.81 |
| 2,966 | 10.82 | 36.32 | 44.72 | 58.80 | 82.36 | 86.87 |
| 30,056 | 14.68 | 48.62 | 56.88 | 71.65 | 91.83 | 95.53 |
| 59,947 | 17.84 | 52.35 | 61.20 | 74.16 | 93.48 | 98.06 |
| 61,104 | 18.19 | 53.14 | 62.09 | 75.07 | 93.93 | 98.69 |

TABLE 47-continued

<Organopolysiloxane (A): T/D = 0.2, Mw = 37,008>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 2) When the ratio T/D of the organopolysiloxane (B) is 0.15 | | | | | | |
| 925 | 4.50 | 5.64 | 9.25 | 12.15 | 18.19 | 20.51 |
| 1,038 | 9.10 | 31.97 | 39.54 | 52.21 | 73.56 | 77.85 |
| 3,059 | 9.82 | 32.95 | 40.58 | 53.35 | 74.72 | 78.82 |
| 30,137 | 13.32 | 44.11 | 51.60 | 65.01 | 83.32 | 86.67 |
| 59,980 | 16.19 | 47.50 | 55.52 | 67.29 | 84.81 | 88.97 |
| 61,055 | 16.50 | 48.22 | 56.33 | 68.11 | 85.22 | 89.54 |
| 3) When the ratio T/D of the organopolysiloxane (B) is 0.2 | | | | | | |
| 908 | 0.95 | 1.18 | 1.95 | 2.55 | 3.82 | 4.31 |
| 999 | 1.91 | 6.72 | 8.31 | 10.97 | 15.46 | 16.37 |
| 2,994 | 2.06 | 6.93 | 8.53 | 11.21 | 15.71 | 16.57 |
| 30,023 | 2.80 | 9.27 | 10.85 | 13.67 | 17.51 | 18.22 |
| 59,954 | 3.37 | 9.98 | 11.67 | 14.14 | 17.81 | 18.70 |
| 61,042 | 3.47 | 10.14 | 11.84 | 14.32 | 17.91 | 18.82 |

Table 48 shows the area S of a tan δ in each of the cured products of organopolysiloxane compositions each using the organopolysiloxane (A) having a ratio T/D of 0.3 and an Mw of 37,011.

TABLE 48

<Organopolysiloxane (A): T/D = 0.3, Mw = 37,011>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the ratio T/D of the organopolysiloxane (B) is 0.1 | | | | | | |
| 906 | 4.87 | 6.10 | 10.01 | 13.15 | 16.69 | 22.20 |
| 1,070 | 9.84 | 34.60 | 42.79 | 56.50 | 79.60 | 84.25 |
| 2,966 | 10.62 | 35.66 | 43.91 | 57.73 | 80.86 | 85.29 |
| 30,056 | 14.41 | 47.73 | 55.84 | 70.35 | 90.16 | 93.79 |
| 59,947 | 17.52 | 51.40 | 60.09 | 72.81 | 91.78 | 96.27 |
| 61,104 | 17.86 | 52.18 | 60.96 | 73.70 | 92.22 | 96.90 |
| 2) When the ratio T/D of the organopolysiloxane (B) is 0.15 | | | | | | |
| 925 | 4.42 | 5.53 | 9.09 | 11.93 | 17.86 | 20.14 |
| 1,038 | 8.93 | 31.39 | 38.82 | 51.26 | 72.22 | 76.44 |
| 3,059 | 9.64 | 32.35 | 39.84 | 52.38 | 73.77 | 77.38 |
| 30,137 | 13.08 | 43.31 | 50.67 | 63.83 | 81.80 | 85.03 |
| 59,980 | 15.89 | 46.63 | 54.48 | 66.06 | 83.27 | 87.35 |
| 61,055 | 16.20 | 47.34 | 55.31 | 66.87 | 83.67 | 87.91 |
| 3) When the ratio T/D of the organopolysiloxane (B) is 0.2 | | | | | | |
| 908 | 0.93 | 1.16 | 1.87 | 2.51 | 3.75 | 4.23 |
| 999 | 1.88 | 6.60 | 8.16 | 10.78 | 15.18 | 16.05 |
| 2,994 | 2.02 | 6.80 | 8.37 | 11.01 | 15.42 | 16.27 |
| 30,023 | 2.75 | 9.10 | 10.65 | 13.42 | 17.20 | 17.89 |
| 59,954 | 3.34 | 9.80 | 11.46 | 13.86 | 17.47 | 18.36 |
| 61,042 | 3.41 | 9.95 | 11.63 | 14.06 | 17.59 | 18.48 |

Table 49 shows the area S of a tan δ in each of the cured products of organopolysiloxane compositions each using the organopolysiloxane (A) having a ratio T/D of 0.8 and an Mw of 139,925.

TABLE 49

<Organopolysiloxane (A): T/D = 0.8, Mw = 139,925>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the ratio T/D of the organopolysiloxane (B) is 0.1 | | | | | | |
| 906 | 3.36 | 4.21 | 6.92 | 9.08 | 13.60 | 15.34 |
| 1,070 | 6.80 | 23.88 | 29.56 | 39.03 | 54.99 | 58.20 |
| 2,966 | 7.34 | 24.64 | 30.34 | 39.88 | 55.87 | 58.93 |
| 30,056 | 9.96 | 32.98 | 38.58 | 48.60 | 62.19 | 64.80 |
| 59,947 | 12.10 | 35.51 | 41.51 | 50.31 | 63.41 | 66.51 |
| 61,104 | 12.36 | 36.05 | 42.12 | 50.92 | 63.71 | 66.94 |
| 2) When the ratio T/D of the organopolysiloxane (B) is 0.15 | | | | | | |
| 925 | 3.05 | 3.82 | 6.28 | 8.24 | 12.34 | 13.91 |
| 1,038 | 6.17 | 21.69 | 26.80 | 35.41 | 49.90 | 52.81 |
| 3,059 | 6.66 | 22.35 | 27.52 | 36.19 | 50.69 | 53.46 |
| 30,137 | 9.03 | 29.92 | 35.00 | 44.10 | 56.51 | 58.79 |
| 59,980 | 10.98 | 32.22 | 37.66 | 45.64 | 57.53 | 60.35 |
| 61,055 | 11.19 | 32.71 | 38.21 | 46.20 | 57.81 | 60.74 |
| 3) When the ratio T/D of the organopolysiloxane (B) is 0.2 | | | | | | |
| 908 | 0.64 | 0.80 | 1.32 | 1.73 | 2.59 | 2.92 |
| 999 | 1.29 | 4.56 | 5.64 | 7.44 | 10.49 | 11.10 |
| 2,994 | 1.39 | 4.70 | 5.79 | 7.61 | 10.64 | 11.24 |
| 30,023 | 1.90 | 6.29 | 7.36 | 9.27 | 11.88 | 12.36 |
| 59,954 | 2.31 | 6.77 | 7.92 | 9.59 | 12.09 | 12.69 |
| 61,042 | 2.35 | 6.88 | 8.03 | 9.70 | 12.15 | 12.77 |

Table 50 shows the area S of a tan δ in each of the cured products of organopolysiloxane compositions each using the organopolysiloxane (A) having a ratio T/D of 0.9 and an Mw of 139,928.

TABLE 50

<Organopolysiloxane (A): T/D = 0.9, Mw = 139,928>

| Mw of organopolysiloxane (B) | Molar ratio (B/A) of organopolysiloxane (B) to organopolysiloxane (A) | | | | | |
|---|---|---|---|---|---|---|
| | 1.0 | 1.5 | 2.7 | 4.0 | 6.5 | 7.0 |
| 1) When the ratio T/D of the organopolysiloxane (B) is 0.1 | | | | | | |
| 906 | 0.67 | 0.84 | 1.38 | 1.82 | 2.72 | 3.07 |
| 1,070 | 1.36 | 4.78 | 5.91 | 7.81 | 11.00 | 11.64 |
| 2,966 | 1.47 | 4.81 | 6.07 | 7.98 | 11.17 | 11.74 |
| 30,056 | 1.99 | 6.60 | 7.72 | 9.72 | 12.46 | 12.96 |
| 59,947 | 2.42 | 7.10 | 8.30 | 10.06 | 12.68 | 13.30 |
| 61,104 | 2.47 | 7.21 | 8.42 | 10.18 | 12.74 | 13.39 |
| 2) When the ratio T/D of the organopolysiloxane (B) is 0.15 | | | | | | |
| 925 | 0.61 | 0.76 | 1.26 | 1.65 | 2.47 | 2.78 |
| 1,038 | 1.23 | 4.34 | 5.36 | 7.08 | 9.98 | 10.56 |
| 3,059 | 1.33 | 4.47 | 5.50 | 7.24 | 10.14 | 10.69 |
| 30,137 | 1.81 | 5.98 | 7.00 | 8.82 | 11.30 | 11.76 |
| 59,980 | 2.20 | 6.44 | 7.53 | 9.13 | 11.51 | 12.07 |
| 61,055 | 2.24 | 6.54 | 7.64 | 9.24 | 11.56 | 12.15 |
| 3) When the ratio T/D of the organopolysiloxane (B) is 0.2 | | | | | | |
| 908 | 0.13 | 0.16 | 0.25 | 0.35 | 0.52 | 0.58 |
| 999 | 0.26 | 0.91 | 1.13 | 1.49 | 2.10 | 2.22 |
| 2,994 | 0.28 | 0.94 | 1.16 | 1.52 | 2.13 | 2.25 |
| 30,023 | 0.38 | 1.26 | 1.47 | 1.86 | 2.38 | 2.47 |
| 59,954 | 0.46 | 1.35 | 1.58 | 1.92 | 2.42 | 2.54 |
| 61,042 | 0.47 | 1.36 | 1.61 | 1.94 | 2.43 | 2.55 |

As shown in the results of Tables 47 to 50, when the ratio T/D of the organopolysiloxane (A) exceeded 0.8, the area S of a tan δ in a cured product was small. Therefore, the fact that the dielectric breakdown voltage was low when the ratio T/D of the organopolysiloxane (A) exceeded 0.8 possibly resulted from the fact that the stickiness of the cured product was so low that the cured product could not resist occurring distortion and hence peeled or cracked even when its adhesive strength was high.

In addition, even when the ratio T/D of the organopolysiloxane (A) is 0.3 to 0.8, either the adhesive strength or the area S of the tan δ reduces unless the other conditions are satisfied. As a result, a balance between the adhesiveness and stickiness of the cured product cannot be kept within a proper range. Accordingly, the peeling or cracking of the cured product may occur.

It should be noted that the cured products of the organopolysiloxane compositions obtained in the tests of Tables 47 to 50 were all organopolysiloxane copolymers having the same structure as those of the tests of Tables 39 to 42.

As can be seen from the above-mentioned results, the present invention can provide an organopolysiloxane composition having low viscosity that provides a cured product which has excellent heat resistance and does not peel or crack even under high temperatures. In addition, the present invention can provide a semiconductor apparatus which is highly reliable and maintains good insulating properties even under high temperatures.

What is claimed is:

1. An organopolysiloxane composition, comprising:
   (A) an organopolysiloxane having difunctional siloxane units (D units) and trifunctional siloxane units (T units), and a weight-average molecular weight of 37,000 to 140,000 in which the molar ratio (T/D) of the T units to the D units is 0.3 to 0.8; and
   (B) an organopolysiloxane having the difunctional siloxane units (D units) and the trifunctional siloxane units (T units), and a weight-average molecular weight of 1,000 to 60,000 in which the molar ratio (T/D) of the T units to the D units is 0.15 or less, wherein
   the organopolysiloxane composition has a molar ratio (B/A) of the organopolysiloxane (B) to the organopolysiloxane (A) of 1.5 to 6.5.

2. A semiconductor apparatus comprising a semiconductor device sealed with a cured product of an organopolysiloxane composition, wherein the cured product of the organopolysiloxane composition contains an organopolysiloxane copolymer which is formed of:
   (A) an organopolysiloxane having difunctional siloxane units (D units) and trifunctional siloxane units (T units), and a weight-average molecular weight of 37,000 to 140,000 in which the molar ratio (T/D) of the T units to the D units is 0.3 to 0.8; and
   (B) an organopolysiloxane having the difunctional siloxane units (D units) and the trifunctional siloxane units (T units), and a weight-average molecular weight of 1,000 to 60,000 in which the molar ratio (T/D) of the T units to the D units is 0.15 or less; and
   has a molar ratio (B/A) of the organopolysiloxane (B) to the organopolysiloxane (A) of 1.5 to 6.5.

3. A semiconductor apparatus according to claim 2, wherein the organopolysiloxane copolymer is represented by the following general formula (I):

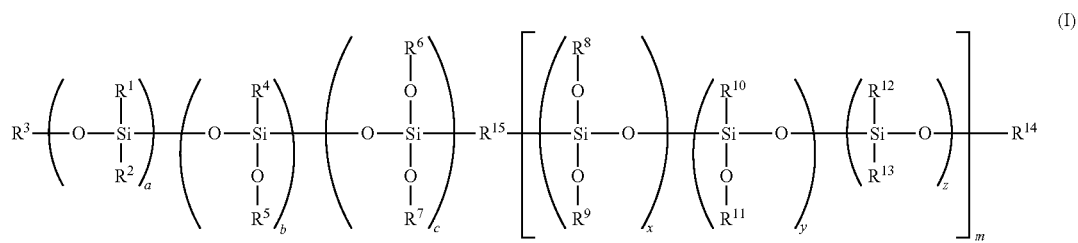

wherein $R^1$ to $R^{14}$ may be identical to or different from one another, and each independently represent hydrogen, an alkyl group, or a phenyl group; $R^{15}$ represents an alkylene group; a represents 100 to 1500; b+c represents 40 to 900; z represents 5 to 800; x+y represents 1 to 140; m represents 1.5 to 6.5; and respective siloxane units surrounded by a, b, c, x, y, and z are arranged in one of a block fashion and a random fashion.

4. A semiconductor apparatus according to claim 2, wherein the cured product of the organopolysiloxane composition has an adhesive strength of 0.19 MPa or more, and an area of a tan δ at −50° C. to 200° C. of 21 or more.

5. A semiconductor apparatus according to claim 2, wherein the semiconductor device is formed of a wide-band gap semiconductor.

6. A semiconductor apparatus according to claim 5, wherein the wide-band gap semiconductor comprises silicon carbide, a gallium nitride-based material, or diamond.

* * * * *